(12) United States Patent
Tsuji

(10) Patent No.: US 6,584,022 B2
(45) Date of Patent: Jun. 24, 2003

(54) SEMICONDUCTOR MEMORY DEVICE WITH SIMULTANEOUS DATA LINE SELECTION AND SHIFT REDUNDANCY SELECTION

(75) Inventor: Takaharu Tsuji, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 77 days.

(21) Appl. No.: 09/971,697

(22) Filed: Oct. 9, 2001

(65) Prior Publication Data

US 2002/0021600 A1 Feb. 21, 2002

Related U.S. Application Data

(63) Continuation-in-part of application No. 09/768,352, filed on Jan. 25, 2001, now abandoned.

(30) Foreign Application Priority Data

Aug. 21, 2000 (JP) ........................................ 2000-249463
Jun. 29, 2001 (JP) ........................................ 2001-198513

(51) Int. Cl.$^7$ ............................................... G11C 29/00
(52) U.S. Cl. ............. 365/200; 365/230.03; 365/230.06; 365/201
(58) Field of Search .................................. 365/200, 201, 365/225.7, 230.03, 230.06, 189.02

(56) References Cited

U.S. PATENT DOCUMENTS

| 6,021,075 A | | 2/2000 | Ueno | 365/200 |
| 6,104,648 A | * | 8/2000 | Ooishi | 365/200 |
| 6,115,301 A | * | 9/2000 | Namekawa | 365/200 |

FOREIGN PATENT DOCUMENTS

| JP | 8-8344 | * | 1/1996 | G11C/29/00 |
| JP | 8-77793 | * | 3/1996 | G11C/29/00 |
| JP | 11-250688 | | 9/1999 | G11C/29/00 |

* cited by examiner

Primary Examiner—Andrew Q. Tran
(74) Attorney, Agent, or Firm—McDermott, Will & Emery

(57) ABSTRACT

The semiconductor memory device includes a memory cell array, a normal data line pair, a redundant data line pair and a data line switch circuit. The data line switch circuit includes an IO shift decoder decoding the column address and the position information related to a defective data line, and an IO select unit shifting the connection between a data input/output pin and a data line while replacing the defective data line according to the decoded result. High speed data transfer is realized by carrying out simultaneously data line selection and redundancy selection according to the column address.

18 Claims, 56 Drawing Sheets

FIG. 4

| FS<i> | CAD | /CAD | SEL | | | |
|---|---|---|---|---|---|---|
| | | | <0> | <1> | <2> | <3> |
| 0 | 0 | 1 | 1 | 0 | 0 | 0 |
| 0 | 1 | 0 | 0 | 1 | 0 | 0 |
| 1 | 0 | 1 | 0 | 0 | 1 | 0 |
| 1 | 1 | 0 | 0 | 0 | 0 | 1 |

FIG. 5

| DEFECTIVE DATA LINE | FS | | | | | | | | | | |
|---|---|---|---|---|---|---|---|---|---|---|---|
| | <0> | <1> | <2> | <3> | <4> | <5> | <6> | <7> | | <n-1> | <n> |
| 0 | 1 | 1 | 1 | 1 | 1 | 1 | 1 | 1 | ... | 1 | 1 |
| 1 | 1 | 1 | 1 | 1 | 1 | 1 | 1 | 1 | ... | 1 | 1 |
| 2 | 0 | 1 | 1 | 1 | 1 | 1 | 1 | 1 | ... | 1 | 1 |
| 3 | 0 | 1 | 1 | 1 | 1 | 1 | 1 | 1 | ... | 1 | 1 |
| 4 | 0 | 0 | 1 | 1 | 1 | 1 | 1 | 1 | ... | 1 | 1 |
| 5 | 0 | 0 | 1 | 1 | 1 | 1 | 1 | 1 | ... | 1 | 1 |
| 6 | 0 | 0 | 0 | 1 | 1 | 1 | 1 | 1 | ... | 1 | 1 |
| 7 | 0 | 0 | 0 | 1 | 1 | 1 | 1 | 1 | ... | 1 | 1 |
| ∫ | | | | | ∫ | | | | | | |
| 2n | 0 | 0 | 0 | 0 | 0 | 0 | 0 | 0 | ... | 0 | 1 |
| 2n+1 | 0 | 0 | 0 | 0 | 0 | 0 | 0 | 0 | ... | 0 | 1 |

FIG. 6

EXAMPLES OF DECODE SIGNALS WHEN DEFECTIVE DATA LINE IS LIO<3>

| 1/4 SELECT CIRCUIT | FS | | SEL<0> | SEL<1> | SEL<2> | SEL<3> |
|---|---|---|---|---|---|---|
| X0,Y0 | 0 | CAD<0>=0 | 1 | 0 | 0 | 0 |
|  |  | CAD<0>=1 | 0 | 0 | 0 | 0 |
| X1,Y1 | 1 | CAD<0>=0 | 0 | 1 | 0 | 0 |
|  |  | CAD<0>=1 | 0 | 0 | 0 | 1 |
| X2,Y2 | 1 | CAD<0>=0 | 0 | 0 | 1 | 0 |
|  |  | CAD<0>=1 | 0 | 0 | 0 | 1 |
| X3,Y3 | 1 | CAD<0>=0 | 0 | 0 | 1 | 0 |
|  |  | CAD<0>=1 | 0 | 0 | 0 | 1 |
| X4,Y4 | 1 | CAD<0>=0 | 0 | 0 | 1 | 0 |
|  |  | CAD<0>=1 | 0 | 0 | 1 | 0 |
| --- |  |  |  |  |  |  |
| Xn,Yn | 1 | CAD<0>=0 | 0 | 0 | 1 | 0 |
|  |  | CAD<0>=1 | 0 | 0 | 0 | 1 |

FIG. 10

| RS<i> | CAD | /CAD | SEL | | | |
|---|---|---|---|---|---|---|
| | | | <0> | <1> | <2> | <3> |
| 0 | 0 | 1 | 1 | 0 | 0 | 0 |
| 0 | 1 | 0 | 0 | 1 | 0 | 0 |
| 1 | 0 | 1 | 0 | 0 | 1 | 0 |
| 1 | 1 | 0 | 0 | 0 | 0 | 1 |

FIG. 11

| DEFECTIVE DATA LINE | RS | | | | | | | | | | |
|---|---|---|---|---|---|---|---|---|---|---|---|
| | <0> | <1> | <2> | <3> | <4> | <5> | <6> | <7> | | <n-1> | <n> |
| 0 | 1 | 0 | 0 | 0 | 0 | 0 | 0 | 0 | ... | 0 | 0 |
| 1 | 1 | 0 | 0 | 0 | 0 | 0 | 0 | 0 | ... | 0 | 0 |
| 2 | 0 | 1 | 0 | 0 | 0 | 0 | 0 | 0 | ... | 0 | 0 |
| 3 | 0 | 1 | 0 | 0 | 0 | 0 | 0 | 0 | ... | 0 | 0 |
| 4 | 0 | 0 | 1 | 0 | 0 | 0 | 0 | 0 | ... | 0 | 0 |
| 5 | 0 | 0 | 1 | 0 | 0 | 0 | 0 | 0 | ... | 0 | 0 |
| 6 | 0 | 0 | 0 | 1 | 0 | 0 | 0 | 0 | ... | 0 | 0 |
| 7 | 0 | 0 | 0 | 1 | 0 | 0 | 0 | 0 | ... | 0 | 0 |
| ∫ | | | | | ∫ | | | | | | |
| 2n | 0 | 0 | 0 | 0 | 0 | 0 | 0 | 0 | ... | 0 | 1 |
| 2n+1 | 0 | 0 | 0 | 0 | 0 | 0 | 0 | 0 | ... | 0 | 1 |

FIG. 12

EXAMPLES OF DECODE SIGNALS WHEN DEFECTIVE DATA LINE IS LIO<3>

| 1/4 SELECT CIRCUIT | RS | | SEL<0> | SEL<1> | SEL<2> | SEL<3> |
|---|---|---|---|---|---|---|
| X0,Y0 | 0 | CAD<0>=0 | 1 | 0 | 0 | 0 |
|  |  | CAD<0>=1 | 0 | 1 | 0 | 0 |
| X1,Y1 | 1 | CAD<0>=0 | 0 | 0 | 1 | 0 |
|  |  | CAD<0>=1 | 0 | 0 | 0 | 1 |
| X2,Y2 | 0 | CAD<0>=0 | 1 | 0 | 0 | 0 |
|  |  | CAD<0>=1 | 0 | 1 | 0 | 0 |
| X3,Y3 | 0 | CAD<0>=0 | 1 | 0 | 0 | 0 |
|  |  | CAD<0>=1 | 0 | 1 | 0 | 0 |
| X4,Y4 | 0 | CAD<0>=0 | 1 | 0 | 0 | 0 |
|  |  | CAD<0>=1 | 0 | 1 | 0 | 0 |
| --- |  |  |  |  |  |  |
| Xn,Yn | 0 | CAD<0>=0 | 1 | 0 | 0 | 0 |
|  |  | CAD<0>=1 | 0 | 1 | 0 | 0 |

FIG. 14

| BUS WIDTH | CAD <0> | CAD <1> | YSEL <0> | YSEL <1> | YSEL <2> | YSEL <3> |
|---|---|---|---|---|---|---|
| n | — | — | 1 | 1 | 1 | 1 |
| n/2 | 0 | — | 1 | 0 | 1 | 0 |
|  | 1 | — | 0 | 1 | 0 | 1 |
| n/4 | 0 | 0 | 1 | 0 | 0 | 0 |
|  | 0 | 1 | 0 | 1 | 0 | 0 |
|  | 1 | 0 | 0 | 0 | 1 | 0 |
|  | 1 | 1 | 0 | 0 | 0 | 1 |

FIG. 15

| DQ | BUS WIDTH n | n/2 | n/4 |
|---|---|---|---|
| 0 | USED | USED | USED |
| 1 | USED | — | — |
| 2 | USED | USED | — |
| 3 | USED | — | — |
| 4 | USED | USED | USED |
| 5 | USED | — | — |
| 6 | USED | USED | — |
| 7 | USED | — | — |
| 8 | USED | USED | USED |
| 9 | USED | — | — |
| 10 | USED | USED | — |
| 11 | USED | — | — |
|  |  |  |  |
|  |  |  |  |
| n-3 | USED | USED | USED |
| n-2 | USED | — | — |
| n-1 | USED | USED | — |
| n | USED | — | — |

| BUS WIDTH | SWITCH 1201 | SWITCH 1202 | SWITCH 1203 |
|---|---|---|---|
| n | B | B | B |
| n/2 | A | B | A |
| n/4 | A | A | A |

FIG. 20

| DEFECTIVE IO BLOCK | USEL <0> | <1> | <2> | <3> | <4> | <5> | <6> | <7> | Block 0 CONTROL SIGNAL STATE NRM | RED | SFT | Block 1 CONTROL SIGNAL STATE NRM | RED | SFT | Block 6 CONTROL SIGNAL STATE NRM | RED | SFT | Block 7 CONTROL SIGNAL STATE NRM | RED | SFT |
|---|---|---|---|---|---|---|---|---|---|---|---|---|---|---|---|---|---|---|---|---|
| Block 0 | 1 | 1 | 1 | 1 | 1 | 1 | 1 | 1 | 0 | 1 | 0 | 0 | 0 | 1 | 0 | 0 | 1 | 0 | 0 | 1 |
| Block 1 | 0 | 1 | 1 | 1 | 1 | 1 | 1 | 1 | 1 | 0 | 0 | 0 | 1 | 0 | 0 | 0 | 1 | 0 | 0 | 1 |
| Block 2 | 0 | 0 | 1 | 1 | 1 | 1 | 1 | 1 | 1 | 0 | 0 | 1 | 0 | 0 | 0 | 0 | 1 | 0 | 0 | 1 |
| Block 3 | 0 | 0 | 0 | 1 | 1 | 1 | 1 | 1 | 1 | 0 | 0 | 1 | 0 | 0 | 0 | 0 | 1 | 0 | 0 | 1 |
| Block 4 | 0 | 0 | 0 | 0 | 1 | 1 | 1 | 1 | 1 | 0 | 0 | 1 | 0 | 0 | 0 | 0 | 1 | 0 | 0 | 1 |
| Block 5 | 0 | 0 | 0 | 0 | 0 | 1 | 1 | 1 | 1 | 0 | 0 | 1 | 0 | 0 | 0 | 1 | 0 | 0 | 0 | 1 |
| Block 6 | 0 | 0 | 0 | 0 | 0 | 0 | 1 | 1 | 1 | 0 | 0 | 1 | 0 | 0 | 1 | 0 | 0 | 0 | 1 | 0 |
| Block 7 | 0 | 0 | 0 | 0 | 0 | 0 | 0 | 1 | 1 | 0 | 0 | 1 | 0 | 0 | 1 | 0 | 0 | 1 | 0 | 0 |

FIG. 22

| n/4 BIT MODE | | INPUT SIGNAL | | | | | | | | OUTPUT SIGNAL | | | | | | | |
|---|---|---|---|---|---|---|---|---|---|---|---|---|---|---|---|---|---|
| CONTROL STATE | | YSEL | | | | LSEL | | | | DQSEL | | | | SDQSEL | | | |
| | | <0> | <1> | <2> | <3> | <0> | <1> | <2> | <3> | <0> | <1> | <2> | <3> | <0> | <1> | <2> | <3> |
| NRM=1 | | 1 | 0 | 0 | 0 | X | X | X | X | 1 | 0 | 0 | 0 | 0 | 0 | 0 | 0 |
| | | 0 | 1 | 0 | 0 | X | X | X | X | 0 | 1 | 0 | 0 | 0 | 0 | 0 | 0 |
| | | 0 | 0 | 1 | 0 | X | X | X | X | 0 | 0 | 1 | 0 | 0 | 0 | 0 | 0 |
| | | 0 | 0 | 0 | 1 | X | X | X | X | 0 | 0 | 0 | 1 | 0 | 0 | 0 | 0 |
| SFT=1 | | 1 | 0 | 0 | 0 | X | X | X | X | 0 | 1 | 0 | 0 | 0 | 0 | 0 | 0 |
| | | 0 | 1 | 0 | 0 | X | X | X | X | 0 | 0 | 1 | 0 | 0 | 0 | 0 | 0 |
| | | 0 | 0 | 1 | 0 | X | X | X | X | 0 | 0 | 0 | 1 | 0 | 0 | 0 | 0 |
| | | 0 | 0 | 0 | 1 | X | X | X | X | 0 | 0 | 0 | 0 | 1 | 0 | 0 | 0 |
| RED=1 | | 1 | 0 | 0 | 0 | 1 | 0 | 0 | 0 | 0 | 0 | 0 | 0 | 1 | 0 | 0 | 0 |
| | | 1 | 0 | 0 | 0 | 0 | 1 | 0 | 0 | 1 | 0 | 0 | 0 | 0 | 1 | 0 | 0 |
| | | 0 | 1 | 0 | 0 | 0 | 0 | 1 | 0 | 0 | 1 | 0 | 0 | 0 | 0 | 1 | 0 |
| | | 0 | 1 | 0 | 0 | 0 | 0 | 0 | 1 | 0 | 0 | 1 | 0 | 0 | 0 | 0 | 1 |
| | | 0 | 0 | 1 | 0 | 0 | 0 | 0 | 1 | 0 | 0 | 1 | 0 | 0 | 0 | 0 | 1 |
| | | 0 | 0 | 0 | 1 | 0 | 0 | 0 | 1 | 0 | 0 | 0 | 1 | 0 | 0 | 0 | 0 |
| | | 0 | 0 | 0 | 1 | 0 | 0 | 0 | 1 | 0 | 0 | 0 | 1 | 0 | 0 | 0 | 1 |

FIG. 23

| n/2 BIT MODE | CONTROL STATE | INPUT SIGNAL | | | | | | | | OUTPUT SIGNAL | | | | | | | |
|---|---|---|---|---|---|---|---|---|---|---|---|---|---|---|---|---|---|
| | | YSEL | | | | LSEL | | | | DQSEL | | | | SDQSEL | | | |
| | | <0> | <1> | <2> | <3> | <0> | <1> | <2> | <3> | <0> | <1> | <2> | <3> | <0> | <1> | <2> | <3> |
| | NRM=1 | 1 | 0 | 1 | 0 | X | X | X | X | 1 | 0 | 1 | 0 | 0 | 0 | 0 | 0 |
| | | 0 | 1 | 0 | 1 | X | X | X | X | 0 | 1 | 0 | 1 | 0 | 0 | 0 | 0 |
| | | 1 | 0 | 1 | 0 | X | X | X | X | 0 | 0 | 1 | 0 | 1 | 0 | 0 | 0 |
| | | 0 | 1 | 0 | 1 | X | X | X | X | 0 | 1 | 0 | 1 | 0 | 0 | 0 | 0 |
| | SFT=1 | 1 | 0 | 1 | 0 | 1 | 0 | 0 | 0 | 1 | 0 | 1 | 0 | 0 | 0 | 0 | 0 |
| | | 1 | 0 | 1 | 0 | 0 | 1 | 0 | 0 | 1 | 0 | 0 | 0 | 0 | 0 | 1 | 0 |
| | | 1 | 0 | 1 | 0 | 0 | 0 | 1 | 0 | 0 | 1 | 0 | 1 | 0 | 0 | 0 | 0 |
| | RED=1 | 0 | 1 | 0 | 1 | 1 | 0 | 0 | 0 | 0 | 0 | 0 | 1 | 0 | 1 | 0 | 0 |
| | | 0 | 1 | 0 | 1 | 0 | 0 | 0 | 0 | 0 | 1 | 0 | 1 | 0 | 0 | 0 | 0 |
| | | 0 | 1 | 0 | 1 | 0 | 0 | 0 | 1 | 0 | 1 | 0 | 0 | 0 | 0 | 0 | 1 |

FIG. 24

| CONTROL STATE | INPUT SIGNAL | | | | | | | | OUTPUT SIGNAL | | | | | | | |
|---|---|---|---|---|---|---|---|---|---|---|---|---|---|---|---|---|
| | YSEL | | | | LSEL | | | | DQSEL | | | | SDQSEL | | | |
| | <0> | <1> | <2> | <3> | <0> | <1> | <2> | <3> | <0> | <1> | <2> | <3> | <0> | <1> | <2> | <3> |
| NRM=1 | 1 | 1 | 1 | 1 | X | X | X | X | 1 | 1 | 1 | 1 | 0 | 0 | 0 | 0 |
| SFT=1 | 1 | 1 | 1 | 1 | X | X | X | X | 0 | 1 | 1 | 1 | 1 | 0 | 0 | 0 |
| RED=1 | 1 | 1 | 1 | 1 | 1 | 0 | 0 | 0 | 0 | 1 | 1 | 1 | 1 | 0 | 0 | 0 |
| | 1 | 1 | 1 | 1 | 0 | 1 | 0 | 0 | 1 | 0 | 1 | 1 | 0 | 1 | 0 | 0 |
| | 1 | 1 | 1 | 1 | 0 | 0 | 1 | 0 | 1 | 1 | 0 | 1 | 0 | 0 | 1 | 0 |
| | 1 | 1 | 1 | 1 | 0 | 0 | 0 | 1 | 1 | 1 | 1 | 0 | 0 | 0 | 0 | 1 | n BIT MODE

X: 1 or 0 Don't care

FIG. 25

| DEFECTIVE DATA LINE | LSEL | | | |
|---|---|---|---|---|
| | <0> | <1> | <2> | <3> |
| i | 1 | 0 | 0 | 0 |
| I+1 | 0 | 1 | 0 | 0 |
| I+2 | 0 | 0 | 1 | 0 |
| I+3 | 0 | 0 | 0 | 1 |

FIG. 28

| IO SELECT CIRCUIT | CONTROL STATE | | | CAD | | DQSEL | | | | SDQSEL | | | | DQ NUMBER |
|---|---|---|---|---|---|---|---|---|---|---|---|---|---|---|
| | NRM | RED | SFT | <0> | <1> | <0> | <1> | <2> | <3> | <0> | <1> | <2> | <3> | |
| Z0 | 1 | 0 | 0 | 0 | 0 | 1 | 0 | 0 | 0 | 0 | 0 | 0 | 0 | 0 |
| | | | | 1 | 0 | 0 | 1 | 0 | 0 | 0 | 0 | 0 | 0 | 1 |
| | | | | 0 | 1 | 0 | 0 | 1 | 0 | 0 | 0 | 0 | 0 | 2 |
| | | | | 1 | 1 | 0 | 0 | 0 | 1 | 0 | 0 | 0 | 0 | 3 |
| Z1 | 0 | 1 | 0 | 0 | 0 | 1 | 0 | 0 | 0 | 0 | 0 | 0 | 0 | 4 |
| | | | | 1 | 0 | 0 | 0 | 0 | 0 | 0 | 1 | 0 | 0 | 5 |
| | | | | 0 | 1 | 0 | 0 | 1 | 0 | 0 | 0 | 0 | 0 | 6 |
| | | | | 1 | 1 | 0 | 0 | 0 | 1 | 0 | 0 | 0 | 0 | 7 |
| Z2 | 0 | 0 | 1 | 0 | 0 | 0 | 1 | 0 | 0 | 1 | 0 | 0 | 0 | 8 |
| | | | | 1 | 0 | 0 | 0 | 1 | 0 | 0 | 0 | 0 | 0 | 9 |
| | | | | 0 | 1 | 0 | 0 | 0 | 1 | 0 | 0 | 0 | 0 | 10 |
| | | | | 1 | 1 | 0 | 1 | 0 | 0 | 0 | 0 | 0 | 0 | 11 |
| Z3 | 0 | 0 | 1 | 0 | 0 | 0 | 0 | 1 | 0 | 1 | 0 | 0 | 0 | 12 |
| | | | | 1 | 0 | 0 | 0 | 0 | 1 | 0 | 0 | 0 | 0 | 13 |
| | | | | 0 | 1 | 0 | 1 | 0 | 0 | 0 | 0 | 0 | 0 | 14 |
| | | | | 1 | 1 | 0 | 0 | 1 | 0 | 0 | 0 | 0 | 0 | 15 |
| ... | | | | | | | | | | | | | | |
| Z7 | 0 | 0 | 1 | 0 | 0 | 0 | 0 | 0 | 0 | 1 | 0 | 0 | 0 | 28 |
| | | | | 1 | 0 | 0 | 1 | 0 | 0 | 0 | 0 | 0 | 0 | 29 |
| | | | | 0 | 1 | 0 | 0 | 1 | 0 | 0 | 0 | 0 | 0 | 30 |
| | | | | 1 | 1 | 0 | 0 | 0 | 1 | 0 | 0 | 0 | 0 | 31 |

FIG. 30

| BUS WIDTH | BUSSEL ⟨0⟩ | ⟨1⟩ | ⟨2⟩ |
|---|---|---|---|
| n | 1 | 0 | 0 |
| n/2 | 0 | 1 | 0 |
| n/4 | 0 | 0 | 1 |

FIG. 34A

| DEFECTIVE IO BLOCK | USELA | | | | | | | | Block0 CONTROL SIGNAL STATE | | | Block1 CONTROL SIGNAL STATE | | | ... | Block6 CONTROL SIGNAL STATE | | | Block7 CONTROL SIGNAL STATE | | |
|---|---|---|---|---|---|---|---|---|---|---|---|---|---|---|---|---|---|---|---|---|---|
| | ⟨0⟩ | ⟨1⟩ | ⟨2⟩ | ⟨3⟩ | ⟨4⟩ | ⟨5⟩ | ⟨6⟩ | ⟨7⟩ | NRM1 | RED1 | SFT1 | NRM1 | RED1 | SFT1 | | NRM1 | RED1 | SFT1 | NRM1 | RED1 | SFT1 |
| NO DEFECT | 0 | 0 | 0 | 0 | 0 | 0 | 0 | 0 | 1 | 0 | 0 | 1 | 0 | 0 | | 1 | 0 | 0 | 1 | 0 | 0 |
| Block0 | 1 | 0 | 0 | 0 | 0 | 0 | 0 | 0 | 0 | 1 | 0 | 1 | 0 | 1 | | 1 | 0 | 0 | 1 | 0 | 0 |
| Block1 | 1 | 1 | 0 | 0 | 0 | 0 | 0 | 0 | 0 | 0 | 1 | 0 | 1 | 0 | | 1 | 0 | 0 | 1 | 0 | 0 |
| Block2 | 1 | 1 | 1 | 0 | 0 | 0 | 0 | 0 | 0 | 0 | 0 | 0 | 0 | 1 | | 1 | 0 | 0 | 1 | 0 | 0 |
| Block3 | 1 | 1 | 1 | 1 | 0 | 0 | 0 | 0 | 0 | 0 | 0 | 0 | 0 | 0 | | 1 | 0 | 0 | 1 | 0 | 0 |
| Block4 | 1 | 1 | 1 | 1 | 1 | 0 | 0 | 0 | 0 | 0 | 0 | 0 | 0 | 0 | | 1 | 0 | 0 | 1 | 0 | 0 |
| Block5 | 1 | 1 | 1 | 1 | 1 | 1 | 0 | 0 | 0 | 0 | 0 | 0 | 0 | 0 | | 1 | 0 | 1 | 1 | 0 | 0 |
| Block6 | 1 | 1 | 1 | 1 | 1 | 1 | 1 | 0 | 0 | 0 | 0 | 0 | 0 | 1 | | 0 | 1 | 0 | 1 | 0 | 0 |
| Block7 | 1 | 1 | 1 | 1 | 1 | 1 | 1 | 1 | 0 | 0 | 0 | 0 | 0 | 1 | | 0 | 0 | 1 | 0 | 1 | 0 |

FIG. 34B

| DEFECTIVE IO BLOCK | USELB | | | | | | | | Block0 CONTROL SIGNAL STATE | | | Block1 CONTROL SIGNAL STATE | | | ... | Block6 CONTROL SIGNAL STATE | | | Block7 CONTROL SIGNAL STATE | | |
|---|---|---|---|---|---|---|---|---|---|---|---|---|---|---|---|---|---|---|---|---|---|
| | ⟨0⟩ | ⟨1⟩ | ⟨2⟩ | ⟨3⟩ | ⟨4⟩ | ⟨5⟩ | ⟨6⟩ | ⟨7⟩ | NRM2 | RED2 | SFT2 | NRM2 | RED2 | SFT2 | | NRM2 | RED2 | SFT2 | NRM2 | RED2 | SFT2 |
| Block0 | 1 | 1 | 1 | 1 | 1 | 1 | 1 | 1 | 0 | 1 | 1 | 0 | 0 | 1 | | 0 | 0 | 1 | 0 | 0 | 1 |
| Block1 | 0 | 1 | 1 | 1 | 1 | 1 | 1 | 1 | 1 | 0 | 0 | 0 | 1 | 0 | | 0 | 0 | 1 | 0 | 0 | 1 |
| Block2 | 0 | 0 | 1 | 1 | 1 | 1 | 1 | 1 | 1 | 0 | 0 | 1 | 0 | 0 | | 0 | 0 | 1 | 0 | 0 | 1 |
| Block3 | 0 | 0 | 0 | 1 | 1 | 1 | 1 | 1 | 1 | 0 | 0 | 1 | 0 | 0 | | 0 | 0 | 1 | 0 | 0 | 1 |
| Block4 | 0 | 0 | 0 | 0 | 1 | 1 | 1 | 1 | 1 | 0 | 0 | 1 | 0 | 0 | | 0 | 0 | 1 | 0 | 0 | 1 |
| Block5 | 0 | 0 | 0 | 0 | 0 | 1 | 1 | 1 | 1 | 0 | 0 | 1 | 0 | 0 | | 1 | 0 | 1 | 0 | 0 | 1 |
| Block6 | 0 | 0 | 0 | 0 | 0 | 0 | 1 | 1 | 1 | 0 | 0 | 1 | 0 | 0 | | 1 | 1 | 0 | 0 | 0 | 1 |
| Block7 | 0 | 0 | 0 | 0 | 0 | 0 | 0 | 1 | 1 | 0 | 0 | 1 | 0 | 0 | | 1 | 0 | 0 | 0 | 1 | 0 |
| NO DEFECT | 0 | 0 | 0 | 0 | 0 | 0 | 0 | 0 | 1 | 0 | 0 | 1 | 0 | 0 | | 1 | 0 | 0 | 1 | 0 | 0 |

FIG. 35

| STATUS DECODE INTERMEDIATE SIGNAL | | | | | | | STATUS SIGNAL | | | | | | |
|---|---|---|---|---|---|---|---|---|---|---|---|---|---|
| SFT1 | RED1 | NRM1 | SFT2 | RED2 | NRM2 | | NRM | SFTA | SFTB | REDA | REDB | REDAB |
| 1 | 0 | 0 | 1 | 0 | 0 | ↑ | \\\ | THIS STATUS NOT POSSIBLE | | | | |
| 1 | 0 | 0 | 0 | 1 | 0 | ↑ | \\\ | THIS STATUS NOT POSSIBLE | | | | |
| 1 | 0 | 0 | 0 | 0 | 1 | ↑ | 0 | 1 | 0 | 0 | 0 | 0 |
| 0 | 1 | 0 | 1 | 0 | 0 | ↑ | \\\ | THIS STATUS NOT POSSIBLE | | | | |
| 0 | 1 | 0 | 0 | 1 | 0 | ↑ | 0 | 0 | 0 | 1 | 0 | 0 |
| 0 | 1 | 0 | 0 | 0 | 1 | ↑ | 0 | 0 | 0 | 1 | 0 | 0 |
| 0 | 0 | 1 | 1 | 0 | 0 | ↑ | 0 | 0 | 1 | 0 | 0 | 0 |
| 0 | 0 | 1 | 0 | 1 | 0 | ↑ | 0 | 0 | 0 | 0 | 1 | 0 |
| 0 | 0 | 1 | 0 | 0 | 1 | ↑ | 1 | 0 | 0 | 0 | 0 | 0 |

FIG. 36A

STATUS DECODE INTERMEDIATE SIGNAL (A SIDE)

|      | USELA |     |     |     |     |     |     |     |
|------|-----|-----|-----|-----|-----|-----|-----|-----|
|      | ⟨0⟩ | ⟨1⟩ | ⟨2⟩ | ⟨3⟩ | ⟨4⟩ | ⟨5⟩ | ⟨6⟩ | ⟨7⟩ |
|      | 1   | 1   | 1   | 0   | 0   | 0   | 0   | 0   |
| SFT1 | 1   | 1   | 0   | 0   | 0   | 0   | 0   | 0   |
| RED1 | 0   | 0   | 1   | 0   | 0   | 0   | 0   | 0   |
| NRM1 | 0   | 0   | 0   | 1   | 1   | 1   | 1   | 1   |

↑ BLOCK0  ↑ BLOCK1  ↑ BLOCK2  ↑ BLOCK3  ↑ BLOCK4  ↑ BLOCK5  ↑ BLOCK6  ↑ BLOCK7

FIG. 36B

STATUS DECODE INTERMEDIATE SIGNAL (B SIDE)

|      | USELB |     |     |     |     |     |     |     |
|------|-----|-----|-----|-----|-----|-----|-----|-----|
|      | ⟨0⟩ | ⟨1⟩ | ⟨2⟩ | ⟨3⟩ | ⟨4⟩ | ⟨5⟩ | ⟨6⟩ | ⟨7⟩ |
|      | 0   | 0   | 0   | 0   | 0   | 0   | 1   | 1   |
| SFT2 | 0   | 0   | 0   | 0   | 0   | 0   | 0   | 1   |
| RED2 | 0   | 0   | 0   | 0   | 0   | 0   | 1   | 0   |
| NRM2 | 1   | 1   | 1   | 1   | 1   | 1   | 0   | 0   |

↑ BLOCK0  ↑ BLOCK1  ↑ BLOCK2  ↑ BLOCK3  ↑ BLOCK4  ↑ BLOCK5  ↑ BLOCK6  ↑ BLOCK7

FIG. 36C

STATUS SIGNAL

| BLOCK | 0 | 1 | 2 | 3 | 4 | 5 | 6 | 7 |
|-------|---|---|---|---|---|---|---|---|
| SFTA  | 1 | 1 | 0 | 0 | 0 | 0 | 0 | 0 |
| REDA  | 0 | 0 | 1 | 0 | 0 | 0 | 0 | 0 |
| NRM   | 0 | 0 | 0 | 1 | 1 | 1 | 0 | 0 |
| REDB  | 0 | 0 | 0 | 0 | 0 | 0 | 1 | 0 |
| SFLB  | 0 | 0 | 0 | 0 | 0 | 0 | 0 | 1 |

↑ BLOCK WITH DEFECTIVE DATA LINE   ↑ BLOCK WITH DEFECTIVE DATA LINE

|         | LSELA,LSELB |     |     |     |
|---------|-----|-----|-----|-----|
|         | ⟨0⟩ | ⟨1⟩ | ⟨2⟩ | ⟨3⟩ |
| TM1A="H" | 1 | 0 | 0 | 0 |
| TM1B="H" | 0 | 0 | 0 | 1 |

FIG. 43A

WHEN TM1A = H

|        | STATUS SIGNAL | | | | | |
|--------|-----|------|------|------|------|-------|
|        | NRM | SFTA | SFTB | REDA | REDB | REDAB |
| Block0 | 0 | 1 | 0 | 0 | 0 | 0 |
| Block1 | 0 | 1 | 0 | 0 | 0 | 0 |
| Block2 | 0 | 1 | 0 | 0 | 0 | 0 |
| Block3 | 0 | 1 | 0 | 0 | 0 | 0 |
| Block4 | 0 | 1 | 0 | 0 | 0 | 0 |
| Block5 | 0 | 1 | 0 | 0 | 0 | 0 |
| Block6 | 0 | 1 | 0 | 0 | 0 | 0 |
| Block7 | 0 | 1 | 0 | 0 | 0 | 0 |

FIG. 43B

WHEN TM1B = H

|        | STATUS SIGNAL | | | | | |
|--------|-----|------|------|------|------|-------|
|        | NRM | SFTA | SFTB | REDA | REDB | REDAB |
| Block0 | 0 | 0 | 1 | 0 | 0 | 0 |
| Block1 | 0 | 0 | 1 | 0 | 0 | 0 |
| Block2 | 0 | 0 | 1 | 0 | 0 | 0 |
| Block3 | 0 | 0 | 1 | 0 | 0 | 0 |
| Block4 | 0 | 0 | 1 | 0 | 0 | 0 |
| Block5 | 0 | 0 | 1 | 0 | 0 | 0 |
| Block6 | 0 | 0 | 1 | 0 | 0 | 0 |
| Block7 | 0 | 0 | 1 | 0 | 0 | 0 |

FIG. 45

|  | LSELA | | | | LSELB | | | |
|---|---|---|---|---|---|---|---|---|
|  | ⟨0⟩ | ⟨1⟩ | ⟨2⟩ | ⟨3⟩ | ⟨0⟩ | ⟨1⟩ | ⟨2⟩ | ⟨3⟩ |
| TM2="H" | 1 | 0 | 0 | 0 | 1 | 0 | 0 | 0 |

FIG. 46

WHEN TM2 = H

|  | STATUS SIGNAL | | | | | |
|---|---|---|---|---|---|---|
|  | NRM | SFTA | SFTB | REDA | REDB | REDAB |
| Block0 | 0 | 0 | 0 | 1 | 0 | 0 |
| Block1 | 1 | 0 | 0 | 0 | 0 | 0 |
| Block2 | 1 | 0 | 0 | 0 | 0 | 0 |
| Block3 | 1 | 0 | 0 | 0 | 0 | 0 |
| Block4 | 1 | 0 | 0 | 0 | 0 | 0 |
| Block5 | 1 | 0 | 0 | 0 | 0 | 0 |
| Block6 | 1 | 0 | 0 | 0 | 0 | 0 |
| Block7 | 0 | 0 | 0 | 0 | 1 | 0 |

FIG. 48

WHEN TM2 = H

| | STATUS SIGNAL | | | | | |
|---|---|---|---|---|---|---|
| | NRM | SFTA | SFTB | REDA | REDB | REDAB |
| Block0 | 1 | 0 | 0 | 0 | 0 | 0 |
| Block1 | 1 | 0 | 0 | 0 | 0 | 0 |
| Block2 | 1 | 0 | 0 | 0 | 0 | 0 |
| Block3 | 1 | 0 | 0 | 0 | 0 | 0 |
| Block4 | 1 | 0 | 0 | 0 | 0 | 0 |
| Block5 | 1 | 0 | 0 | 0 | 0 | 0 |
| Block6 | 1 | 0 | 0 | 0 | 0 | 0 |
| Block7 | 1 | 0 | 0 | 0 | 0 | 0 |

FIG. 50

| DEFECTIVE IO BLOCK | UFBLOCKA,UFBLOCKB ⟨0⟩ | ⟨1⟩ | ⟨2⟩ | ⟨3⟩ | ⟨4⟩ | ⟨5⟩ | ⟨6⟩ | ⟨7⟩ |
|---|---|---|---|---|---|---|---|---|
| NO BLOCK | 0 | 0 | 0 | 0 | 0 | 0 | 0 | 0 |
| Block0 | 1 | 0 | 0 | 0 | 0 | 0 | 0 | 0 |
| Block1 | 0 | 1 | 0 | 0 | 0 | 0 | 0 | 0 |
| Block2 | 0 | 0 | 1 | 0 | 0 | 0 | 0 | 0 |
| Block3 | 0 | 0 | 0 | 1 | 0 | 0 | 0 | 0 |
| Block4 | 0 | 0 | 0 | 0 | 1 | 0 | 0 | 0 |
| Block5 | 0 | 0 | 0 | 0 | 0 | 1 | 0 | 0 |
| Block6 | 0 | 0 | 0 | 0 | 0 | 0 | 1 | 0 |
| Block7 | 0 | 0 | 0 | 0 | 0 | 0 | 0 | 1 |

FIG. 51

| DEFECTIVE DATA LINE | LSELA ⟨0⟩ | ⟨1⟩ | ⟨2⟩ | ⟨3⟩ | LSELB ⟨0⟩ | ⟨1⟩ | ⟨2⟩ | ⟨3⟩ |
|---|---|---|---|---|---|---|---|---|
| i | 1 | 0 | 0 | 0 | 1 | 1 | 1 | 1 |
| i+1 | 1 | 1 | 0 | 0 | 0 | 1 | 1 | 1 |
| i+2 | 1 | 1 | 1 | 0 | 0 | 0 | 1 | 1 |
| i+3 | 1 | 1 | 1 | 1 | 0 | 0 | 0 | 1 |

| BLOCK (IO SELECT CIRCUIT) | DECODED DEFECTIVE BLOCK INDEX SIGNAL FROM FUSE INFORMATION | | INPUT ADDRESS CAD | | OUTPUT SIGNAL | | | | | | | | | | | | | | | | IO LINE INDEX |
|---|---|---|---|---|---|---|---|---|---|---|---|---|---|---|---|---|---|---|---|---|---|
| | UFBLOCKA | UFBLOCKB | ⟨0⟩ | ⟨1⟩ | DQSELL ⟨0⟩ | ⟨1⟩ | ⟨2⟩ | ⟨3⟩ | DQSELC ⟨0⟩ | ⟨1⟩ | ⟨2⟩ | ⟨3⟩ | DQSELR ⟨0⟩ | ⟨1⟩ | ⟨2⟩ | ⟨3⟩ | | | | | |
| 0 (ZE0) | 0 | 0 | 0 | 0 | 0 | 0 | 0 | 0 | 0 | 0 | 0 | 0 | 0 | 0 | 0 | 0 | | | | | 0 |
| | | | 0 | 1 | 0 | 0 | 0 | 0 | 0 | 0 | 0 | 0 | 0 | 0 | 0 | 0 | | | | | 1 |
| | | | 1 | 0 | 0 | 0 | 0 | 0 | 0 | 0 | 0 | 0 | 0 | 0 | 0 | 0 | | | | | 2 |
| | | | 1 | 1 | 0 | 0 | 0 | 0 | 0 | 0 | 0 | 0 | 0 | 0 | 0 | 0 | | | | | 3 |
| 1 (ZE1) | 0 | 0 | 0 | 0 | 0 | 0 | 0 | 0 | 0 | 0 | 0 | 0 | 0 | 0 | 0 | 0 | | | | | 4 |
| | | | 0 | 1 | 0 | 0 | 0 | 0 | 0 | 0 | 0 | 0 | 0 | 0 | 0 | 0 | | | | | 5 |
| | | | 1 | 0 | 0 | 0 | 0 | 0 | 0 | 0 | 0 | 0 | 0 | 0 | 0 | 0 | | | | | 6 |
| | | | 1 | 1 | 0 | 0 | 0 | 0 | 0 | 0 | 0 | 0 | 0 | 0 | 0 | 0 | | | | | 7 |
| 2 (ZE2) | 1 | 0 | 0 | 0 | 1 | 0 | 0 | 0 | 0 | 0 | 0 | 0 | 0 | 0 | 0 | 0 | | | | | 8 |
| | | | 0 | 1 | 0 | 1 | 0 | 0 | 0 | 0 | 0 | 0 | 0 | 0 | 0 | 0 | ←DATA LINE TO BE REPLACED | | | | 9 |
| | | | 1 | 0 | 0 | 0 | 1 | 0 | 0 | 0 | 0 | 0 | 0 | 0 | 0 | 0 | | | | | 10 |
| | | | 1 | 1 | 0 | 0 | 0 | 1 | 0 | 0 | 0 | 0 | 0 | 0 | 0 | 0 | | | | | 11 |
| 3 (ZE3) | 0 | 0 | 0 | 0 | 0 | 0 | 0 | 0 | 1 | 0 | 0 | 0 | 0 | 0 | 0 | 0 | | | | | 12 |
| | | | 0 | 1 | 0 | 0 | 0 | 0 | 0 | 1 | 0 | 0 | 0 | 0 | 0 | 0 | | | | | 13 |
| | | | 1 | 0 | 0 | 0 | 0 | 0 | 0 | 0 | 1 | 0 | 0 | 0 | 0 | 0 | | | | | 14 |
| | | | 1 | 1 | 0 | 0 | 0 | 0 | 0 | 0 | 0 | 1 | 0 | 0 | 0 | 0 | | | | | 15 |
| 4 (ZE4) | 0 | 0 | 0 | 0 | 0 | 0 | 0 | 0 | 1 | 0 | 0 | 0 | 0 | 0 | 0 | 0 | | | | | 16 |
| | | | 0 | 1 | 0 | 0 | 0 | 0 | 0 | 1 | 0 | 0 | 0 | 0 | 0 | 0 | | | | | 17 |
| | | | 1 | 0 | 0 | 0 | 0 | 0 | 0 | 0 | 1 | 0 | 0 | 0 | 0 | 0 | | | | | 18 |
| | | | 1 | 1 | 0 | 0 | 0 | 0 | 0 | 0 | 0 | 1 | 0 | 0 | 0 | 0 | | | | | 19 |
| 5 (ZE5) | 0 | 0 | 0 | 0 | 0 | 0 | 0 | 0 | 1 | 0 | 0 | 0 | 0 | 0 | 0 | 0 | | | | | 20 |
| | | | 0 | 1 | 0 | 0 | 0 | 0 | 0 | 1 | 0 | 0 | 0 | 0 | 0 | 0 | | | | | 21 |
| | | | 1 | 0 | 0 | 0 | 0 | 0 | 0 | 0 | 1 | 0 | 0 | 0 | 0 | 0 | | | | | 22 |
| | | | 1 | 1 | 0 | 0 | 0 | 0 | 0 | 0 | 0 | 1 | 0 | 0 | 0 | 0 | | | | | 23 |
| 6 (ZE6) | 0 | 1 | 0 | 0 | 0 | 0 | 0 | 0 | 1 | 0 | 0 | 0 | 0 | 0 | 0 | 0 | | | | | 24 |
| | | | 0 | 1 | 0 | 0 | 0 | 0 | 0 | 1 | 0 | 0 | 0 | 0 | 0 | 0 | | | | | 25 |
| | | | 1 | 0 | 0 | 0 | 0 | 0 | 0 | 0 | 1 | 0 | 0 | 0 | 0 | 0 | | | | | 26 |
| | | | 1 | 1 | 0 | 0 | 0 | 0 | 0 | 0 | 0 | 1 | 0 | 0 | 0 | 1 | ←DATA LINE TO BE REPLACED | | | | 27 |
| 7 (ZE7) | 0 | 0 | 0 | 0 | 0 | 0 | 0 | 0 | 0 | 0 | 0 | 0 | 0 | 0 | 0 | 0 | | | | | 28 |
| | | | 0 | 1 | 0 | 0 | 0 | 0 | 0 | 0 | 0 | 0 | 0 | 0 | 0 | 0 | | | | | 29 |
| | | | 1 | 0 | 0 | 0 | 0 | 0 | 0 | 0 | 0 | 0 | 0 | 0 | 0 | 0 | | | | | 30 |
| | | | 1 | 1 | 0 | 0 | 0 | 0 | 0 | 0 | 0 | 0 | 0 | 0 | 0 | 0 | | | | | 31 |

FIG. 62

|  | LSELA | | | | LSELB | | | |
|---|---|---|---|---|---|---|---|---|
|  | ⟨0⟩ | ⟨1⟩ | ⟨2⟩ | ⟨3⟩ | ⟨0⟩ | ⟨1⟩ | ⟨2⟩ | ⟨3⟩ |
| TM4="H" | 1 | 0 | 0 | 0 | 1 | 0 | 0 | 0 |

FIG. 63

WHEN TM4 = H

|  | UFBLOCKA | UFBLOCKB |  |
|---|---|---|---|
| ⟨0⟩ | 0 | 1 | ←BLOCK 0 |
| ⟨1⟩ | 0 | 0 | ←BLOCK 1 |
| ⟨2⟩ | 0 | 0 | ←BLOCK 2 |
| ⟨3⟩ | 0 | 0 | ←BLOCK 3 |
| ⟨4⟩ | 0 | 0 | ←BLOCK 4 |
| ⟨5⟩ | 0 | 0 | ←BLOCK 5 |
| ⟨6⟩ | 0 | 0 | ←BLOCK 6 |
| ⟨7⟩ | 1 | 0 | ←BLOCK 7 |

SEMICONDUCTOR MEMORY DEVICE WITH SIMULTANEOUS DATA LINE SELECTION AND SHIFT REDUNDANCY SELECTION

RELATED APPLICATIONS

This application is a Continuation-In-Part of U.S. application Ser. No. 09/768,352, filed Jan. 25, 2001, now abandoned incorporated herein by reference.

BACKGROUND OF THE INVENTION

1. Field of the Invention

The present invention relates to semiconductor memory devices, particularly to a semiconductor memory device having a redundancy structure.

2. Description of the Background Art

In order to repair defective memory cells to improve the yield, a conventional semiconductor memory device includes redundant memory cells to substitute for the defective memory cell.

In recent years, the demand for a large bus width to improve the data transfer speed is great. There is the tendency of a larger data line width and a relatively smaller column address. Particularly in a dynamic random access memory (DRAM embedded with a logic circuit directed to system-on-chip, there is the demand of increasing the bus width from 32 bits to 256 bits and reducing the column address from 256 bits to 16 bits.

In a conventional semiconductor memory device, repair of a defective memory cell was carried out by exchanging the bit lines through a column address. When the column address is small, a high repair rate cannot be achieved unless a relatively large amount of redundant memory cells are prepared.

To this end, the method of arranging a redundant memory cell and a redundant data line connected to that redundant memory cell to exchange the defective data line with a redundant data line is being employed.

In a logic-embedded DRAM, the method is employed of providing a large internal bus width and selecting a required bus width using a column address at the connection to an external source so as to accommodate a variety of bus widths.

An example of a conventional semiconductor memory device 5000 with a redundancy structure will be described with reference to FIG. 64. Semiconductor memory device 5000 includes a memory cell array 500 with a plurality of memory cells arranged in a matrix, a plurality of normal data line pairs 501 connected to memory cells via a sense amplifier, a redundant data line pair 502, a row decoder 510 decoding an input row address to carry out selection in a row direction, a column address decoder 511 decoding an input column address for output, a shift redundancy circuit 512 including position information of a defective data line, an IO select circuit 503 selecting a data line, a read amplifier•write driver unit 504, and an IO shift circuit 505.

IO select circuit 503 selects a data line pair to be used according to the output of column address decoder 511. Referring to FIG. 65, IO select circuit 503 is formed of a plurality of switches. Half of normal data line pairs LIO(0), LIO(0), . . . are connected to read amplifier•write driver unit 504. Redundant data line pair SLIO(0), /SLIO(0) or SLIO(1), SLIO(1) is connected to read amplifier•write driver unit 504.

Read amplifier•write driver unit 504 includes a plurality of read amplifier•write drivers RW (read amplifier R, write driver W). By read amplifier•write driver unit 504, the data of the selected data line pair are transmitted to internal data lines DB(0), and redundant internal data line SDB, or the data of internal data lines DB(0), and redundant internal data line SDB are transmitted to the selected data line pair.

In IO shift circuit 505, the connection between the internal data line and the data input/output pin (external data line) is shifted to remove a defective data line according to the data line shift method, as shown in FIG. 66. More specifically, the defective data line is replaced with an adjacent data line. The data line used for replacement is further replaced with an adjacent data line. By repeating replacement between adjacent data lines, the last data line is replaced with the redundant data line. As a result, data lines other than the defective data line are connected to data input/output pins (external data line) DQ(0)–DQ(n).

Thus, data of a selected memory cell is output to an external source. In a write operation, data is written into a selected memory cell through an opposite path.

According to the structure of the conventional semiconductor memory device, the pass through the switch circuit to switch the data lines and the data line switch circuit for redundancy replacement is inevitable, causing delay in data transfer.

SUMMARY OF THE INVENTION

In view of the foregoing, an object of the present invention is to provide a semiconductor memory device capable of high speed data transfer in a semiconductor memory device having a redundancy structure.

According to an aspect of the present invention, a semiconductor memory device includes a memory cell array with a plurality of memory cells arranged in a matrix, a plurality of data lines with a redundant data line and a normal data line to read out data or write in data from/to the memory cell array, a plurality of external data lines to transfer data with an external source, and a data line switch circuit executing simultaneously a select operation of selecting a data line to be coupled with a plurality of external data lines and a shift operation of shifting the connection of a data line to be coupled to a plurality of external data lines according to an external address and data line information related to a defective data line in the normal data lines.

Preferably, the plurality of data lines are divided into a plurality of blocks. The data line switch circuit includes a decoder decoding an external address and data line information, and a plurality of select circuits arranged between a plurality of blocks and the plurality of external data lines respectively. Each of the plurality of select circuits carries out a select operation and a shift operation simultaneously according to the output of the decoder. Each of the plurality of select circuits shares some of the data lines with an adjacent select circuit.

Each of the plurality of select circuits includes a plurality of transfer gates provided between a corresponding data line and a corresponding external data line to be open/closed according to the output of the decoder.

According to the semiconductor memory device having a redundant data line of the present aspect, execution of the data line shift redundancy scheme and selection of a data line specified by an address can be carried out simultaneously. Therefore, high speed data transfer is allowed.

According to another aspect of the present invention, a semiconductor memory device includes a memory cell array with a plurality of memory cells arranged in a matrix, a plurality of data lines with a redundant data line and a normal data line to read out or write in data from or to the memory cell array, and a data line switch circuit executing simultaneously a select operation of selecting a data line to be coupled with a plurality of external data lines according to an external address and a replace operation of replacing a defective data line in the data line to be coupled with a redundant data line according to data line information related to a defective data line.

Preferably, the plurality of normal data lines are divided into a plurality of blocks. The data line switch circuit includes a decoder decoding an external address and data line information, and a plurality of select circuits. Each of the plurality of select circuits carries out simultaneously a select operation and a replace operation.

Particularly, each of the plurality of select circuits includes a plurality of transfer gates that are open/closed according to the output of the decoder, provided between a redundant data line and corresponding normal data line and a corresponding external data line.

According to the semiconductor memory device having a redundant data line of the present aspect, data transfer can be carried out at high speed since the data line replace operation and the data line select operation are carried out simultaneously.

According to a further aspect of the present invention, a semiconductor memory device includes a memory cell array with a plurality of memory cells arranged in a matrix, a plurality of data lines with a redundant data line and a normal data line to read out or write in data from or into the memory cell array, and a data line switch circuit executing simultaneously a select operation of selecting a data line to be coupled with an external data line to be used according to a bus width and a shift operation of shifting connection between the external data line to be used and the data line to be coupled according to data line information related to a defective data line in the normal data line.

Preferably, each of the plurality of data lines and plurality of external data lines is divided into a plurality of blocks. The plurality of blocks share some data lines with an adjacent block. The data line switch circuit includes a plurality of switch circuits arranged corresponding to the plurality of blocks, respectively. Each of the plurality of switch circuits belongs to any of the status of a mode switching the connection between a corresponding data line and a corresponding external data line according to a bus width, a mode of substituting the defective data line with a common data line, and shifting connection between a corresponding external data line and a corresponding data line according to the bus width, and a mode of shifting connection between a corresponding data line and a corresponding external data line according to the bus width.

Particularly, each of the plurality of switch circuits includes m nodes, a first gate selectively switching the connection between the m nodes and m external data lines according to the bus width, a second gate rendering a defective data line and m nodes nonconnected according to the bus width and data line information, and a third gate selectively connecting a common data line with one of the m nodes according to the bus width and the data line information.

According to the semiconductor memory device of the present aspect, the data line select circuit and the redundant replacement circuit are shared in common. The shift redundancy scheme is employed in combination on a block-by-block basis to switch the bus width. Therefore, data can be transferred at high speed.

According to still another aspect of the present invention, a semiconductor memory device includes a memory cell array with the plurality of memory cells arranged in a matrix, a plurality of data lines with first and second redundant data lines and a plurality of normal data lines to read out or write in data from/to the memory cell array, a plurality of external data lines provided corresponding to the plurality of normal data lines, respectively, to transfer data with an external source, and a data line switch circuit executing simultaneously a select operation of selecting a data line to be coupled with an external data line to be used according to a bus width and a shift operation of shifting the connection of a data line to be coupled to the external data line to be used according to data line information related to a defective data line in the plurality of data lines.

Preferably, the first and second redundant data lines are respectively arranged at an outer side of the plurality of normal data lines. The plurality of data lines are arranged in the order of the first redundant data line, respective plurality of normal data lines, and the second redundant data line. The plurality of external data lines are divided into a plurality of blocks, each block corresponding to n external data lines. The plurality of data lines are divided for every (n+2) data lines in order so that two normal data lines are shared between adjacent blocks, corresponding to the plurality of blocks, respectively. The data line switch circuit includes a plurality of switch circuits arranged corresponding to the plurality of blocks, respectively. Each of the plurality of switch circuits belongs to any one of first to sixth modes, i.e., the first mode with no defective data line in a corresponding block, switching the connection between a corresponding normal data line and a corresponding external data line according to the bus width; the second mode without a defective data line in the corresponding block, shifting the connection between a corresponding external data line and a corresponding data line according to the bus width to the first redundant data line side; the third mode without a defective data line in the corresponding block, shifting the connection between a corresponding external data line and a corresponding data line according to the bus width to the second redundant data line side; the fourth mode with one defective data line in the corresponding block, replacing the one defective data line using one of the data line from corresponding (n+2) data lines shared with an adjacent block at the first redundant data line side and the first redundant data line, and shifting the connection between the corresponding external data line and corresponding data line according to the bus width; the fifth mode with one defective data line in the corresponding block, replacing the one defective data line using one of the data line from the corresponding (n+2) data lines shared with an adjacent block at the second redundant data line side and the second redundant data line, and shifting the connection between the corresponding external data line and corresponding data line according to the bus width; and the sixth mode with two defective data lines in the corresponding block, replacing two defective data lines using one of the data line shared with an adjacent block at the first redundant data line side and the first redundant data line, and using one of the data line shared with an adjacent block at the second redundant data line side and the second redundant data line from corresponding (n+2) data lines, and shifting the connection between the corresponding external data line and corresponding data line according to the bus width.

Particularly, each of the plurality of switch circuits includes n nodes, a switch unit selectively switching the connection between n nodes and n external data lines according to the bus width, and a select unit rendering the defective data line and n nodes nonconnected, and connecting n of the corresponding (n+2) data lines with the n nodes, based on the bus width, the data line information, and the mode of the corresponding block.

Preferably, each of the plurality of switch circuits is forced to one of the second and third modes, switchable from an external source in a test mode.

Preferably, one of the plurality of switch circuits corresponding to the first redundant data line and one of the plurality of switch circuits corresponding to the second redundant data line are forced to the fourth and fifth modes, respectively, in a test mode.

Preferably, each of the plurality of switch circuits is forced to the first mode in a test mode.

According to the above semiconductor memory device, the data line select circuit and the redundant replacement circuit are shared in common. In a semiconductor memory device of a multidata line structure and that can have the bus width switched by combining the shift redundancy scheme on a block-by-block basis, data can be transferred at high speed. Also, the redundancy efficiency can be improved since two defective data lines can be replaced at the same time.

Since the shift operation can be forced to be executed all the blocks according to the test mode signal, a test mode confirming the data line switch function at each switch circuit constituting the data line switch circuit can be set.

Also, the test mode of accessing simultaneously the two redundant data lines and confirming whether there is a defect corresponding to the redundant data lines can be set.

Since a test mode that allows access of respective data lines excluding the redundant data line, i.e., of the normal data lines from a predetermined external data line can be set even after the information related to the defective data line is programmed, internal defect analysis can be executed efficiently.

Preferably, the respective plurality of external data lines and plurality of normal data lines are divided into a plurality of blocks. The data line switch circuit includes a plurality of switch circuits arranged corresponding to the plurality of block, respectively. Each of the plurality of switch circuits corresponds to any one of the first to fourth modes; i.e. the first mode without a defective data line in a corresponding block, switching the connection between a corresponding normal data line and corresponding external data line according to the bus width; the second mode with one defective data line in the corresponding block, replacing the one defective data line by a shift operation using the first redundant data line; the third mode with one defective data line in the corresponding block, replacing the one defective data line by a shift operation using the second redundant data line; and the fourth mode with two defective data lines in the corresponding block, replacing the two defective data lines by a shift operation using the first and second redundant data lines.

Particularly, each of the plurality of switch circuits includes n nodes, a switch unit selectively switching the connection between the n nodes and n external data lines according to the bus width, and a select unit rendering the defective data line and the n nodes nonconnected, and connecting n data lines out of the corresponding n normal data lines and first and second redundant data lines with the n nodes based on the bus width, the data line information, and the mode to which the corresponding block belongs.

Preferably, two of the plurality of switch circuits are forced to the second and third modes, respectively, in a test mode.

According to such a semiconductor memory device, the data line select circuit and redundant replacement circuit are shared in common. In a semiconductor memory device of a multidata line structure and that can have the bus width switched by combining a shift redundancy scheme on a block-by-block basis, the redundancy efficiency can be improved since two defective data lines can be replaced at the same time. Furthermore, since a shift operation is executed only at the block with a defective data line, data line switching can be controlled relatively easily in the data line switch circuit. In comparison to the structure in which each data line is directly replaced with a redundant data line, the number of external data lines connected to the redundant data line can be suppressed. As a result, the parasitic capacitance of the internal redundant data line can be reduced to allow data transfer at high speed.

Since a test mode that allows direct access towards the redundant data line can be set, determination can be made whether there is a defect in the corresponding redundant data line or whether the data input/output speed is altered by using the redundant internal data line.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a diagram to describe the operation of shift decoders Sxi and SYi of the first embodiment.

FIG. 5 is a diagram to describe the relationship between a defective data line identify signal FS(i) and a defective data line.

FIG. 6 shows a signal applied to each ¼ select circuit when a normal data line LIO(3) is defective in the first embodiment.

FIG. 10 is a diagram to describe an operation of decoders SZi and SWi according to the second embodiment.

FIG. 11 is a diagram to describe the relationship between a defective data line replace signal RS(i) and a defective data line.

FIG. 12 shows a signal input to each ¼ select circuit when a normal data line LIO(3) is defective in the second embodiment.

FIG. 14 shows the relationship among the bus width, column address and address decode signal YSEL<3:0>.

FIG. 15 shows the relationship between the bus width and an external data line (data input/output pin) to be used.

FIG. 20 shows the relationship among a block including a defective data line, signal USEL<7:0>, and the status signal of each block.

FIGS. 22–24 are diagrams to describe the operation of an IO line switch signal generation circuit 212.

FIG. 25 shows the relationship between the position of the defective data line and signal LSEL<3:0>.

FIG. 28 is a diagram showing an example of an operation of semiconductor memory device 2000 of the third embodiment.

FIG. 30 shows the relationship between the bus width setting and a bus width select signal BUSSEL<2:0>.

FIGS. 34A and 34B show the relationship among the block including a defective data line, each of signals USELA<7:0> and USELB<7:0>, and the status decode intermediate signal of each block.

FIG. 35 shows the correspondence between the status decode intermediate signal and status signal.

FIGS. 36A–36C show the decoded result of the status signal of each block when there are defective data lines in block 2 and block 6.

FIGS. 37, 38 and 39 are diagrams to describe an operation of an IO line switch signal generation circuit 312.

FIG. 40 shows the relationship between the position of a defective data line and the control signal status at each IO select circuit.

FIG. 42 is a diagram to describe the setting of signals LSELA<3:0> and LSELB<3:0> in a test mode according to the first modification of the fourth embodiment.

FIGS. 43A and 43B show the setting of the status signal of each block in a test mode according to the first modification of the fourth embodiment.

FIG. 45 is a diagram to describe the setting of signals LSELA<3:0> and LSELB<3:0> in a test mode according to the second modification of the fourth embodiment.

FIG. 46 shows the setting of the status signal of each block in a test mode according to the second modification of the fourth embodiment.

FIG. 48 shows the setting of the status signal of each block in a test mode according to the third modification of the fourth embodiment.

FIG. 50 shows the setting of upper bits UFBLOCKA<7:0> and UFBLOCKB<7:0> of the replacement data line position signal corresponding to the position of a defective data line.

FIG. 51 shows the setting of lower bits LSELA<3:0> and LSELB<3:0> of the replacement data line position signal corresponding to the position of a defective data line.

FIGS. 55, 56 and 57 are diagrams to describe an operation of an IO line switch signal generation circuit 412.

FIG. 58 shows the relationship between the position of a defective data line and the control circuit status in each IO select circuit.

FIG. 62 is a diagram to describe the setting of signals LSELA<3:0> and LSELB<3:0> in a test mode according to the second modification of the fifth embodiment.

FIG. 63 is a diagram showing the setting of upper bits UFBLOCKA<7:0> and UFBLOCKB<7:0> of the replacement data line position signal in a test mode according to the second modification of the fifth embodiment.

DESCRIPTION OF THE PREFERRED EMBODIMENTS

Figure 1:
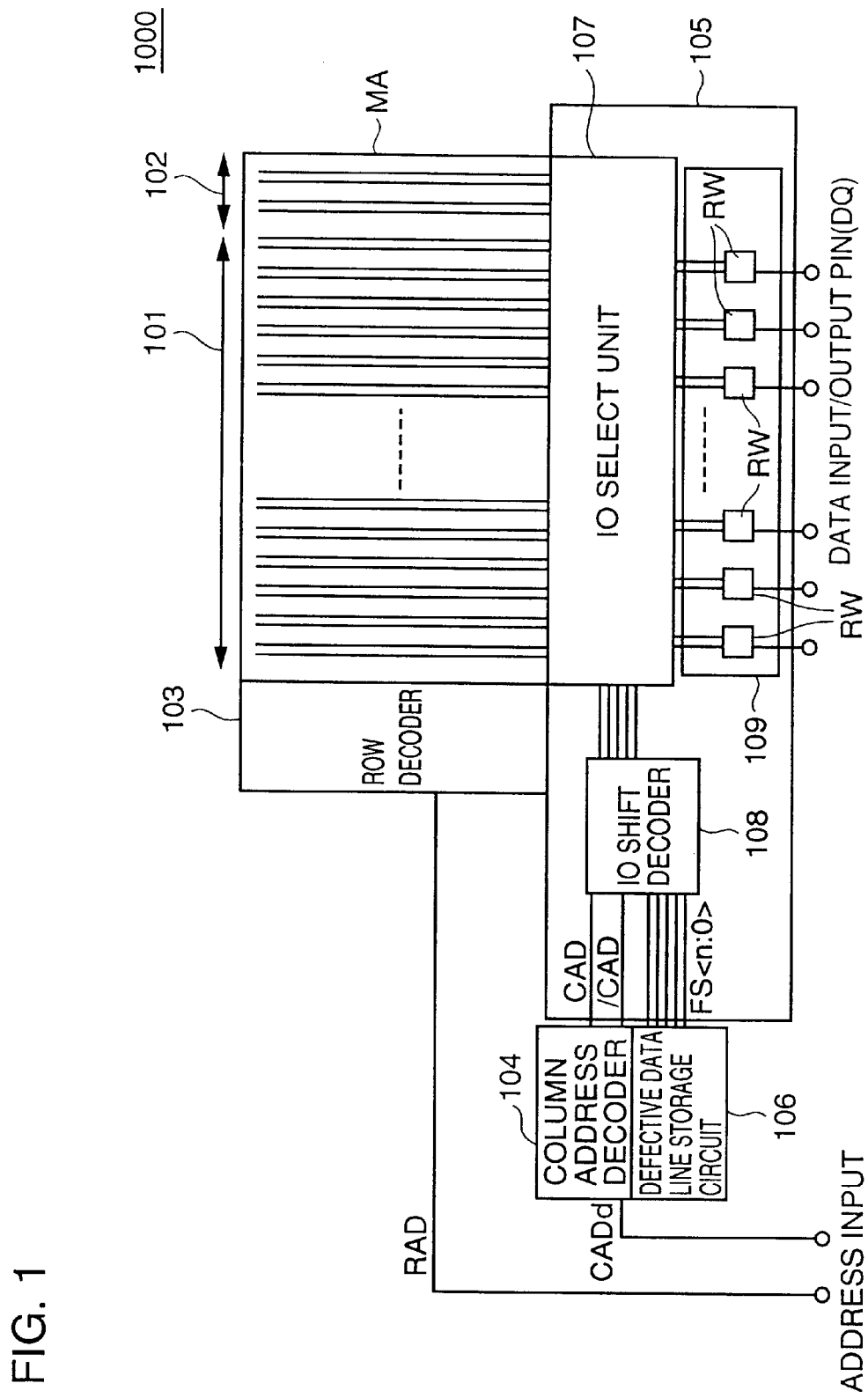
FIG. 1 is a block diagram showing schematically a structure of a semiconductor memory device 1000 according to a first embodiment of the present invention.

Embodiments of the semiconductor memory device of the present invention will be described with reference to the drawings. In the drawings, corresponding or likewise components have the same reference characters allotted, and description thereof will not be repeated.

First Embodiment

Referring to FIG. 1, a semiconductor memory device 1000 according to a first embodiment of the present invention includes a memory cell array MA. Memory cell array MA includes a plurality of memory cells arranged in a matrix, a plurality of word lines corresponding to rows, and a plurality of bit lines corresponding to columns. Semiconductor memory device 1000 also includes a normal data line pair 101 connected to a memory cell via a sense amplifier, a redundant data line pair 102, a row decoder 103 decoding an input row address RAD to carry out activation (selection in row direction) of a word line select•sense amplifier and the like, a column address decoder 104 decoding an input column address CADd to output column addresses CAD, /CAD, a data line switch circuit 105, and a defective data line storage circuit 106.

Defective data line storage circuit 106 has a structure to identify a defective data line. When a fuse is employed as an example of defective data line storage circuit 106, a defective data line identify signal FS<n:0> (=FS(0)–FS(n)) indicating the presence and position of a defective data line is output according to blowing out or not blowing out the fuse. The structural element of defective data line storage circuit 106 is not limited to a fuse whose status is altered by being blown out or not blown out.

Data line switch circuit 105 includes an IO select unit 107, an IO shift decoder 108, and a read amplifier•write driver unit 109 (IO: Input Output). IO select unit 107 selects a data line pair to be used according to defective data line identify signals FS(0)–FS(n) and the output (select signal SEL) of IO shift decoder 108 receiving column addresses CAD, /CAD. The selected data line pair is electrically coupled to a read amplifier•write driver RW in read amplifier•write driver unit 109.

Figure 2:
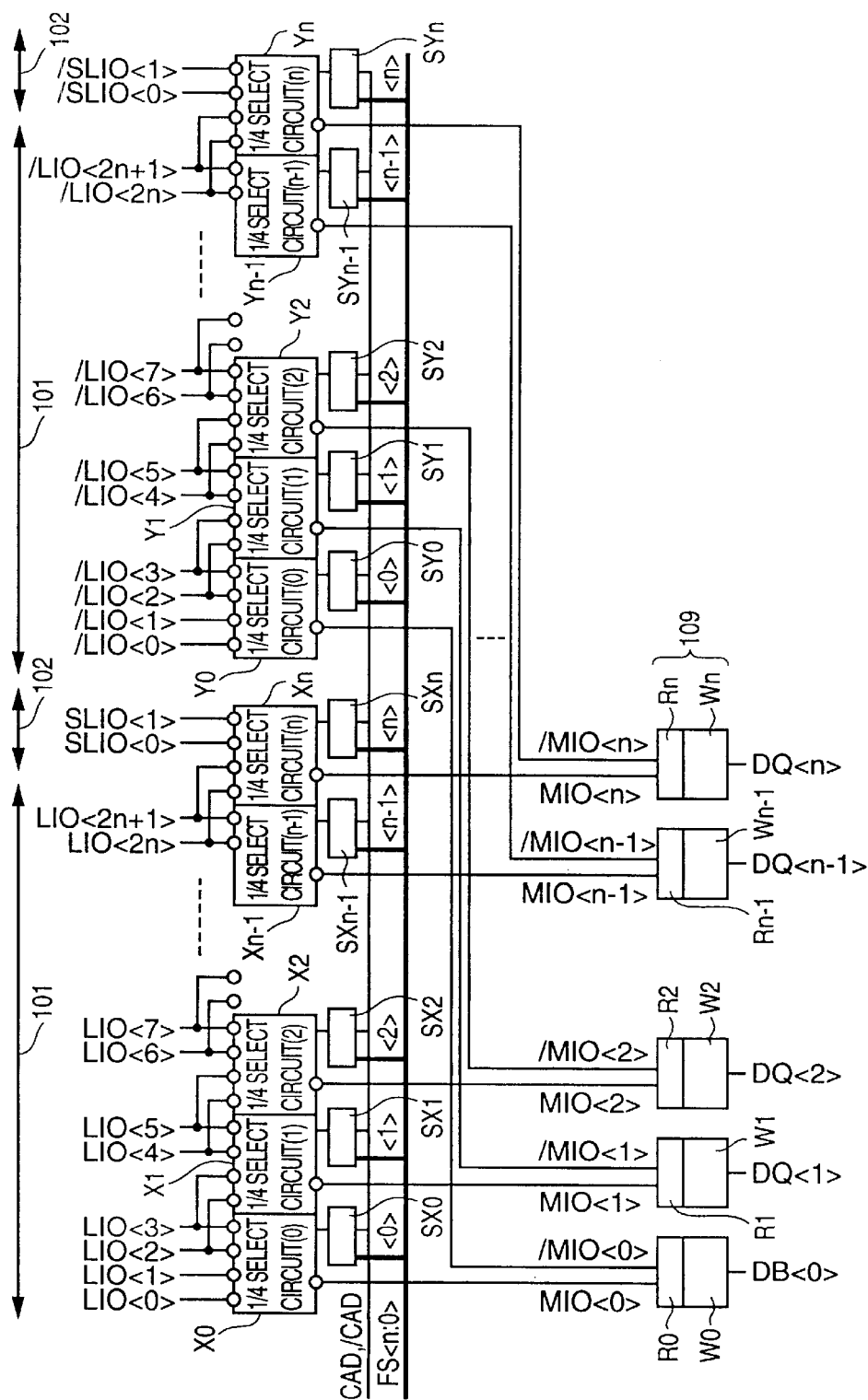
FIG. 2 is a block diagram to describe a structure of an IO select unit 107 of the first embodiment.

Referring to FIG. 2, LIO(i), /LIO(i) represent normal data line pairs. SLIO(k), /SLIO(k) represent redundant data line pairs (i=0–2n+1, k=0, 1).

(n+1) data line pairs out of the (2n+2) data line pairs are selectively connected to (n+1) main data line pairs MIO(j), /MIO(j) (j=0–n) by IO select unit 107.

IO select unit 107 includes ¼ select circuits X0–Xn, Y0–Yn selecting one out of four data lines. ¼ select circuits X0–Xn are disposed corresponding to normal data lines /LIO(k) (k=0–2n+1) and redundant data lines SLIO(0), SLIO(1). ¼ select circuits Y0–Yn are disposed corresponding to normal data lines /LIO(k) (k=0–2n+1) and redundant data lines /SLIO(0), /SLIO(1).

As will be described afterwards, each of ¼ select circuits X0–Xn and Y0–Yn has the same structure.

¼ select circuit Xi (i=0–n) selectively connects one of the four data lines with one main data line MIO(i) according to column addresses CAD and /CAD and the select signal output from shift decoder Sxi receiving defective data line identify signal FS(i).

¼ select circuit Yi (i=0–n) selectively connects one of the four data lines with one main data line /MIO(i) according to column addresses CAD and /CAD and the select signal output from shift decoder SYi receiving defective data line identify signal FS(i).

More specifically, ¼ select circuit X0 connects one of normal data lines LIO(0)–LIO(3) with a main data line MIO(0). ¼ select circuit Xk connects one of normal data lines LIO(2k)–LIO(2k+3) with a main data line MIO(K) (k=1–n–1). ¼ select circuit Xn connects one of normal data lines LIO(2n), LIO(2n+1) and redundant data lines SLIO(0), SLIO(1) with a main data line MIO(n). The rules of ¼ select circuit X0-¼ select circuit Xn are similarly applied to ¼ select circuit Y0-¼ select circuit Yn.

Shift decoders SXi and SYi are included in IO shift decoder 108. It is to be noted that shift decoder SYi can be deleted, and the output of shift decoder SXi shared between ¼ select circuits Xi and Yi.

Read amplifier•write driver unit 109 includes read amplifiers R0–Rn and write drivers W0–Wn. In a readout operation, read amplifier Ri amplifies differentially the potentials of main data line pair MIO(i), /MIO(i) to provide the amplified result to data input/output pin DQ(i) (external data line DQ(i)) (i=0–n). In a write operation, write driver Wi responds to the data of data input/output pin DQ(i) (external data line DQ(i)) to drive the potentials of main data line pairs MIO(i), /MIO(i) (i=0–n).

Figure 3:
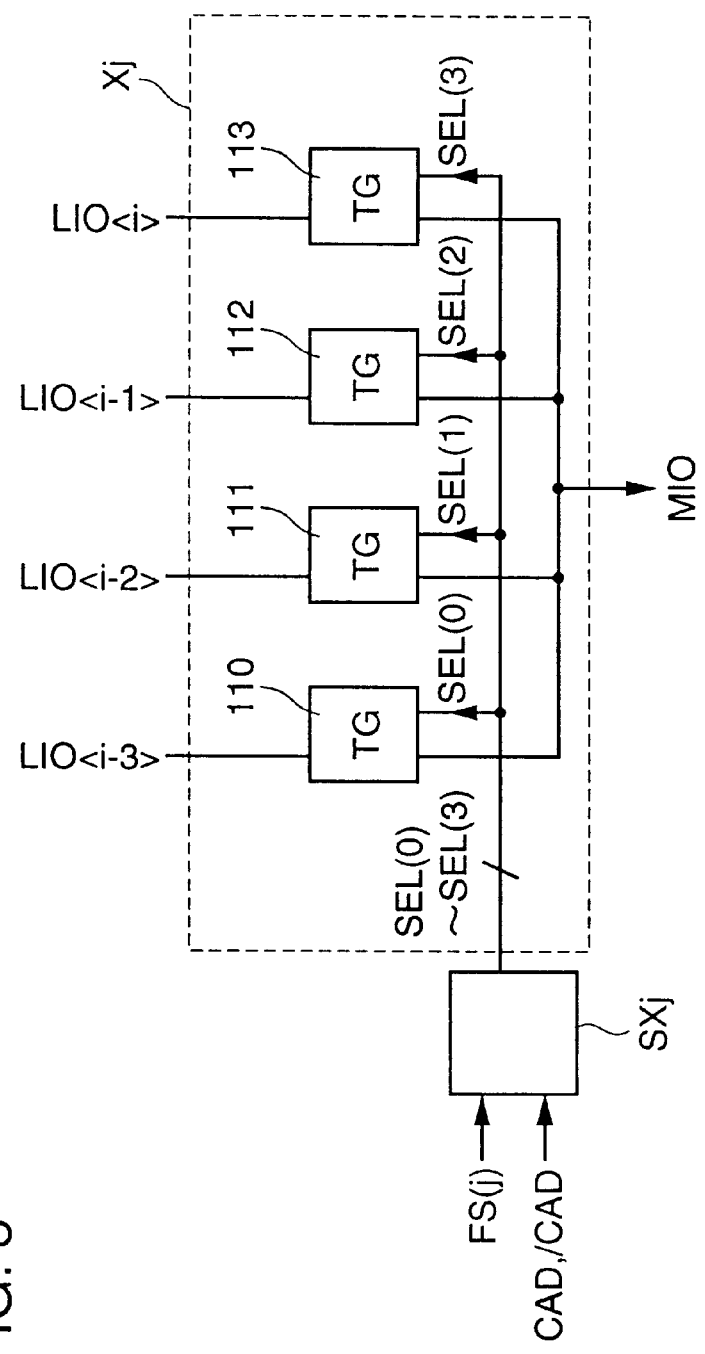
FIG. 3 is a diagram to describe a ¼ select circuit and a shift decoder according to the first embodiment.

The relationship between the ¼ select circuit and the shift decoder is shown in FIG. 3. ¼ select circuit Xj of FIG. 3 includes transfer gates 110–113. In FIG. 3, transfer gates 110–113 are arranged between normal data lines LIO(i–3)–LIO(i) and main data line MIO.

Each of transfer gates 110–113 connects a corresponding data line with the main data line when select signals SEL (0)–SEL(3) attain an H level (logical high). Main data line MIO is connected to read amplifier write driver unit 109 of FIG. 1.

The potentials of select signals SEL(0)–SEL(3) are determined by shift decoder SXj receiving a defective data line identify signal FS(j), and column addresses CAD, /CAD.

The operation of shift decoders SXi and XYi will be described with reference to FIG. 4. In FIG. 4, "1" represents an H level whereas "0" represents an L level (logical low).

When FS(i)=0, SEL(0)=1 or SEL(1)=1 is established according to the column address. When FS(i)=1, SEL(2)=1 or SEL(3)=1 is established according to the column address.

An example of the relationship between defective data line identify signal FS(i) and a defective data line will be described with reference to FIG. 5. In FIG. 5, "1" represents an H level whereas "0" represents an L level. When normal data line pair LIO(2k), /LIO(2k) or LIO(2k+1), /LIO(2k+1) is defective, defective data line identify signals FS(k)–FS(n) are 1 (shift execution). In other cases, defective data line identify signals FS(k)–FS(n) are 0 (no shift).

When normal data line LIO(3) is defective, the signal input to each ¼ select circuit satisfies the relationship of FIG. 6. When normal data line pair LIO(3) is defective, defective data line identify signals FS(1)–FS(n) become 1 and FS(0) becomes 0.

In ¼ select circuits X0 and Y0, select signal SEL(0) or SEL(1) becomes 1 whereas select signals SEL(2) and SEL(3) become 0. In ¼ select circuits Xk and Yk, select signals SEL(0), SEL(1) become 0 whereas select signal SEL(2) or SEL(3) becomes 1 (k=1–n).

The selected status of the data line will be described more specifically. It is assumed that normal data line pair LIO(5), /LIO(5) is defective, and cannot be used. In this case, defective data line identify signal FS(i) (i=0, 1) is at an L level and defective data line identify signal FS(j) (j=2–n) is at an H level.

¼ select circuits X0, X1, Y0 and Y1 receive a defective data line identify signal of an L level. ¼ select circuits Xj, Yj (j=2–n) receive a defective data line identify signal of an H level.

Therefore, ¼ select circuit X0 selects normal data line LIO(0) or LIO(1) that is specified by column address CAD.

¼ select circuit Y0 selects normal data line /LIO(0) or /LIO(1) specified by column address CAD. ¼ select circuit X1 selects normal data line LIO(2) or LIO(3) specified by column address CAD. ¼ select circuit Y1 selects /LIO(2) or /LIO(3) specified by column address CAD.

¼ select circuit X2 selects LIO(6) or LIO(7) specified by column address CAD. ¼ select circuit Y1 selects /LIO(6) or /LIO(7) specified by column address CAD. Therefore, normal data line pair LIO(5), /LIO(5) attains a nonselected state.

Subsequently, ¼ select circuit Xk (k=3–n–1) selects normal data line LIO(2k+2) or LIO(2k+3) whereas ¼ select circuit Yk (k=3–n–1) selects normal data line /LIO(2k+2) or /LIO(2k+3).

Thus, redundant data line SLIO(0) or SLIO(1) is selected in ¼ select circuit Xn, and redundant data line /SLIO(0) or /SLIO(1) is selected in ¼ select circuit Yn.

By combining the column address and the replacement information in the semiconductor memory device of the first embodiment, data line replacement by the data line shift scheme and data line selection can be executed simultaneously. Therefore, high speed data transfer is realized.

Second Embodiment

A semiconductor memory device according to a second embodiment of the present invention will be described here. The second embodiment is a modification of the first embodiment, directed to a semiconductor memory device carrying out redundancy replacement by the data line replacement scheme.

Figure 7:
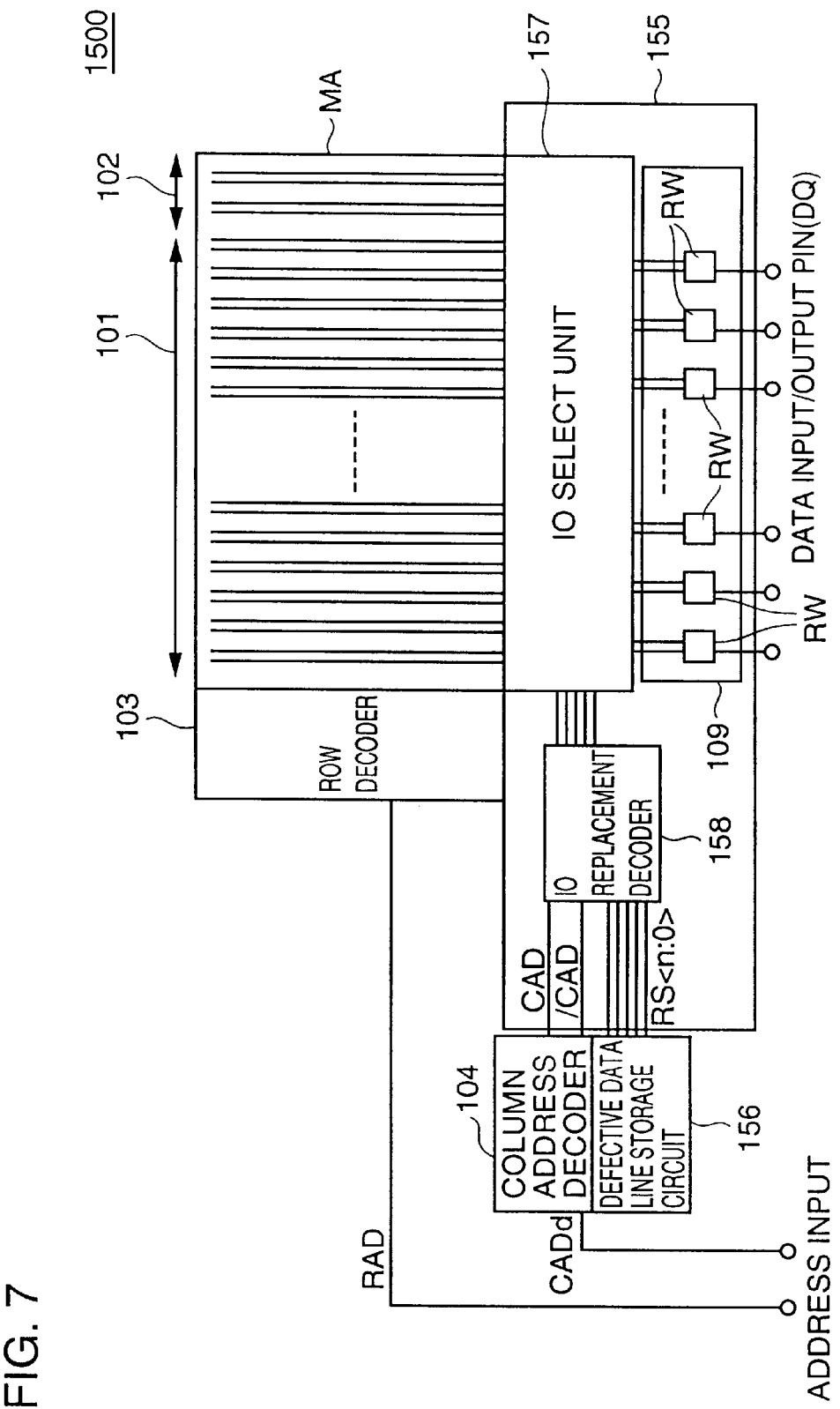
FIG. 7 is a block diagram schematically showing a structure of a semiconductor memory device 1500 according to a second embodiment of the present invention.

Referring to FIG. 7, a semiconductor memory device 1500 of the second embodiment includes a data line switch circuit 155 instead of data line switch circuit 105, and a defective data line storage circuit 156 instead of defective data line storage circuit 106.

Defective data line storage circuit 156 stores the position information of a defective data line. When a fuse is employed as an example of defective data line storage circuit 156, a defective data line replace signal RS<n:0> (=RS(0)–RS(n)) indicating the replacement information of a defective data line is output according to blow out/nonblow out of the fuse. The structural element of defective data line storage circuit 156 is not limited to a fuse whose status is altered by being blown out or not blown out.

Data line switch circuit 155 includes an IO select unit 157, an IO replacement decoder 158, and a read amplifier•write driver unit 109. IO select unit 157 selects a data line pair to be used according to defective data line replace signals RS(0)–RS(n) and the output (select signal SEL) of IO replacement decoder 158 receiving column addresses CAD and /CAD. The selected data line pair is electrically coupled to a read amplifier write driver RW in read amplifier•write driver unit 109.

Figure 8:
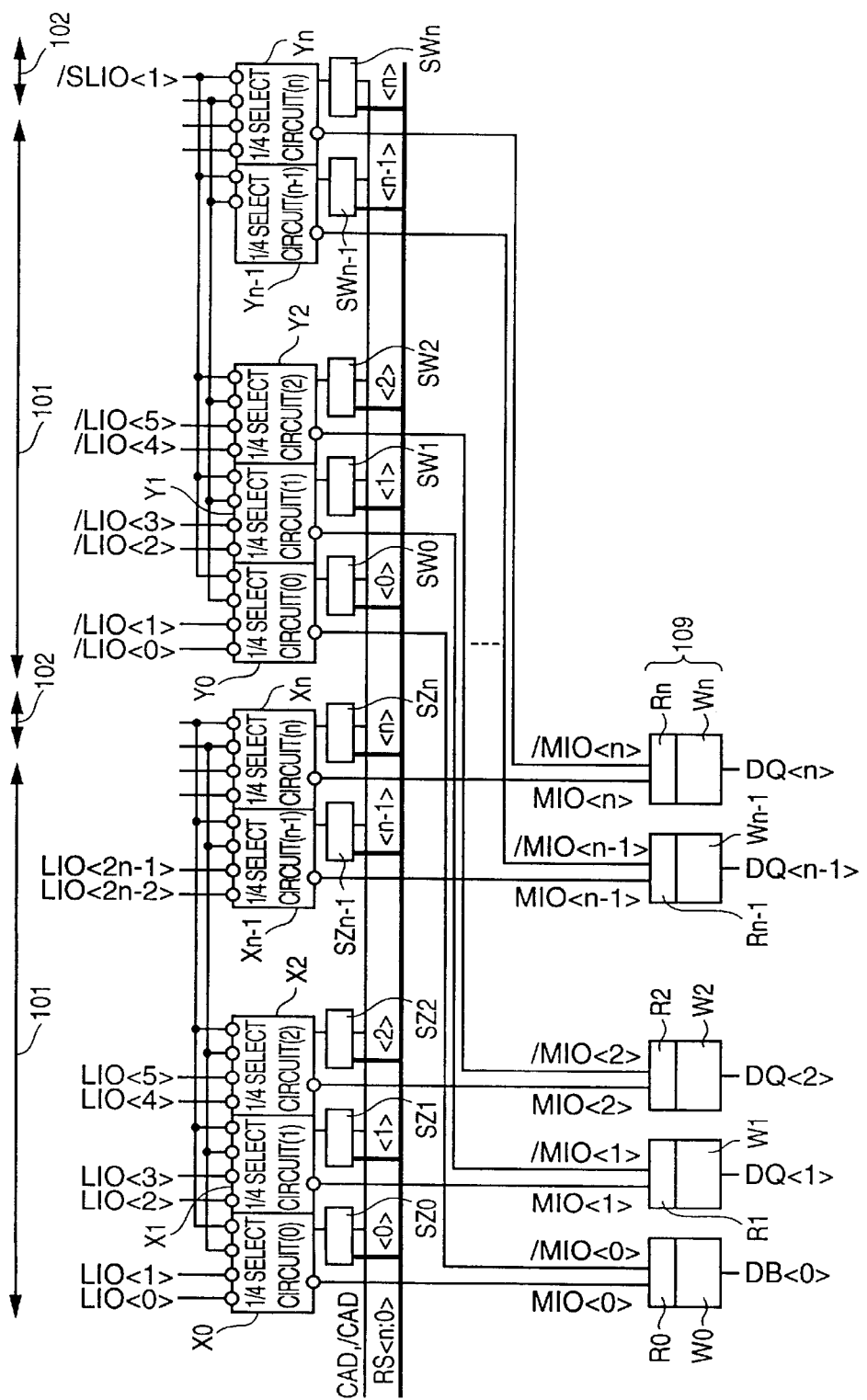
FIG. 8 is a block diagram to describe a structure of an IO select unit 157 according to a second embodiment of the present invention.

Referring to FIG. 8, LIO(i), /LIO(i) represent a normal data line pair. SLIO(k), /SLIO(k) represent a redundant data line pair (i=0–2n+1, k=0, (n+1) data line pairs out of the (2n+2) data line pairs are selectively connected to (n+1) main data line pairs MIO(j), /MIO(j) (j=0–n) by IO select unit 157.

IO select unit 157 includes ¼ select circuits X0–Xn, Y0–Yn selecting one out of four data lines. In the second embodiment, ¼ select circuit Xi (i=0–n) selectively connects one of the four data lines with one main data line MIO(i) according to column addresses CAD, /CAD and a select signal output from decoder SZi receiving defective data line replace signal RS(i). ¼ select circuit Yi (i=0–n) selectively connects one of the four data lines with one main data line /MIO(i) according to column addresses CAD, /CAD and the select signal output from decoder SWi receiving defective data line replace signal RS(i).

¼ select circuit Xk connects one of normal data lines LIO(2k) and LIO(2k+1) and redundant data lines SLIO(0) and SLIO(1) with main data line MIO(k) (k=0–n).

¼ select circuit Yk connects one of normal data line /LIO(2k) and /LIO(2k+1) and redundant data lines /SLIO(0) and /SLIO(1) with main data line /MIO(k) (k=0–n).

Decoders SZi and SWi are included in IO replacement decoder 158. It is to be noted that decoder SWi can be removed, and the output of decoder SZi shared in common with ¼ select circuits Xi and Yi.

Figure 9:
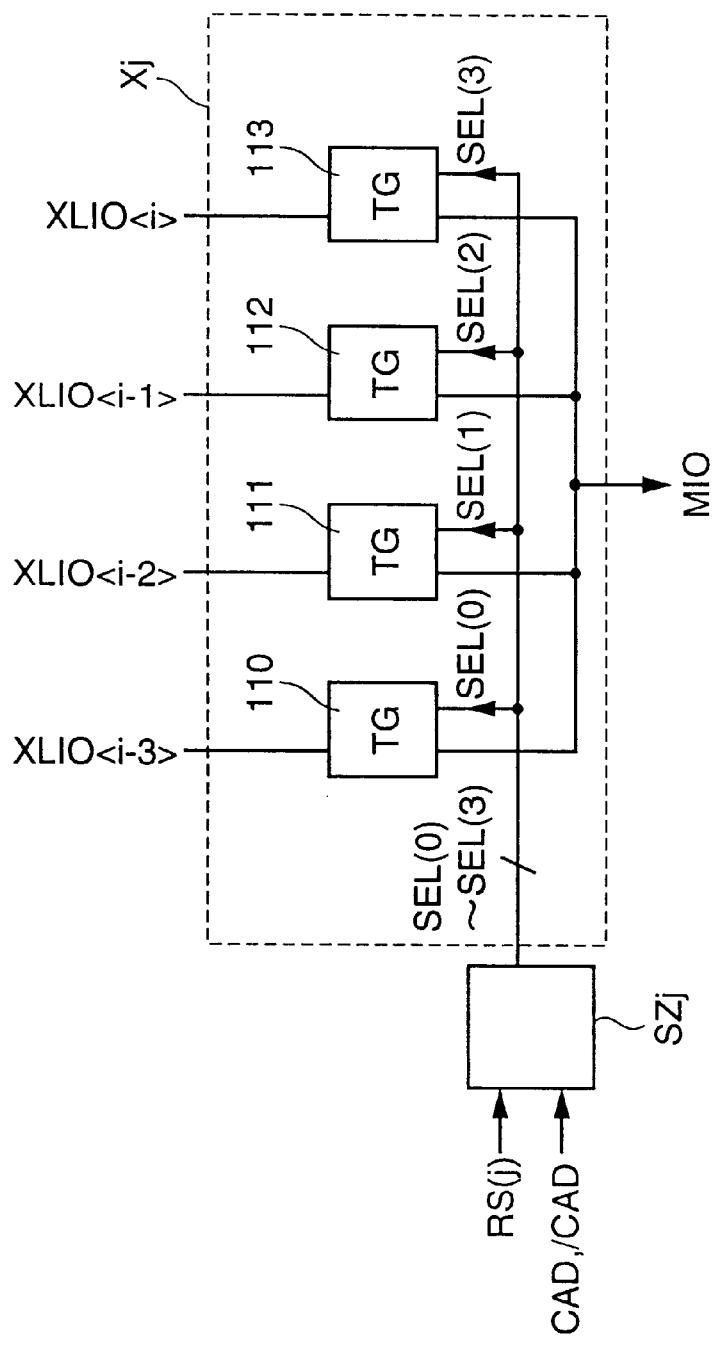
FIG. 9 is a diagram to describe a ¼ select circuit and a decoder according to the second embodiment.

The relationship between the ¼ select circuit and the decoder is shown in FIG. 9. As described above, ¼ select circuit Xj includes transfer gates 110–113. Transfer gates 110–113 in ¼ select circuit Xj of FIG. 9 are disposed between data lines XLIO(i–3)–XLIO(i) and main data line MIO. Each of data lines XLIO(i) and XLIO(i–1) corresponds to redundant data lines SLIO(0) and SLIO(1), respectively. Each of data lines XLIO(i–2) and XLIO(i–3) corresponds to a normal data line.

Each of transfer gates 110–113 connects a corresponding data line with a main data line when select signals SEL(0)–SEL(3) attain an H level.

The potentials of select signals SEL(0)–SEL(3) are determined by decoder SZj receiving defective data line replace signal RS0) and column addresses CAD, /CAD.

The operation of decoders SZi and SWi will be described with reference to FIG. 10. In FIG. 10, "1" represents an H level whereas "0" represents an L level.

When RS(i)=0, SEL(0)=1 or SEL(1)=1 is established according to the column address. When RS(i)=1, SEL(2)=1 or SEL(3)=1 is established according to the column address.

An example of the relationship between a defective data line replace signal RS(i) and a defective data line will be described with reference to FIG. 11. In FIG. 11, "1" represents an H level whereas "0" represents an L level. When normal data line pair LIO(2k), /LIO(2k) or LIO(2k+1), /LIO(2k+1) is defective, defective data line replace signal RS(k) is "1" (replacement executed), and other defective data line replace signals are "0" (no replacement).

When normal data line LIO(3) is defective, the signal input to each ¼ select circuit satisfies the relationship of FIG. 12. When normal data line LIO(3) is defective, defective data line replace signals RS(0), RS(2) RS(n) become "0", and defective data line replace signal RS(1) becomes "1".

In ¼ select circuits Xk, Yk (k=0, 2–n), select signal SEL(0) or SEL(1) becomes "1", and select signals SEL(2), SEL(3) become "1".

In ¼ select circuits X1 and Y1, select signals SEL(0) and SEL(1) become "0", and select signal SEL(2) or SEL(3) becomes "l".

In ¼ select circuit X1, a redundant data line SLIO(0) or SLIO(1) is electrically connected to main data line MIO(1) instead of the normal data line.

In ¼ select circuit Y1, redundant data line /SLIO(0) or /SLIO(1) is electrically connected to main data line MIO(1).

In ¼ select circuit Xk, the normal data line is electrically connected to main data line MIO(1) according to the column address. In ¼ select circuit Yk, the normal data line is electrically connected to main data line /MIO(1) (k=0, 2–n).

By combining the column address and the replacement information in the semiconductor memory device of the second embodiment, data line replacement by the data line replacement scheme and data line selection can be executed simultaneously. Therefore, data transfer of high speed is realized.

Third Embodiment

A semiconductor memory device according to a third embodiment of the present invention will be described. In the third embodiment, the number of normal data line pairs corresponds to 32 (LIO(i), /LIO(i); i=0–31), and the number of the redundant data line pairs corresponds to 1 (SLIO, /SLIO). The data line structure is switchable to ×32, ×16, ×8. In the ×1, ×8 structure, a data line is selected using the column address.

Figure 13:
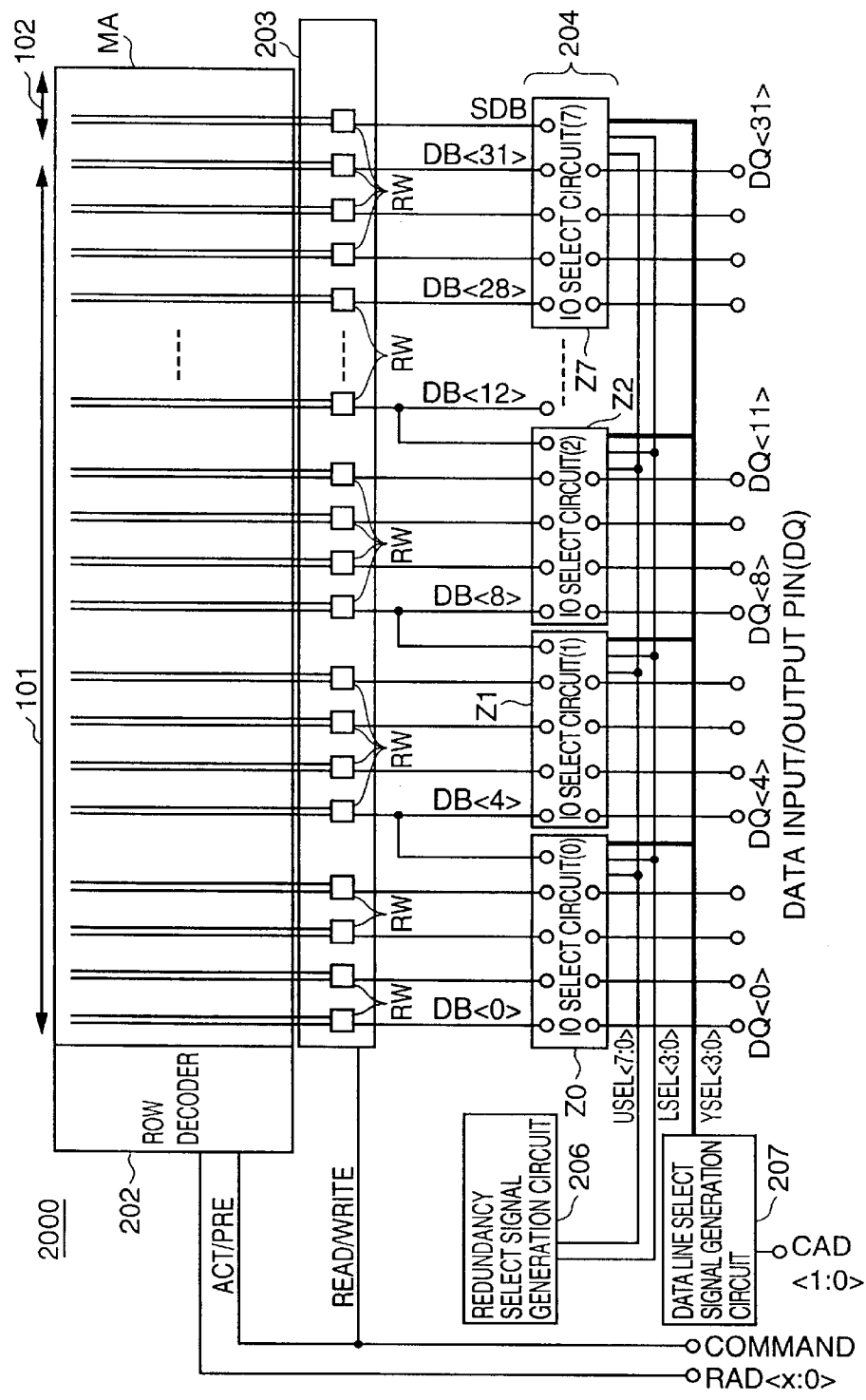
FIG. 13 is a block diagram schematically showing the structure of a semiconductor memory device 2000 according to a third embodiment of the present invention.

Referring to FIG. 13, a semiconductor memory device 2000 according to the third embodiment includes a memory cell array MA. Memory cell array MA includes a plurality of memory cells arranged in a matrix, a plurality of word lines corresponding to rows, and a plurality of bit lines corresponding to columns. Semiconductor memory device 2000 further includes a normal data line pair 101 connected to a memory cell via a sense amplifier, a redundant data line pair 102, and a row decoder 202 decoding an address RAD(x:0) according to a command (for example, an act command ACT, precharge command PRE) to carry out activation (row select operation) of a word line or a sense amplifier.

Semiconductor memory device 2000 further includes a read amplifier•write driver unit 203 operating according to a command READ/WRITE (write command, read command), an IO select unit 204 with IO select circuits Z0–Z7, a redundancy select signal generation circuit 206, and a data line select signal generation circuit 207.

Read amplifier•write driver unit 203 includes a plurality of read amplifier•write drivers RW provided corresponding to respective data line pairs. The data of each of normal data line pairs LIO(i), /LIO(i) and redundant data line pair SLIO, /SLIO are transferred to internal data line DB(i) and a redundant internal data line SDB via read amplifier•write driver unit 203.

The data of each of internal data line DB(i) and redundant internal data line SDB are transferred to normal data line pair LIO(i), /LIO(i) and redundant data line pair SLIO, /SLIO via read amplifier•write driver unit 203.

IO select unit 204 selects an internal data line to be used according to the bus width (column address) and the presence/absence of redundancy usage. Internal data line DB(i) and redundant internal data line SDB are referred to as internal data lines DB(i) and SBD hereinafter.

Internal data lines DB(0)–DB(31), SBD are divided into eight blocks. Each of internal data lines DB(4), DB(8), . . ., DB(28) is shared by adjacent blocks.

IO select circuit Zi (block i) electrically couples the external data line to be used out of external data lines DQ(4×i)–DQ(4×i+3) with an internal data line to be used out of internal data lines DB(4×1)–DB(4×i+4) (i=0–6). IO select circuit Z7 electrically couples an external data line to be used out of external data lines DQ(28)–DQ(31) with an internal data line to be used out of internal data lines DB(28)–DB(31) and SDB. The external data line and the data input/output pin connected to that external data line are represented by the same reference character.

Redundancy select signal generation circuit 206 stores the position of the normal data line that is required to be replaced, and generates a decode signal according to the stored content. This decode signal is referred to as replacement data line position signal, wherein the upper order bit signals are USEL<7:0> (=USEL(0)–USEL(7)) and the lower order bit signals are LSEL<3:0> (=LSEL(0)–LSEL(3)). Signal LSEL indicates which of the four data lines is defective. Signal USEL indicates the presence of a defective data line in the unit of an IO select circuit.

A fuse is employed to store the position of the data line that is to be replaced. The fuse is blown out (or not blown out) according to the relevant position. The structure of redundancy select signal generation circuit 206 is not limited to a fuse.

Data line select signal generation circuit 207 generates an address decode signal YSEL<3:0> (=YSEL(0)–YSEL(3)) to select a data line according to a column address CAD<1:0> (=CAD(0), CAD(1)).

The relationship among the bus width, the column address and address decode signal YSEL<3:0> is as shown in FIG. 14. When the bus width is n, address decode signals YSEL(0)–YSEL(3) are "1" irrespective of the column address. When the bus width is n/2, address decode signals YSEL(0) and YSEL(2) are "1" if column address CAD(0) is "0", and address decode signals YSEL(1) and YSEL(3) are "1" if column address CAD(0) is "1". When the bus width is n/4, any one of address decode signals YSEL(0) YSEL(3) becomes "1" according to the (four) combination of column addresses CAD(0) and CAD(1).

The relationship between the bus width and the external data line (data input/output pin) to be used is as shown in FIG. 15. When the bus width is n, all the external data lines are used. When the bus width is n/2, external data lines DQ(i) (i=0, 2, . . . , n–1) is used. When the bus width is n/4, external data line DQ(j) (j=0, 4, 8, . . . , n–3) is used.

An example of the structure of IO select circuit Zk in IO select unit 204 will be described with reference to FIG. 16. IO select circuit Zk includes an IO switch circuit 210, a redundancy mode decode circuit 211, and an IO line switch signal generation circuit 212. IO switch circuit 210 switches the connection between internal data lines DB(i), DB(i+1), DB(i+2), DB(i+3) and DB(i+4) (or SDB) and external data lines DQ(i), DQ(i+1), DQ(i+2) and DQ(i+3).

The switching by IO switch circuit 210 is under control of select signals DQSEL<3:0> (=DQSEL(0)–DQSEL(3) and SDQSEL<3:0> (=SDQSEL(0)–SDQSEL(3)) output from IO line switch signal generation circuit 212.

Figure 17:
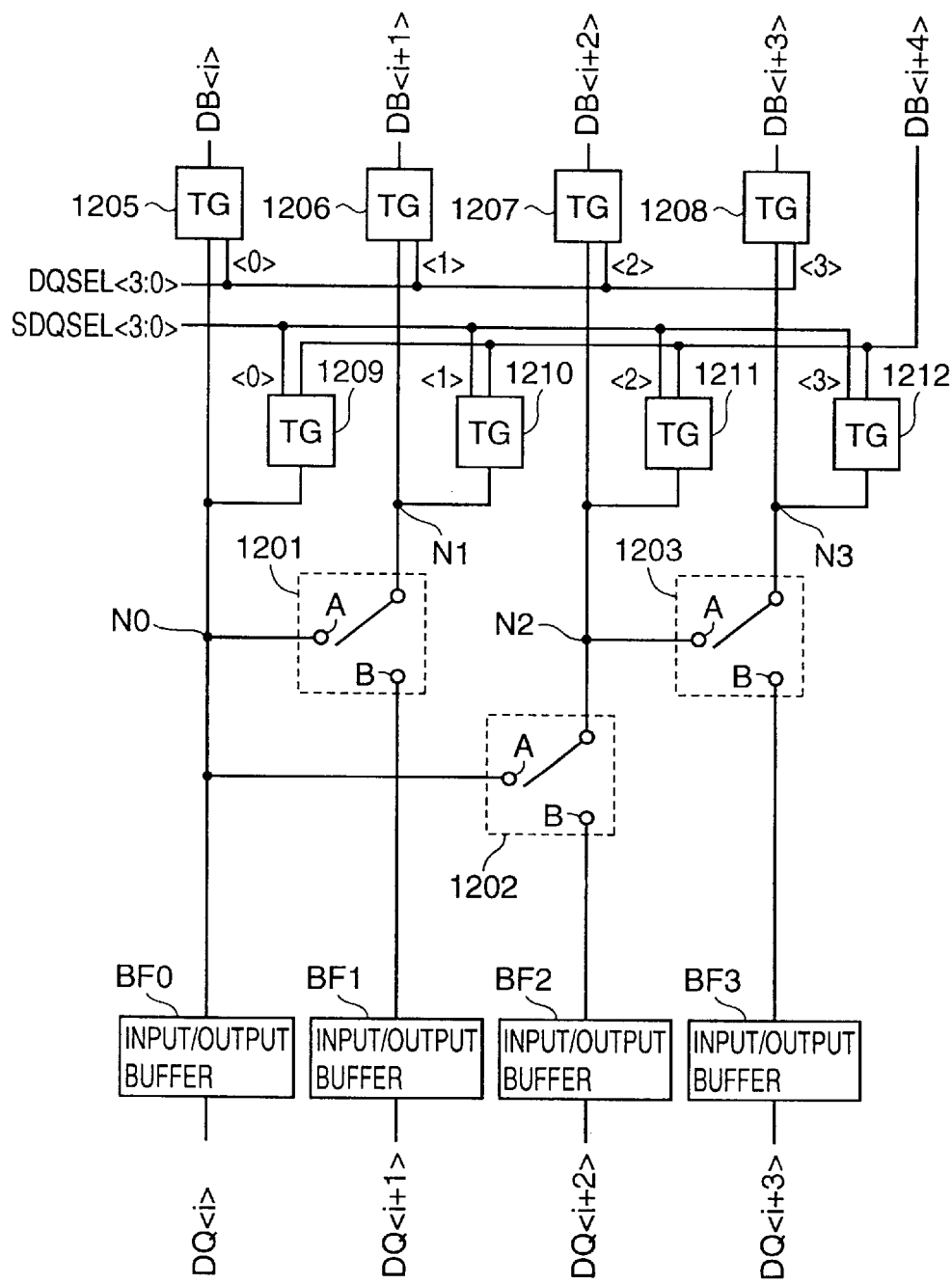
FIG. 17 shows a structure of an IO switch circuit 210.

An example of IO switch circuit 210 is shown in FIG. 17. IO switch circuit 210 includes switches 1201–1203, transfer gates 1205–1212, and input/output buffers BF0–BF3 disposed corresponding to external data lines DQ(i)–DQ(i+3).

Figures 18, 19:
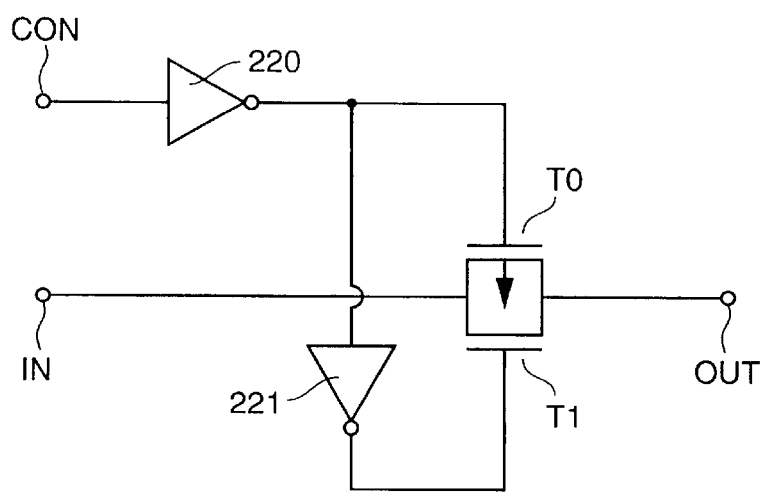
FIG. 18 is a circuit diagram showing a structure of a transfer gate.
FIG. 19 shows the relationship between the data bus and switch change.

Referring to FIG. 18, transfer gates 1205–1212 include an inverter 220 inverting the control signal received at a node CON, an inverter 221 inverting the output of inverter 220, a PMOS transistor T0 turned on according to the output of inverter 220, and an NMOS transistor T1 turned on according to the output of inverter 221. The ON of transistors T0 and T1 causes the signal received at a node IN to be transmitted to a node OUT.

Referring to FIG. 17, transfer gates 1205–1208 select whether to use or not internal data lines DB(i)–DB(i+3). Transfer gate 1205 couples internal data line DB(i) with node N0 according to a select signal DQSEL(0). Transfer gate 1206 couples an internal data line DB(i+1) with a node N1 according to a select signal DQSEL(1). Transfer gate 1207 couples internal data line DB(i+2) with a node N2 according to a select signal DQSEL(2). Transfer gate 1208 couples internal data line DB(i+3) with a node N3 according to select signal DQSEL(3).

Transfer gates 1209–1212 are used to replace a defective data line using an internal data line DB(i+4) (or SDB) shifted from an adjacent IO select circuit. Transfer gate 1209 couples internal data line DB(i+4) with node N0 according to select signal SDQSEL(0). Transfer gate 1210 couples internal data line DB(i+4) with node Ni according to select signal SDQSEL(1). Transfer gate 1211 couples internal data line DB(i+4) with node N2 according to select signal SDQSEL(2). Transfer gate 1212 couples internal data line DB(i+4) with node N3 according to select signal SDQSEL(3).

Switches 1201–1203 switch the bus line according to the bus width. Switch 1201 couples node N1 with node A (input/output buffer BF0) or node B (input/output buffer BF1) according to the bus width. Switch 1202 connects node N2 with node A (input/output buffer BF0) or node B (input/output buffer BF2) according to the bus width. Switch 1203 connects node N3 with node A (node N2) or node B (input/output buffer BF3) according to the bus width.

More specifically, switches 1201–1203 are switched in the direction shown in FIG. 19 according to the bus width. In FIG. 19, "A" implies that the switch is connected to the node A side whereas "B" implies that the switch is connected to the node B side.

When the bus width is n, nodes N0–N3 are isolated from each other. When the bus width is n/2, nodes N0 and N1 are connected and also nodes N2 and N3 are connected. When the bus width is n/4, node N0 is connected with all nodes N1, N2 and N3.

The switching by switches 1201–1203 can be implemented by electrical switching using transistors, or switching through metal wiring.

Figure 16:
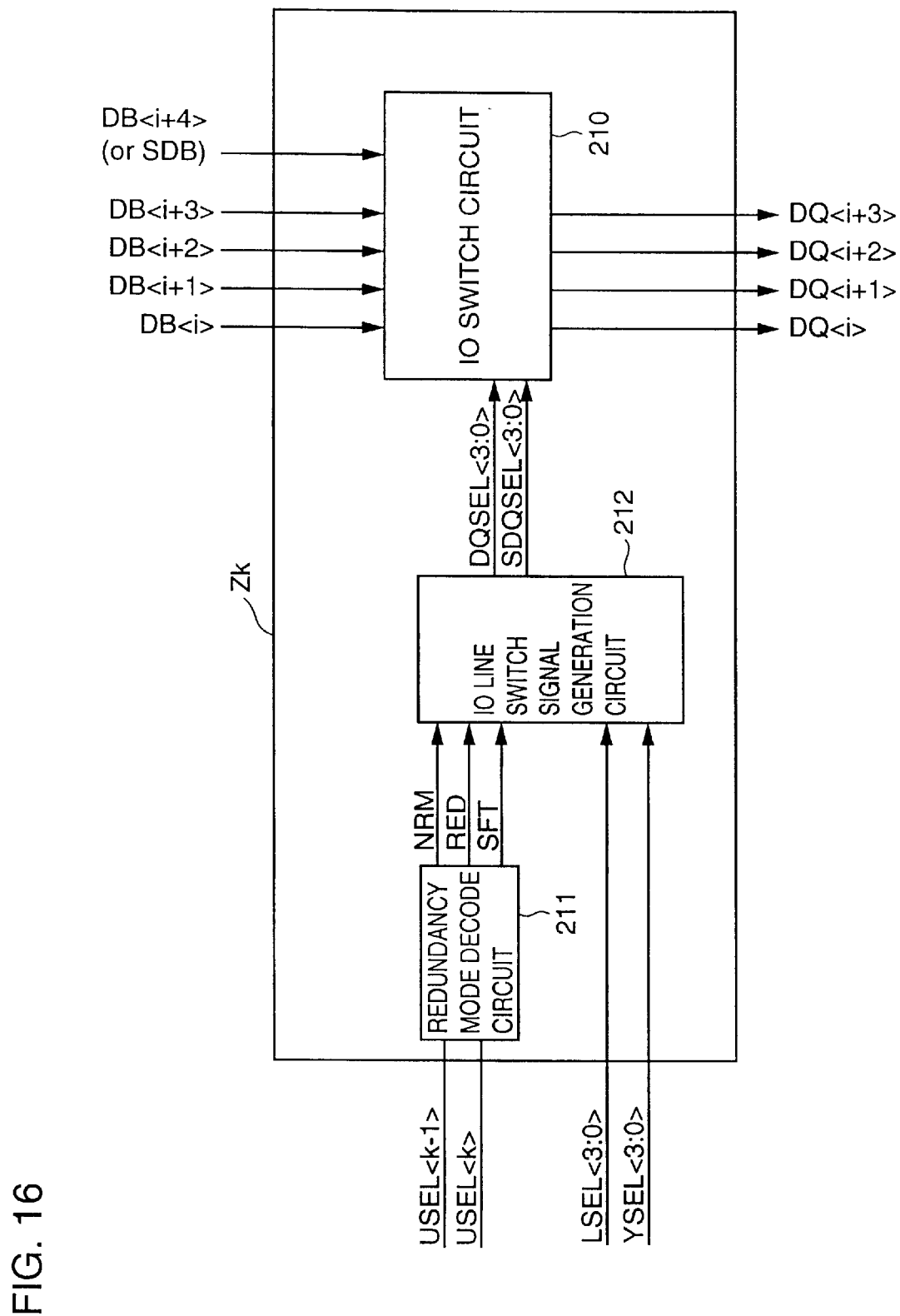
FIG. 16 is a block diagram showing an example of a structure of an IO select circuit Zk in an IO select unit 204.

Referring to FIG. 16, redundancy mode decode circuit 211 generates a status signal (NRM, RED, SET) using the upper order bit signal (USEL) of the replacement data line position signal. These status signals include information such as whether redundancy replacement is required or not, whether a data line commonly shared with an adjacent block is to be used for redundancy replacement, or whether shifting is to be carried out or not.

The relationship of the block including the defective data line with respect to signal USEL<7:0> and the status signals NRM, RED, SFT of each block is shown in FIG. 20.

When the defective data line is present in block k (defective data line is any one of the four data lines corresponding to IO select circuit Zk), signals USEL(k+1)–USEL(8) become 1, and the other signals are 0. When there is no defective data line, all the bits of signal USEL<7:0> are 0.

Each block (IO select signal) can take either one of three status, i.e. the status where there is no defect, the status where there is a defect and shifting is to be effected, and the status where shifting is to be effected even though there is no defect.

One of corresponding signals NRM, RED, SFT becomes "1" for each block. When there is a defective data line in block k, signal RED in block k becomes "1" (shift operation is carried out for replacement). In blocks upper of the block with "1" as signal RED, signal SFT becomes "1" (shift operation is carried out), and lower blocks thereof have signal NRM of "1" (normal operation is carried out).

Figure 21:
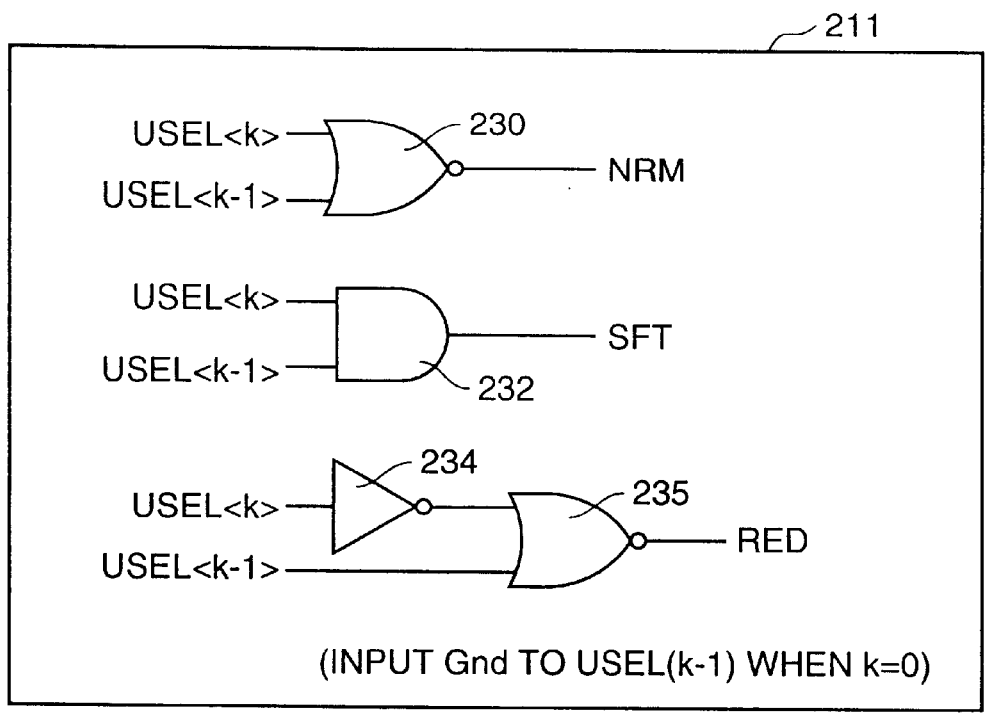
FIG. 21 is a circuit diagram showing an example of a structure of a redundancy mode decode circuit 211.

An example of the structure of redundancy mode decode circuit 211 is shown in FIG. 21. Redundancy mode decode circuit 211 includes NOR circuits 230 and 235, an AND circuit 232, and an inverter 234. NOR circuit 230 receives signals USEL(K) and USEL(k−1) to output signal NRM. AND circuit 232 receives signals USEL(k) and USEL(k−1) to output signal SFT. Inverter 234 inverts signal USEL(k). NOR circuit 235 receives the output of inverter 234 and signal USEL(k−1) to output signal RED. When k is 0, ground voltage Gnd is applied to signal USEL(k−1).

The operation of IO line switch signal generation circuit 212 will be described with reference to FIGS. 22–25. FIGS. 22–24 represent the relationship between the signal input to IO line switch signal generation circuit 212 and output signals DQSEL<3:0>, SDQSEL<3:0>. FIG. 2 corresponds to the n/4 bit mode (bus width is n/4 bits), FIG. 23 corresponds to the n/2 bit mode (bus width is n/2 bits), and FIG. 24 corresponds to the n bit mode (bus width is n bits).

FIG. 25 shows the relationship between the position of the defective data line and signal LSEL<3:0>. Referring to FIG. 25, signal LSEL(k) out of signals LSEL(0)–LSEL(3) becomes "1" when internal data line (i+k) out of internal data lines DB(i)–DB(i+3) belonging to one block is defective.

Referring to FIGS. 22–24, when NMR=1, signals DQSEL(0) DQSEL(3) take values identical to those of signals YSEL(0)–YSEL(3), whereby signals SDQSEL(0)–SDQSEL(3)=0 is established.

When SFT=1, and signal YSEL(0) 1, signal DQSEL(0)=0 is established, and signals DQSEL(1)–DQSEL(3) take values identical to those of signals YSEL(1)–YSEL(3). When SDQSEL(0)=1, SDQSEL(1) SDQSEL(3)=0 is established. When SFT=1 and YSEL(0)=0, signals DQSEL(0)–DQSEL(3) take values identical to those of signals YSEL(0) YSEL(3), and signals SDQSEL(0)–SDQSEL(3)=0 is established.

When RED=1, the values of DQSEL(0)–DQSEL(3) and signals SDQSEL(0)–SDQSEL(3) are determined according to signals YSEL and LSEL.

Figure 26:
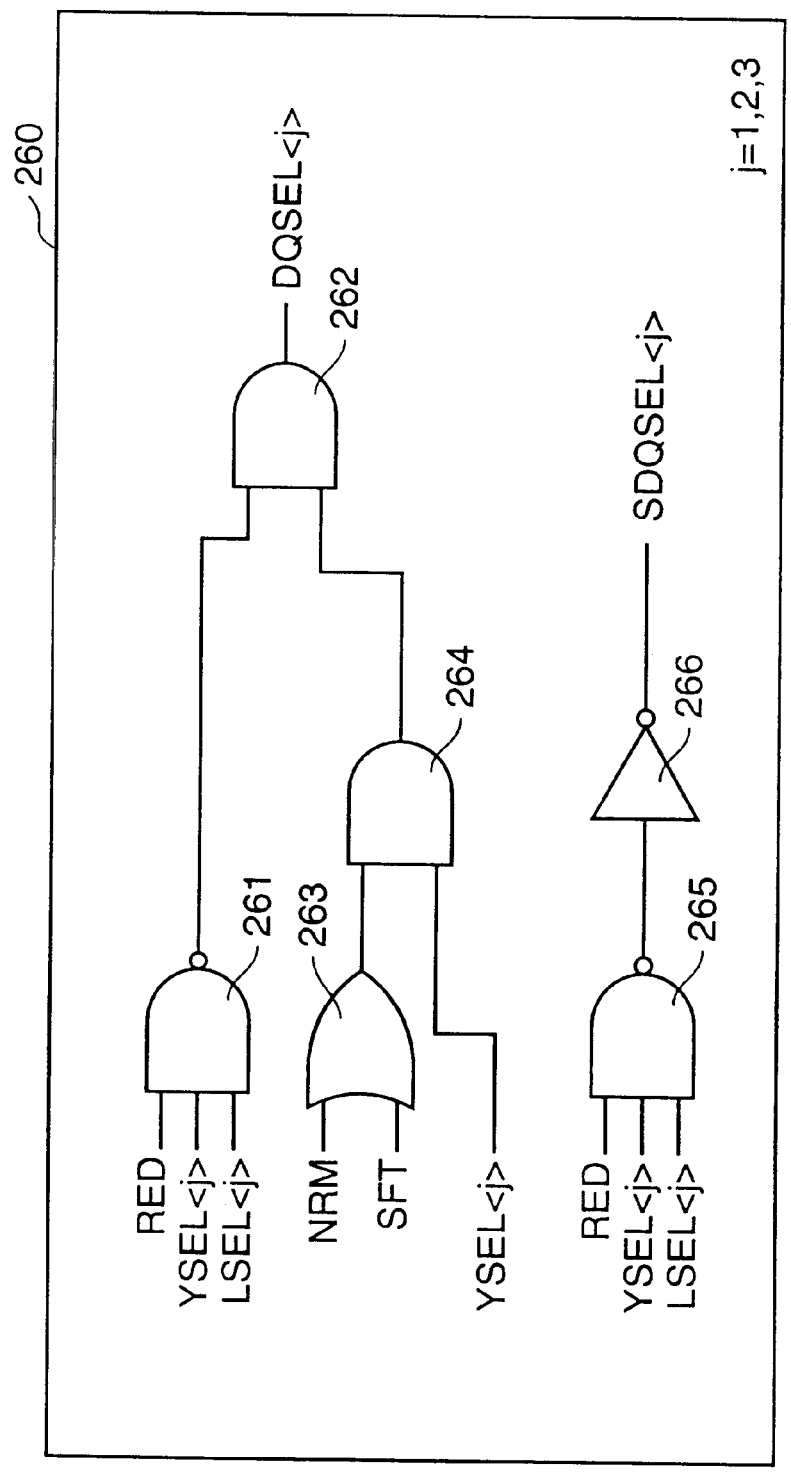
FIG. 26 shows a circuit 260 in IO line switch signal generation circuit 212.
Figure 27:
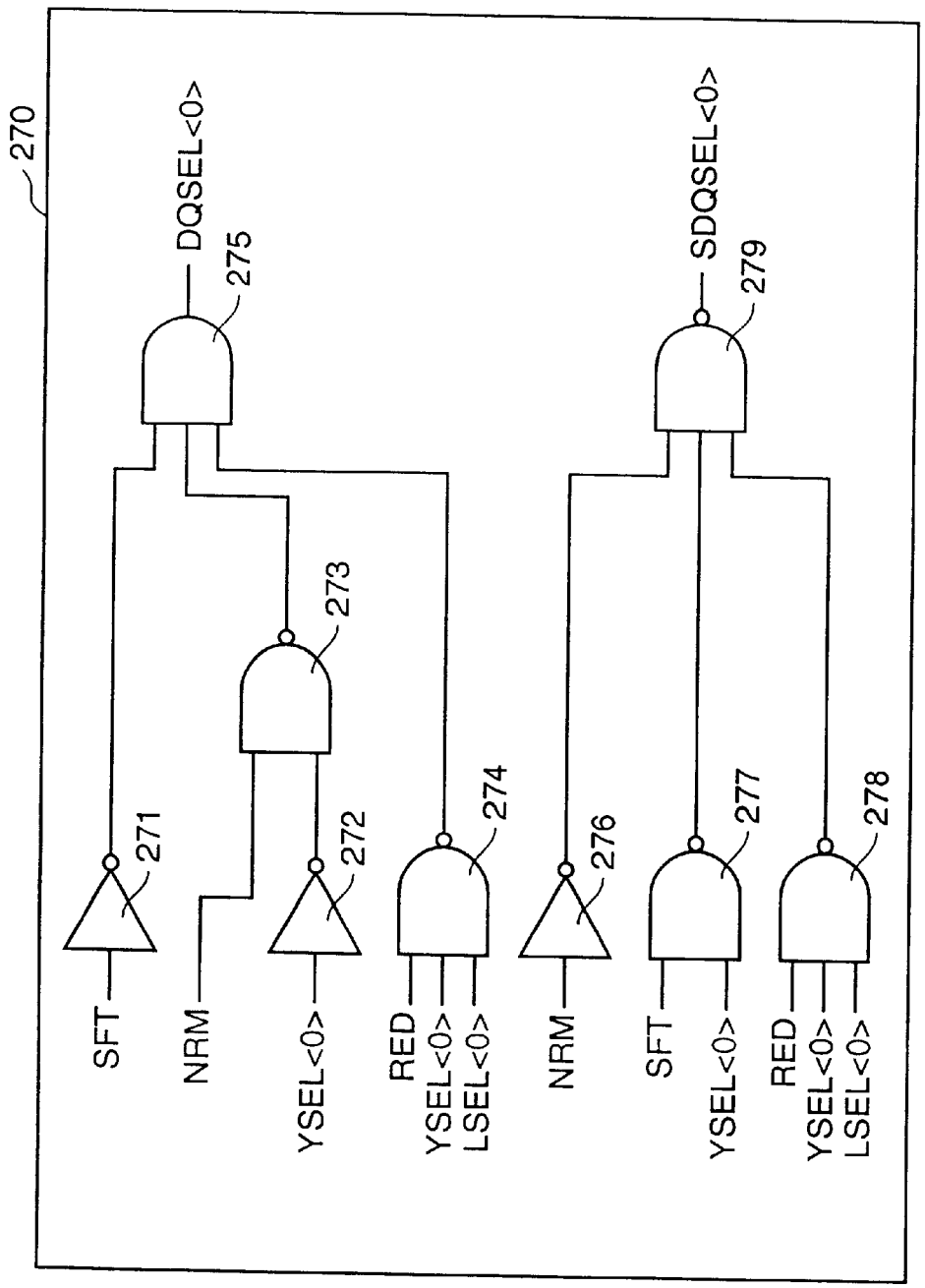
FIG. 27 shows a circuit 270 in IO line switch signal generation circuit 212.

FIGS. 26 and 27 show circuits 260 and 270 in IO line switch signal generation circuit 212. Circuit 260 of FIG. 26 outputs signals DQSEL(j) and SDQSEL(j) (j=1, 2, 3). Circuit 270 of FIG. 27 outputs signals DQSEL(0) and SDQSEL(0).

Circuit 260 includes a NAND circuit 261 receiving signals RED, YSEL(j) and LSEL(j), a NOR circuit 263 receiving signals NRM and SFT, an AND circuit 264 receiving signal YSEL(j) and the output of NOR circuit 263, an AND circuit 262 receiving the outputs of NAND circuit 261 and AND circuit 264 to output signal DQSEL(1), a NAND circuit 265 receiving signals RED, YSEL(j), LSEL(j), and an inverter 266 inverting the output of NAND circuit 265 to output a signal SDQSEL(j).

Circuit 270 includes an inverter 271 receiving and inverting signal SFT, an inverter 272 receiving and inverting signal YSEL(0), a NAND circuit 273 receiving signal NRM and the output of inverter 272, a NAND circuit 274 receiving signals RED, YSEL(0) and LSEL(0), and an AND circuit 275 receiving the outputs of inverter 271, NAND circuit 273 and NAND circuit 274 to output signal DQSEL(0).

Circuit 270 further includes an inverter 276 inverting signal NRM, a NAND circuit 277 receiving signals SFT and YSEL(0), a NAND circuit 278 receiving signals RED, YSEL(0) and LSEL(0), and an AND circuit 279 receiving the outputs of inverter 276, NAND circuit 277 and NAND circuit 278 to output signal SDQSEL(0).

The operation of semiconductor memory device 2000 will be described based on the example where "×8" is specified as the data line configuration. It is assumed that there is a defect in the memory cell corresponding to normal data line LIO(5), and normal data line LIO(5) is to be replaced.

Upon input of an act command ACT, the word line is rendered active according to row address RAD<x:0> that is input at the same time. The data of the memory cell is held in the sense amplifier. Complementary data signals are transmitted to all normal data line pairs LIO, /LIO and redundant data line pair SLIO, /SLIO.

When read command READ is input, the read amplifier is rendered active, and the data is transferred to internal data lines DB and SDB.

In the data line configuration of "×8", the external data lines (data input/output pin) to be used are DQ(0), DQ(4), DQ(8), . . . , DQ(28). In order to determine the eight internal data lines to be used out of the 32 regular internal data lines, signal YSEL<3:0> is generated according to the 2-bit column address CAD(0), CAD(1) input simultaneous to read command READ.

Replacement data line position signals USEL, LSEL are fixed signals, determined before a column operation. The control signal of each IO select circuit is switched according to signals YSEL, USEL, and LSEL, whereby internal data lines DB and SDB are connected with external data line DQ.

The status of the control signal of each 10 select circuit is shown in FIG. 28. Since the data line to be replaced is LIO(5), redundancy replacement is required in IO select circuit Z1. Status signal RED of IO select circuit Z1 becomes "1".

Since internal data line DB(i+1) shown in FIG. 17 is the data line that is to be replaced in IO select circuit Z1, signal DQSEL(1) is fixed to L. Signal SDQSEL(1) indicating the replacement position becomes H only when column address CAD<1:0> ="01", otherwise to L. Signals DQSEL(0), DQSEL(2), and DQSEL(3) have their values determined according to the decode of column address CAD<1:0>. Signals SDQSEL(0), SDQSEL(2), and SDQSEL(3) are fixed at the L level.

A block lower than block 1 (IO select circuit Z1), i.e. IO select circuit Z0, does not have to shift the internal data line. Therefore, the number assigned to internal data line DB and external data line DQ is identical. In IO select circuit Z0, signal NRM is "1". In this block, all signals SDQSEL are fixed to the L level, and one of signals DQSEL is driven to an H level according to CAD<1:0>.

In block 1, an internal data line DB(8) that is shared with block 2 (IO select circuit Z2) is used as the redundant data line. Therefore, block 2 uses internal data line DB(12) shared with the adjacent block. Blocks 3–7 (IO select circuits Z3–Z7) carry out a similar operation. More specifically, connection of the data lines is shifted. In IO select circuits Z2–Z7, status signal SFT is "1".

In the structure of FIG. 17, internal data lines DB(i+4), DB(i+1), DB(i+2), DB(i+3) are sequentially connected to nodes N0–N3, and the usage of internal data line DB(i) is disabled. More specifically, when column address CAD<1:0> ="00", signal SDQSEL(0) attains an H level and signal DQSEL(0) attains an L level. The internal data line shared with the adjacent block is replaced with internal data line DB(i). In other cases, signal DQSEL corresponds to column address CAD, and signal SDQSEL is fixed at an L level.

In a write operation, the data line is switch in a manner similar to that of a readout operation. In IO select unit 204, the input 8-bit write data is converted into 32 bits while the defective data line is replaced with a redundant data line. Then, the write data is written into the memory cell via the sense amplifier.

Fourth Embodiment

A semiconductor memory device according to a fourth embodiment of the present invention will be described hereinafter. The fourth embodiment is directed to a structure in which two defective data lines can be replaced simultaneously with the number of the redundant data line pair as 2 (SLIOA, /SLIOA and SLIOB, /SLIOB). Similar to the third embodiment, the number of normal data line pairs corresponds to 32 (LIO(i), /LIO(i); i=0–31). The data line structure is switchable to ×32, ×16, and ×8. In the ×16, ×8 structure, a data line is selected using the column address.

Figure 29:
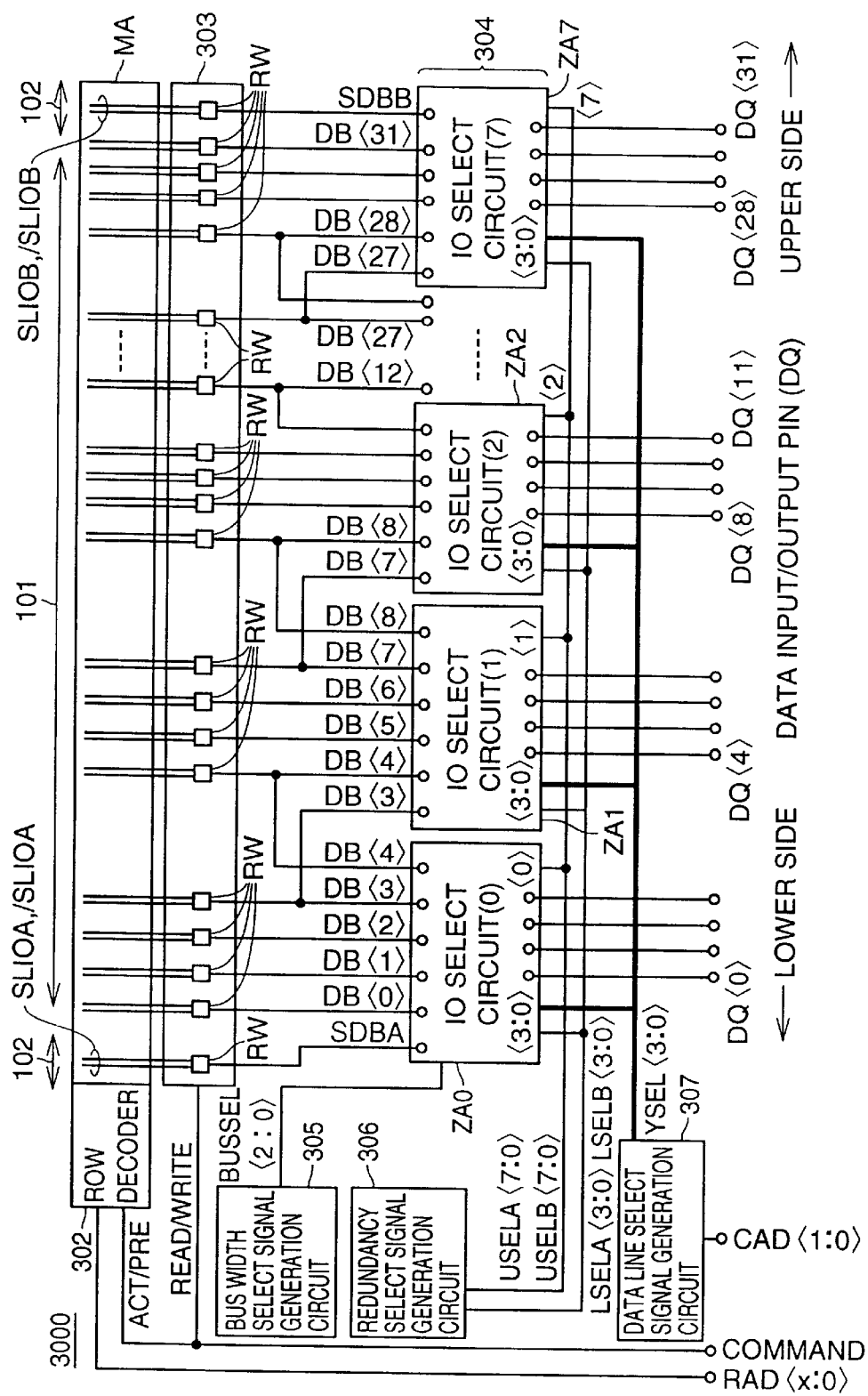
FIG. 29 is a block diagram schematically showing a structure of a semiconductor memory device 3000 according to a fourth embodiment of the present invention.

Referring to FIG. 29, a semiconductor memory device 3000 according to the fourth embodiment includes a memory cell array MA. Memory cell array MA includes a plurality of memory cells arranged in a matrix, a plurality of word lines corresponding to rows, and a plurality of bit lines corresponding to columns. Semiconductor memory device 4000 further includes a normal data line pair 101 connected to a memory cell via a sense amplifier, a redundant data line pair 102, a row decoder 302, and a read amplifier•write driver unit 303. The function of row decoder 302 and read amplifier•write driver unit 303 are similar to those of row decoder 202 and read amplifier•write driver unit 203 shown in FIG. 13. Therefore, detailed description thereof will not be repeated.

Semiconductor memory device 3000 further includes an IO select unit 304 with IO select circuits ZA0–ZA7, a bus width select signal generation circuit 305, a redundancy select signal generation circuit 306 and a data line select signal generation circuit 307.

The data of normal data line pair LIO(i), /LIO(i) and redundant data line pairs SLIOA, /SLIOA and SLIOB, /SLIOB are transmitted to internal data line DB(i) and redundant internal data lines SDBA and SDBB, respectively, via a plurality of read amplifier•write drivers RW in read amplifier•write driver unit 303.

The data of internal data line DB(i) and redundant internal data lines SDBA and SDBB are transmitted to normal data line pair LIO(i), /LIO(i) and redundant data line pairs SLIOA, /SLIOA and SLIOB, /SLIOB, respectively, via read amplifier•write driver unit 303.

IO select unit 304 selects the internal data line to be used according to the bus width (column address) and the presence of redundancy usage. Internal data line DB(i) and redundant internal data lines SDBA and SDBB are also called internal data line DB(i), SDBA and SDBB hereinafter.

IO select unit 304 has a structure differing from that of IO select unit 204 of the third embodiment to replace two defective data lines simultaneously.

In the fourth embodiment, internal data lines DB(0)–DB (31), SDBA, SDBB are divided into 8 blocks. Here, respective internal data lines DB(3), DB(4), DB(7), DB(8), . . . , DB(27), DB(28) are shared by adjacent blocks. Therefore, in the fourth embodiment, every two internal data lines are shared between adjacent blocks.

IO select circuit ZA0 electrically couples the external data line to be used from external data lines DQ(0)–DQ(3) to four internal data lines to be used from internal data lines DB(0)–DB(4) and SDBA. IO select circuit ZAi (block i) electrically couples the external data line to be used from external data lines DQ(4×i)–DQ(4×i+3) to four internal data lines to be used from internal data lines DB(4×i−1)~DB(4× i+4) (i=1–6). IO select circuit ZA7 electrically couples the external data line to be used from external data lines DQ(28)~DQ(31) to four internal data lines to be used from internal data lines DB(27)~DB(31).

Figure 30:
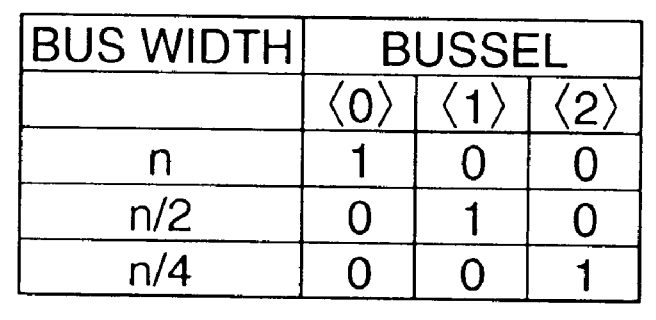

Bus width select signal generation circuit 305 generates a bus width 10 select signal BUSSEL<2:0>(=BUSSEL(2) ~BUSSEL(0)) according to the bus width setting. The relationship between the bus width and the column address and address decode signal YSEL<3:0> is as shown in FIG. 30. When the bus width is n, bus width select signal BUSSEL(2) is 1, and the remaining signals BUSSEL(0) and BUSSEL(1) are 0. Similarly, when the bus width is n/2 and n/4, bus width select signals BUSSEL(1) and BUSSEL(0) are set to 1, and the remaining bus width select signal is set to 0.

The relationship between the bus width and the external data line to be used (data input/output pin) is similar to that of the third embodiment. Therefore, detailed description thereof will not be repeated.

Redundancy select signal generation circuit 306 stores the position of the normal data line that requires redundancy replacement, and generates a decode signal corresponding to the stored content. The relevant decode signal is referred to as replacement data line position signal, and the upper order bit signals are represented as USELA<7:0>(=USELA(0) USELA(7)), USELB<7:0> (=USELB(0)–USELB(7)). Each of signals USELA<7:0> and USELB<7:0> indicate the presence of a defective data line in the unit of an IO select circuit. The specific setting of upper order bit signals USELA<7:0> and USELB<7:0> will be described in detail afterwards.

The lower order bit signals of the replacement data line position signal are represented as LSELA<3:0> (=LSELA(0)–LSELA(3)) and LSELB<3:0> (=LSELB(0)–LSELB(3)). Each of signals LSELA<3:0> and LSELB<3:0> indicate which of the corresponding four data lines in the IO select circuit is defective. The setting of lower order bit signals LSELA<3:0> and LSELB<3:0> are similar to those of lower order bit signal LSEL<3:0> shown in FIG. 25. Therefore, detailed description thereof will not be repeated.

As a result, one defective data line can be indicated by upper order bit signal USELA<7:0> and lower order bit signal LSELA<3:0>. The other one defective data line can be represented by signals USELB<7:0> and LSELB<3:0>. As to the two defective data lines, it is assumed that the defective data line with the smaller index number (i) (that is, the lower side) is represented by signals USELA<7:0> and LSELA<3:0> whereas the other defective data line with the larger index number (i) (that is, the upper side) is represented by signals USELB<7:0> and USELB<7:0>.

In the following, signals USELA<7:0>, USELB<7:0>, LSELA<3:0> and LSELB<3:0> are simply called USELA, USELB, LSELA and LSELB, when generically referred to.

Similar to redundancy select signal generation circuit 206 of FIG. 13, redundancy select signal generation circuit 306 uses a fuse to store the position of the data line that requires replacement. The position information is stored by blowing out (or not blowing out) the fuse in accordance with the relevant position. The configuration of redundancy select signal generation circuit 306 is not limited to a fuse.

Data line select signal generation circuit 307 generates an address decode signal YSEL<3:0> (=YSEL(0)–YSEL(3)) to select a data line according to a column address CAD<1:0> (=CAD(0), CAD(1)).

The relationship among the bus width (n, n/2, n/4), column address CAD<1:0> and address decode signal YSEL<3:0> is as shown in FIG. 14. When in an n bit mode, address decode signals YSEL(0)–YSEL(3) are "1" irrespective of the column address. When in the n/2 bit mode, address decode signals YSEL(0) and YSEL(2) are "1" if column address CAD(0) is "0", and address decode signals YSEL(1) and YSEL(3) are "1" if column address CAD(0) is "1". When in the n/4 bit mode, any one of address decode signals YSEL(0)–YSEL(3) becomes "1" according to the (four) combinations of column addresses CAD(0) and CAD (1).

Figure 31:
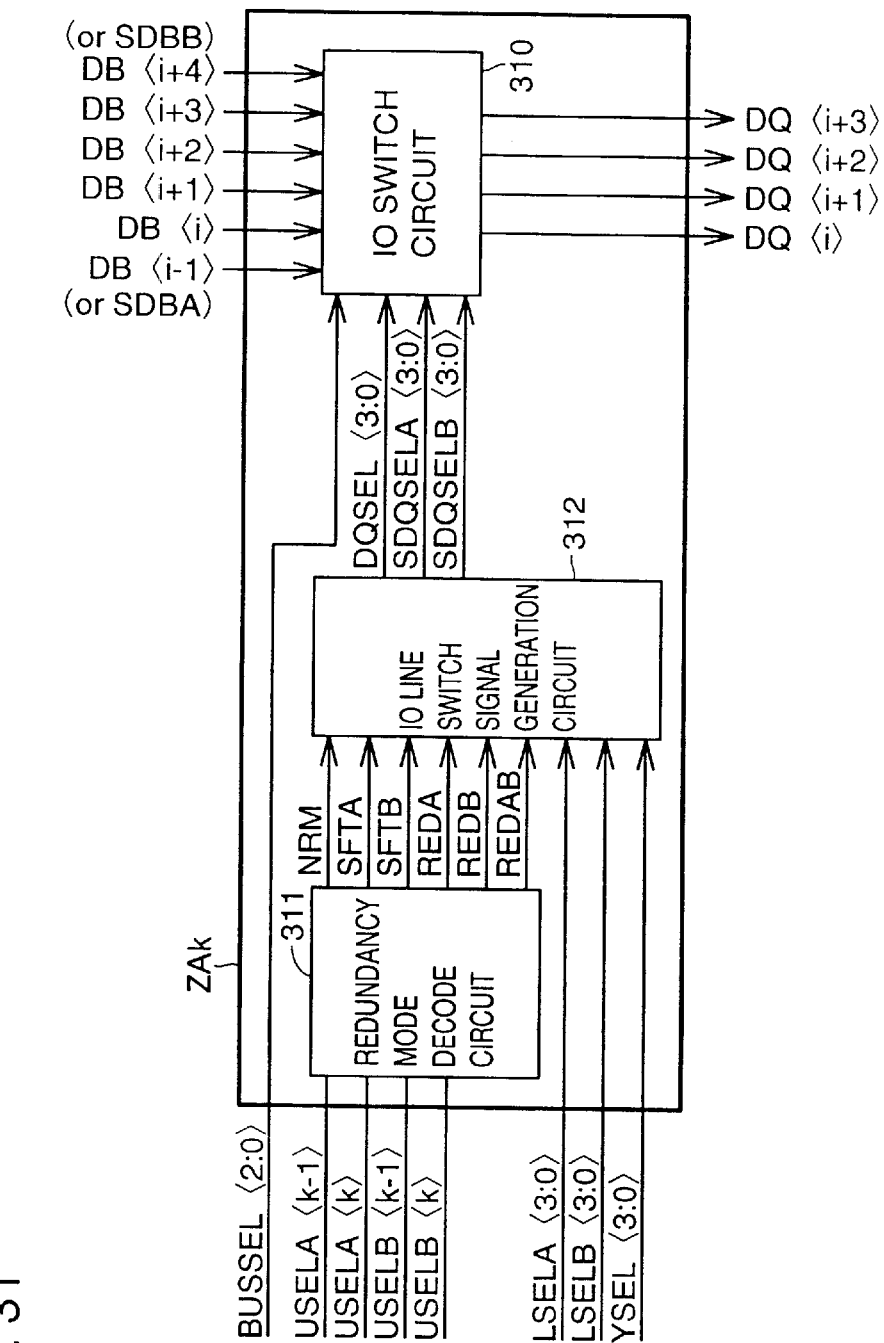
FIG. 31 is a block diagram showing an example of a structure of an select circuit ZAk in IO select unit 304.

An example of the structure of IO select circuit ZAk in IO select unit 304 will be described with reference to FIG. 31. IO select circuit ZAk includes an IO switch circuit 310, a redundancy mode decode circuit 311, and an IO line switch signal generation circuit 312.

IO switch circuit 310 switches the connection between internal data lines DB(i-1) (or SDBA), DB(i), DB(i+1), DB(i+2), DB(i+3) and DB(i+4) (or SDBB) and external data lines DQ(i), DQ(i+1), DQ(i+2) and DQ(i+3).

The switching by IO switch circuit 310 is under control of select signals DQSEL<3:0> (=DQSEL(0)–DQSEL(3)), SDQSEL<3:0> (=SDQSEL(0)–SDQSEL(3), and SDQSELB<3:0> (=SDQSELB(0) SDQSELB(3)) output from IO line switch signal generation circuit 312.

In the following, select signals DQSEL<3:0>, SDQSELA<3:0> and SDQSELB<3:0>, when generically referred to, will be simply called select signals DQSEL, SDQSELA and SDQSELB hereinafter.

Figure 32:
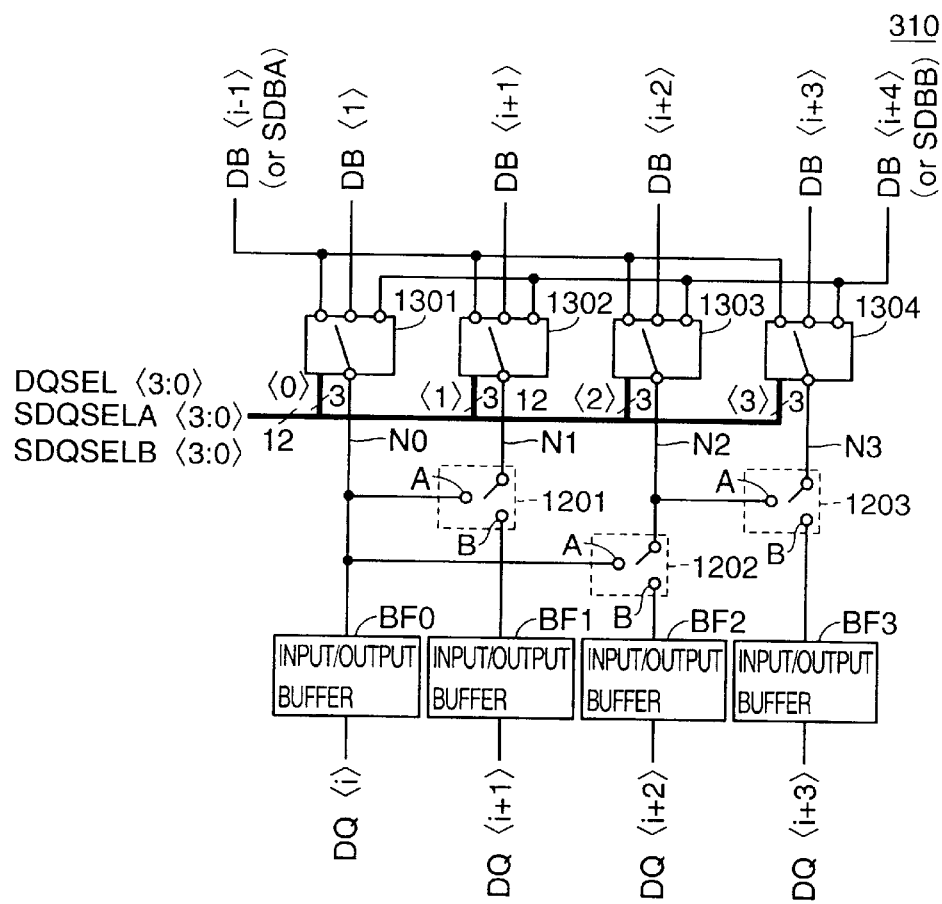
FIG. 32 shows an example of a structure of an IO switch circuit 310.

An example of IO switch circuit 310 is shown in FIG. 32. IO switch circuit 310 includes select circuits 1301–1304, switches 1201–1203, and input/output buffers BF0–BF3 arranged corresponding to external data lines DQ(i) to external data line DQ(i+3).

Select circuits 1301–1304 control the shift operation of the internal data line to replace a defective data line based on select signals DQSEL<3:0>, SDQSELA<3:0> and SDQSELB<3:0>.

Select circuit 1301 operates according to select signals DQSEL(0), SDQSELA(0) and SDQSELB(0). Select circuit 1302 operates based on select signals DQSEL(1), SDQSELA(1) and SDQSELB(1). Similarly, select circuit 1303 operates based on select signals DQSEL(2), SDQSELA(2) and SDQSELB(2). Select circuit 1304 operates based on select signals DQSEL(3), SDQSELA(3) and SD QSELB(3).

When any one of select signals DQSEL, SDQSELA and SDQSELB is set to "1" in each select circuit, the remaining two is set to "0". The setting of select signal DQSEL to "1" implies that a corresponding internal data line in the same block is to be used. In the case where a shift operation or a replacement operation is to be executed, select signal SDQSELA or SDQSELB is set to "1", and the internal data line in the adjacent block of the upper or lower side is used.

Figure 33:
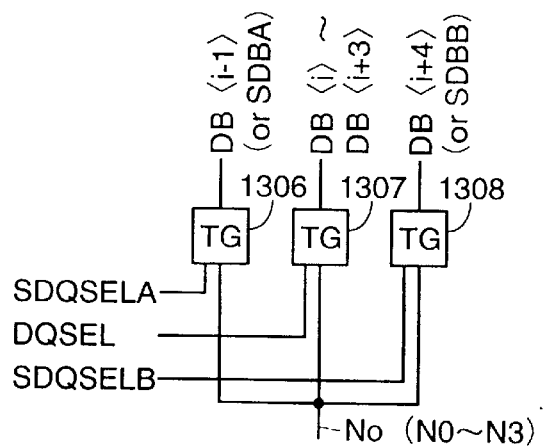
FIG. 33 shows an example of a structure of each of select circuits 1301–1304 in IO switch circuit 310.

Referring to FIG. 33, each of select circuits 1301–1304 includes a transfer gate 1306 provided between an output node No and an internal data line DB(i-1) (or SDBA), a transfer gate 1307 provided between output node No and a corresponding one of internal data lines DB(i)–DB(i+3), and a transfer gate 1308 provided between output node No and internal data line DB(i+4) (or SDBB). Output node No corresponds to nodes N0 N3 in select circuits 1301–1304, respectively.

The structure of transfer gates 1306–1308 is similar to that shown in FIG. 18. Therefore, when corresponding select signal SDQSELA is set to an H level ("1"), transfer gate 1306 electrically couples internal data line DB(i−1) to output node No. Similarly, when corresponding select signal DQSEL is set to an H level ("1"), transfer gate 1307 electrically couples one of internal data lines DB(i−1) to DB(i+3) to output node NO. When corresponding select signal SDQSELB is set to an H level ("1"), transfer gate 1308 electrically couples internal data line DB(i−1) to output node No.

Switches 1201–1203 switches the bus interconnection according to the bus width. The operation of switches 1201–1203 is similar to that described in the second embodiment with reference to FIG. 19. Therefore, detailed description will not be repeated. For example, the connection of switches 1201–1203 is to be switched according to bus width select signal BUSSEL<2:0> indicating the bus width.

As a result, nodes N0–N3 are disconnected from each other when in an n bit mode, similar to the second embodiment. When in the n/2 bit mode, nodes N0 and N1 are connected. Also, nodes N2 and N3 are connected. When in the n/4 bit mode, node N0 is connected to all nodes N1, N2 and N3. The switching through switches 1201–1203 may be effected electrically using a transistor, or using metal wiring.

Referring to FIG. 31 again, redundancy mode decode circuit 311 generates status signals (NRM, SFTA, SFTB, REDA, REDB, REDAB) using upper order bit signals (USELA, USELB) of the replacement data line position signal. These signals indicate that the corresponding IO switch circuit 310 corresponds to any of the six status set forth below.

(1) The connection relationship does not change (status signal NRM:
(2) Shifting is effected using an internal data line in an adjacent (lower) block (status signal SFTA: "1").
(3) Shifting is effected using an internal data line in an adjacent (upper) block (status signal SFTB: "1").
(4) Includes a defective data line indicated by signal USELA, and the defective data line is replaced (status signal REDA: "1").
(5) Includes a defective data line indicated by signal USELB, and the defective data line is replaced (status signal REDB: "1").
(6) Includes two defective data lines, and replacement of the defective data lines is effected (status signal REDAB: "1").

Thus, each block (10 select circuit) can take the status of 6 types, i.e., the three cases of the case where there is no defect, the case where shifting is effected although there is no defect, and the case where there is a defect and replacement is to be effected, according to the position of two defective data lines.

FIGS. 34A and 34B show the relationship between each of signals USELA<7:0> and USELB<7:0> and the status decode intermediate signal of each block.

Referring to FIG. 34A corresponding to the case where the defective data line is indicated by signal USELB<7:0>, signals USELA(0)–USELA(K) are set to "1" and the other signals are set to "0" when the defective data line is present in block k (when the defective data line is any one of the corresponding four data lines in IO select circuit ZAk). When there is no defect, all the bits of signal USELA<7:0> are "0".

According to signal USELA<7:0>, one of the corresponding status data intermediate signals NRM1, RED1 and SFT1 is set to "1" for every block.

More specifically, when the defective data block indicated by signal USELA<7:0> is present in block k, signal RED 1 of block k becomes "1" (perform replacement operation). At each block located upper than the block with signal RED1 "1", signal SFT1 becomes "1" (perform shift operation). At each of the lower side blocks, signal NRM1 becomes "1" perform normal operation).

Similarly, referring to FIG. 34B corresponding to the defective data line indicated by signal USELB<7:0>, signals USELB(K)–USELB(7) become "1" and the other signals become "0" when the defective data line is present in block k. When there is no defect, all the bits of signal USELB<7:0> become "0".

According to signal USELB<7:0>, one of corresponding status decode intermediate signals NRM2, RED2, and SFT2 becomes "1" for each block. When the defective data line indicated by signal USELB<7:0> is present in block k, signal RED2 of block k becomes "1" (perform replacement operation). At each block located lower than the block with signal RED2 "1", signal SFT2 becomes "1" (perform shift operation). At each of the upper side blocks, signal NRM2 becomes "1" (perform general operation).

FIG. 35 shows the correspondence between these status decode intermediate signals and the above-described six status signals.

Signals USELA<7:0> and USELB<7:0> are respectively in correspondence with the lower side and the upper side of the two defective data lines. Therefore, as to the status decode intermediate signals, the case of SFT1=SFT2="1", the case of SFT1=RED2="1" and the case of RED1=SFT2= "1" will not occur, as shown in FIG. 35.

Therefore, redundancy mode decode circuit 311 sets any of status signals NRM, SFTA, SFTB, REDA, REDB and REDAB to "1" according to the decoded result of signals USELA<7:0> and USELB<7:0> that indicate the two defective data lines in each block.

FIGS. 36A–36C show an example of the decode result of the status signal of each block when there is a defective data line in block 2 and 6.

Referring to FIGS. 36A and 36B, the defective data lines present in blocks 2 and 6 are indicated by signals USELA<7:0> and USELB<7:0>. Therefore, signals USELA(0)–USELA(2) become "1", and signals USELA(3)–USELA(7) become "0". Signals USELB(0)–USELB(5) become "0", and signals USELB(6) and USELB(7) become "1".

According to the relationship shown in FIGS. 34A and 34B corresponding to signals USELA<7:0> and USELB<7:0>, status decode intermediate signals SFT1, RED1, NRM1, SFT2, RED2 and NRM2 in each block are set.

Status signals NRM, SFTA, SFTB, REDA, REDB and REDAB in each block are set as shown in FIG. 36C according to these status decode intermediate signals.

Referring to FIG. 36C, status signals REDA and REDB in each block with a defective data line (called "defective block" hereinafter) are set to "1", whereby a replacement operation is executed at the appropriate block.

At blocks 0 and 1 located at the lower side of defective block 2, a shifting operation using the data of the adjacent (lower side) block is required to replace the defective data line (in block 2). Therefore, status signal SFTA is set to "1".

Similarly, at block 7 located at the upper side of defective block 6, a shifting operation using the data of the adjacent (upper side) block is required to replace the defective data line (in block 6). Therefore, status signal SFTB is set to "1".

At blocks 3, 4 and 5 located between the defective blocks, status signal NRM is set to "1" since neither a shift operation nor a replacement operation is to be executed.

Redundancy mode decode circuit 311 can be formed in a hardware manner or in a software manner using a combination of logical operations so as to obtain the decode result shown in FIGS. 34 and 35.

Figure 37:
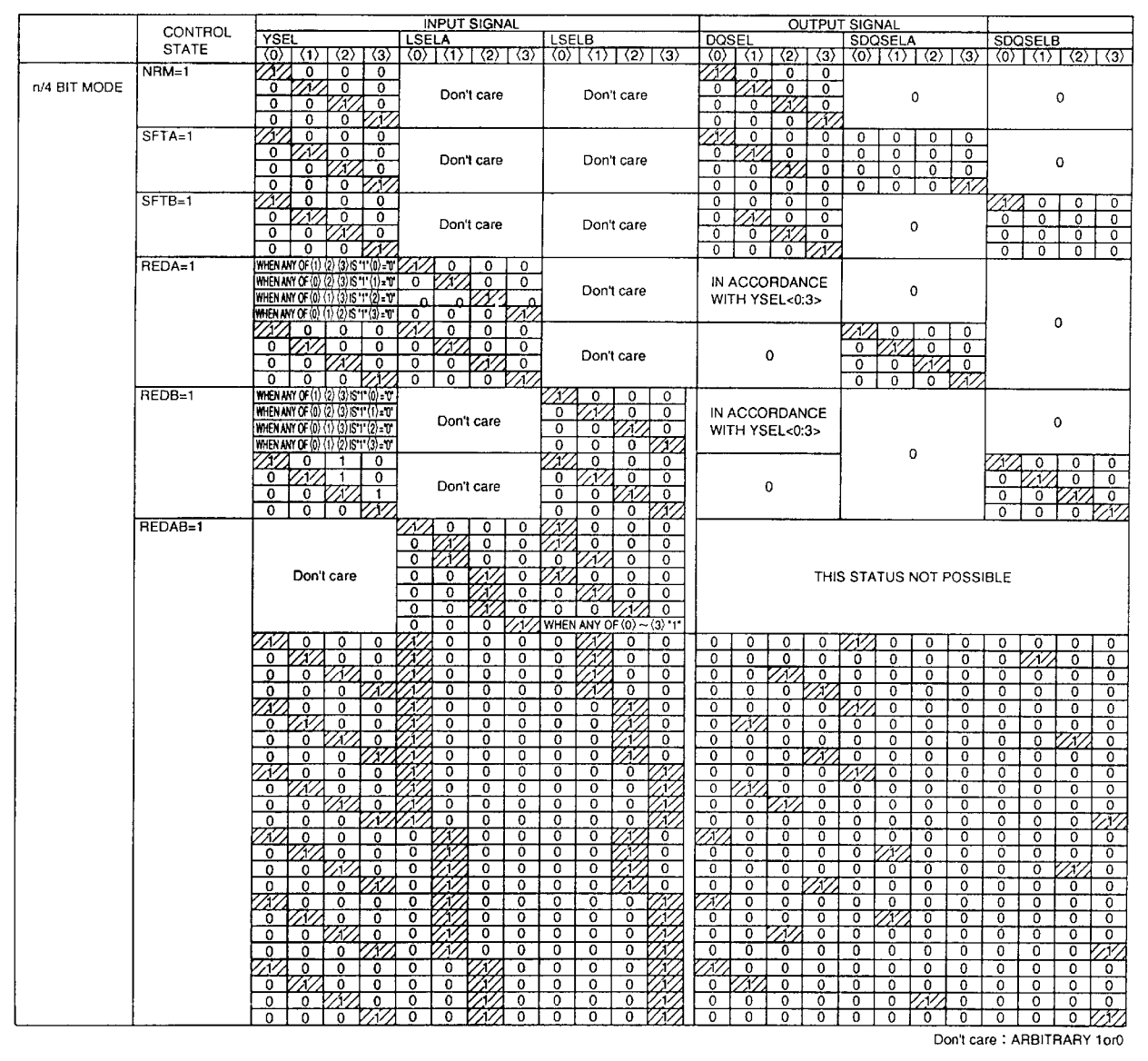
Figure 38:
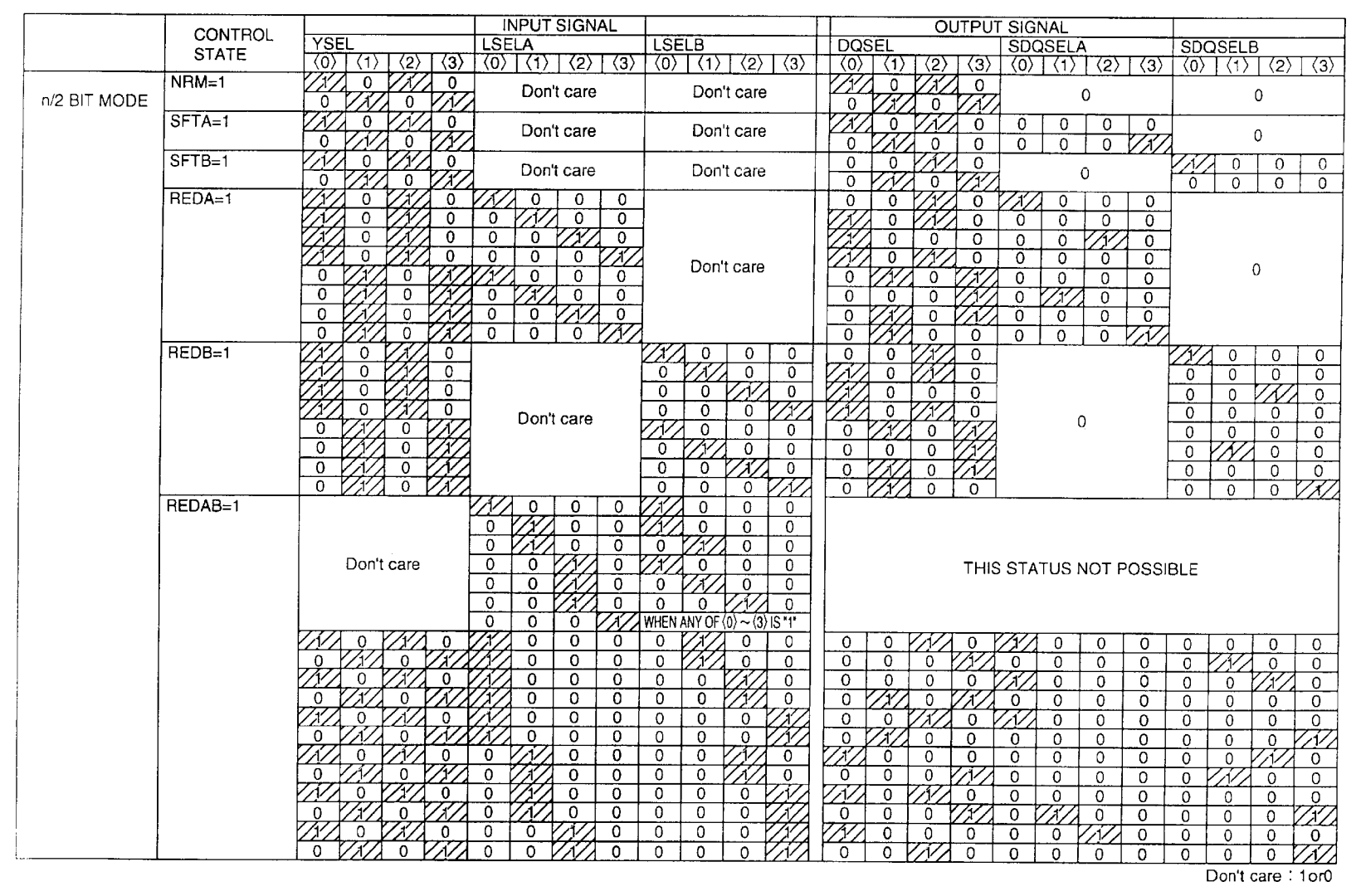
Figure 39:
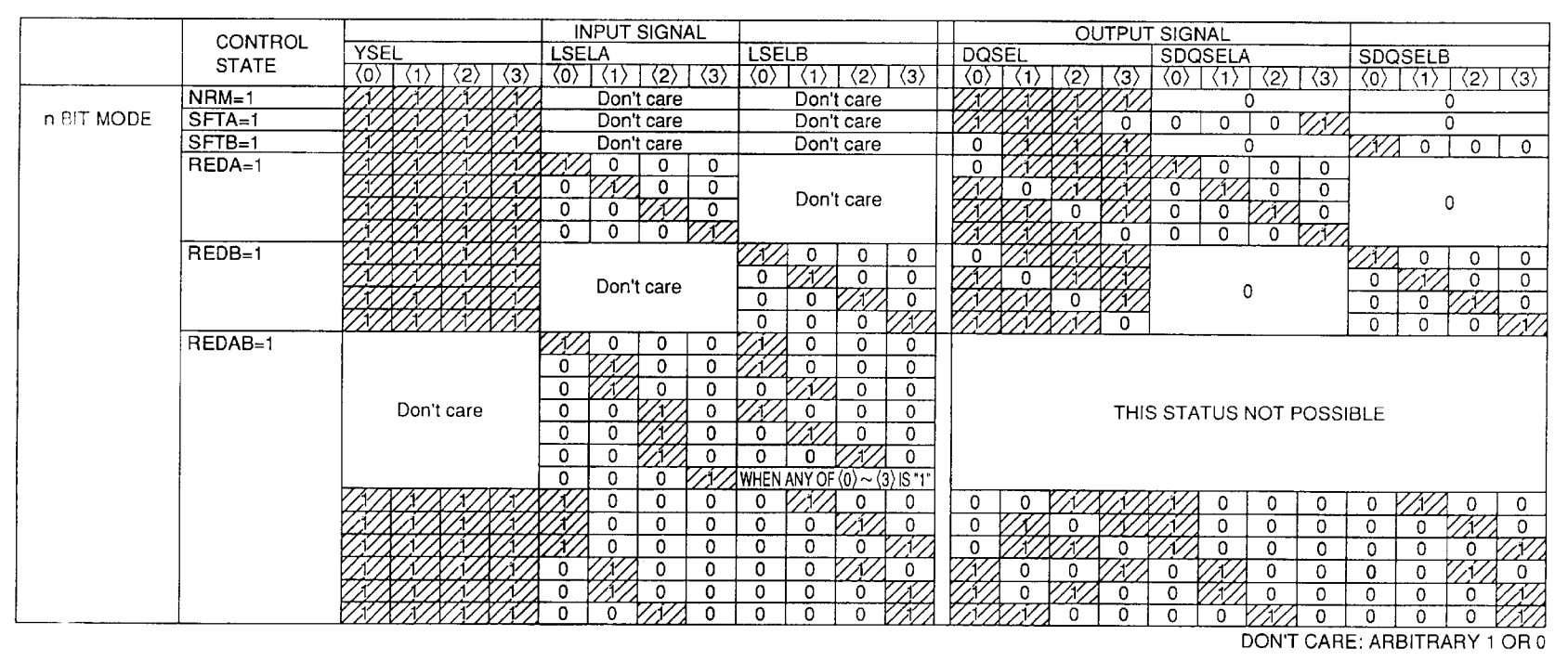

The operation of IO line switch signal generation circuit 312 will be described with reference to FIGS. 37–40. FIGS. 37–39 show the relationship between the input signal to IO line switch signal generation circuit 312 and output signals DQSEL<3:0>, SDQSELA<3:0> and SDQSELB<3:0>.

FIGS. 37, 38 and 39 correspond to the n/4 bit mode, the n/2 bit mode, and the n bit mode, respectively.

Referring to FIGS. 37–39, when NMR=1, signals DQSEL(0) DQSEL(3) take values identical to those of signals YSEL(0)–YSEL(3), and signals SDQSELA(0)–SDQSELA(3), SDQSELB(0)–SDQSELB(3)=0.

Consider the case of SFTA=1. When signal YSEL(3)=1, signal SDQSELA(3)=1. Signals DQSEL(0)–DQSEL(2) take values identical to those of signals YSEL(0)–YSEL(2), and DQSEL(3)=0. Also, signals SDQSELA(0)–SDQSELA(2), SDQSELB(0)–SDQSELB(3)=0 are established. When YSEL(3)=0, signals DQSEL(0)–DQSEL(3) take values identical to those of signals YSEL(0)–YSEL(3). Signals SDQSELA(0) SDQSELA(3), SDQSELB(0)–SDQSELB(3)=0 is established.

Consider the case of SFTB=1. When signal YSEL(0)=1, signal SDQSELB(0)=1. Signals DQSEL(1)–DQSEL(3) take values identical to those of YSEL(1)–YSEL(3), and DQSEL(0)=0. Also, signals SDQSELB(1)–SDQSELB(3), SDQSELA(0)–SDQSELA(3)=0 are established. When YSEL(0)=0, signals DQSEL(1)–DQSEL(3) take values identical to those of signals YSEL(0)–YSEL(3). Signals SDQSELA(0)–SDQSELA(3), SDQSELB(0)–SDQSELB(3)=0 are established.

Consider the case of REDA=1. The values of signals DQSEL(0)–DQSEL(3) and SDQSELA(0)–SDQSELA(3) are determined according to signals YSEL and LSELA. Also, signals SDQSELB(0)–SDQSELB(3)=0 are established.

When LSELA(j)=1 corresponding to the data line selected by YSEL(j)=1 (j=0–3), signals DQSEL(j)=0, SDQSELA(j)=1 and SDQSELB(j)=0 are established. When LSELA(j)=0, signals DQSEL(j)=1, SDQSELA(j)=0 are established.

In contrast, DQSEL(k)=SDQSELA(k)=0 is established corresponding to the data line corresponding to YSEL(k)=0 (k: 0–3).

Consider the case of REDB=1. The values of DQSEL(0)–DQSEL(3) and signals SDQSELB(0)–SDQSELB(3) are determined according to signals YSEL and LSELB. Also, signals SDQSELA(0)–SDQSELA(3)=0 are established.

When LSELB(j)=1 corresponding to the data line selected by YSEL(j)=1 (j=0–3), signals DQSEL(j)=0, SDQSELB(j)=1 and SDQSELA(j)=0 are established. When LSELB(j)=0, DQSEL(j)=1, SDQSELB(j)=0 are established.

In contrast, DQSEL(k)=SDQSELB(k)=0 is established corresponding to the data line for YSEL(k) (k: 0–3).

Consider the case of REDAB=1. The values of SDQSELA(0)–SDQSELA(3) are determined according to signals YSEL and LSELA. The values of SDQSELB(0)–SDQSELB(3) are determined according to signals YSEL and LSELB. It is to be noted that SDQSELA(3)=0.

More specifically, when LSELA(j)=1 corresponding to the data line selected by YSEL(j)=1 (j=0–2), DQSEL(j)=0, SDQSELA(j)=1 are established. Also, when LSELB(i)=1 corresponding to the data line selected by YSEL(i)=1 (i=0–3), DQSEL(i)=0, SDQSELB(i)=1 are established.

When LSELA(i)=LSELB(i)=0 corresponding to the data line selected by YSEL(i)=1, DQSEL(i)=1 and SDQSELA(i)=SDQSELB(i)=0 are established.

Also, DQSEL(k)=SDQSELA(k)=SDQSELB(K)=0 corresponding to the data line of YSEL(K)=0 (k: 0–3).

Since signals LSELA(j) and LSELB(i) are set in correspondence to each of the lower side and upper side of two defective data lines, the status of LSELA(j)=LSELB(i)=1 will not occur in the range of i≦j.

IO line switch signal generation circuit 312 can be configured in a hardware manner or in a software manner using a combination of logical operations so as to obtain output signals DQSEL<3:0>, SDQSELA<3:0> and SDQSELB<3:0>, as shown in FIGS. 37–39.

An operation of semiconductor memory device 3000 in the case where "×8", i.e., the n/4 bit mode, is specified as the data line configuration. It is assumed that memory cells corresponding to normal data lines LIO(9) and LIO(26) have defects, and normal data lines LIO(9) and LIO(26) are subject to replacement.

Figure 40:
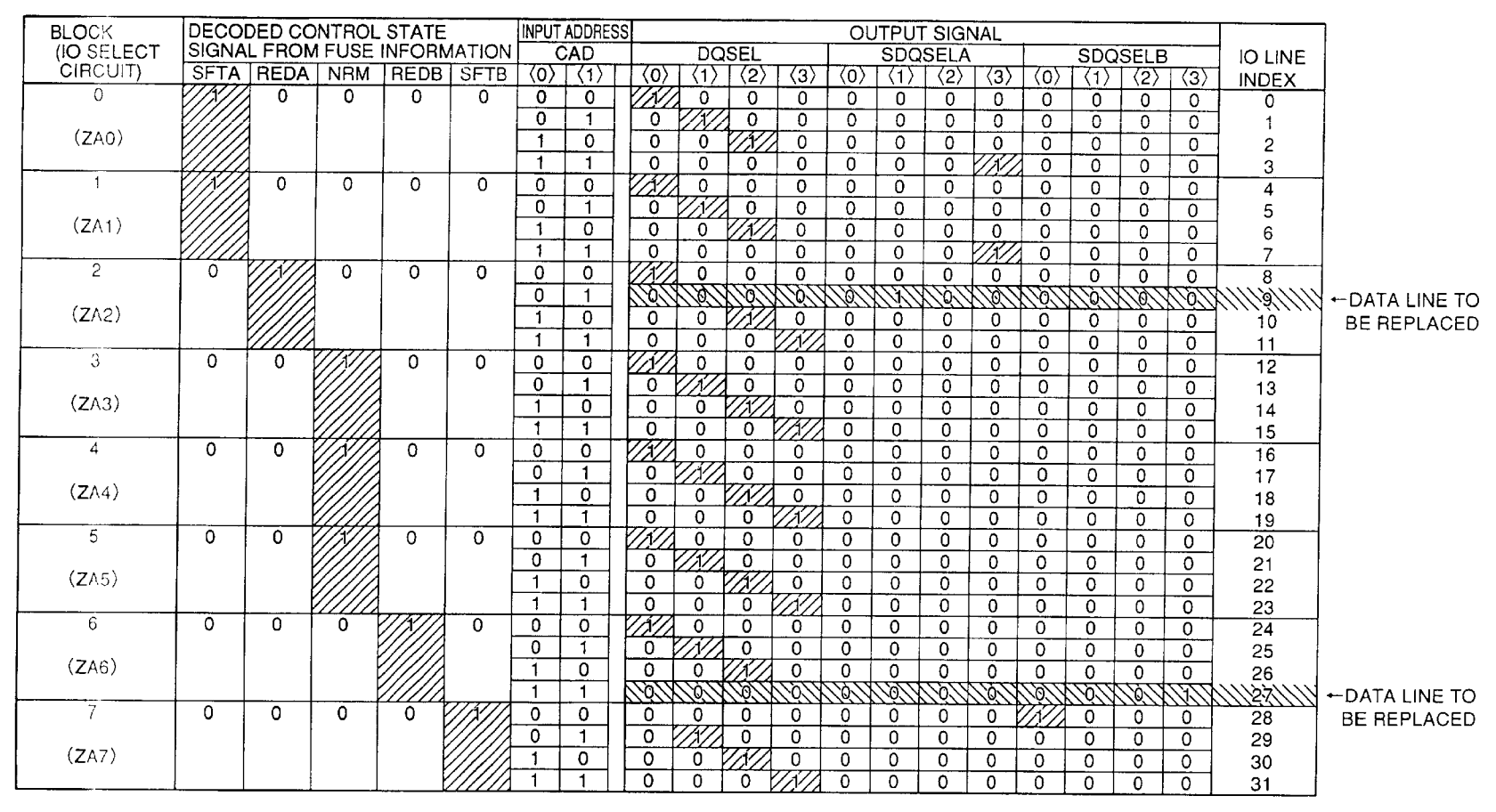

The status of the control signal of each IO select circuit is shown in FIG. 40. Since the defective data line, i.e. the normal data line to be subject to replacement, is present in blocks 2 and 6, the values of status signals SFTA, REDA, NRM, REDB, SFTB in each block are similar to those shown in FIG. 36C.

At blocks 0 and 1 corresponding to status signal SFTA="1", i.e. at IO select circuits ZA0 and ZA1, shifting is executed using the data line from the lower side. More specifically, since internal data line DB(i+3) shown in FIG. 32 is replaced with the data line shifted from the lower side, signal DQSEL(3)is fixed to "0". Only when column address CAD<1:0> ="11" does signal SDQSELA(3) indicating the replacement destination become "1". In other cases, signal SDQSELA(3) becomes "0". Signals DQSEL(0), DQSEL(1) and DQSEL(2) have their values determined according to the decoding of column address CAD<1:0>. Signals SDQSELA(0), SDQSELA(1), SDQSELA(2), SDQSELB(0)–SDQSELB(3) are fixed to "0".

In block 2 corresponding to status signal REDA="1", i.e. in IO select circuit ZA2, internal data line DB(i+1) shown in FIG. 32 is the data line that is to be replaced. Therefore, signal DQSEL(1) is fixed to "0". Only when column address CAD<1:0> ="01" does signal SDQSELA(1) indicating the replacement destination become "1". In other cases, signal SDQSELA(1) becomes "0". Signals DQSEL(0), DQSEL(2), and DQSEL(3) have their values determined according to the decoding of column address CAD<1:0>. Signals SDQSELA(0), SDQSELA(2), SDQSELA(3), and SDQSELB(0) SDQSELB(3) have their values fixed to 0.

In block 6 corresponding to status signal REDB="1", i.e. at IO select circuit ZA6, internal data line DB(i+3) indicated in FIG. 32 is the data line to be replaced. Therefore, signal DQSEL(3) is fixed to "0". Only when column address CAD<1:0> ="11" does signal SDQSELB(3) indicating the replacement destination become "1". In other cases, signal SDQSELB(3) becomes "0". Signals DQSEL(0), DQSEL(1) and DQSEL(2) have their values decoded according to column address CAD<1:0>. Signals SDQSELA(0)–SDQSELA(3) and SDQSELB(0)–SDQSELB(2) are fixed to "0".

In blocks 3–5 corresponding to status signal NRM="1", i.e. in IO select circuits ZA3–ZA5, the internal data line does not have to be shifted. Therefore, the numbers assigned to internal data line DB and external data line DQ are identical. In these blocks, signals SDQSELA and SDQSLB are all fixed to "0". One in signal DQSEL becomes "1" according to CAD<1:0>.

In block 7 corresponding to status signal SFTB with a "1", i.e. IO select circuit ZA7, shifting is executed using the data line from the upper side. More specifically, signal DQSEL(0) is fixed to "0" since internal data line DB(i) indicated in FIG. 32 is to be replaced with redundant internal data line SDBB. Only when column address CAD<1:0> ="00" does signal SDQSELB(0) indicating the replacement destination become "1". In other cases, signal SDQSELB(0) becomes "0". Signals DQSEL(1)–DQSEL(3) have their values determined according to the decoding of column address CAD<1:0>. Signals SDQSELA(0)–SDQSELA(3), and SDQSELB(1)–SDQSELB(3) are fixed to "0".

As a result, internal data line DB(9) which is the defective data line is set unused in block 2 (IO select circuit ZA2). Internal data line DB(7) shared by block 1 (IO select circuit ZA1) of the lower side is used as the redundant data line. In other words, external data line DQ(9) is connected to internal data line DB(7).

Accordingly, in blocks 0 and B1 (IO select circuits ZA0 and ZA1) of the lower side have redundant internal data lines SDBA and DB(3) used as the redundant data lines corresponding to internal data lines DB(3) and DB(7), respectively.

Similarly, internal data line DB(27) which is the defective data line is set unused in block 6 (IO select circuit ZA6). Internal data line DB(28) shared by block 7 (IO select circuit ZA7) of the upper side is used as the redundant data line. In other words, external data line DQ(27) is connected to internal data line DB(28).

Accordingly, block 7 (IO select circuit ZA7) of the upper side has redundant internal data line SDBB used as the redundant data line corresponding to internal data line DB(28).

The operation of semiconductor memory device 3000 in a read mode and a write mode is similar to that of semiconductor memory device 2000 of the third embodiment except for the connection between internal data lines DB, SDBA and SDBB in IO select circuits ZA0–ZA7 and external data line DQ. Therefore, detailed description will not be repeated.

In a semiconductor memory device of a multidata line structure and that can have the bus width switched by combining a shift redundancy scheme on a block-by-block basis, sharing the data line select circuit and the redundancy replacement circuit according to the structure of the fourth embodiment, data can be transferred at high speed. Also, the redundancy efficiency can be improved since two defective data lines can be replaced simultaneously.

The setting of a test mode to perform an operation test on the semiconductor memory device of the fourth embodiment will be described hereinafter as modifications of the fourth embodiment.

[Modification 1 of the Fourth Embodiment]

In the first modification of the fourth embodiment, the structure of each IO select circuit in IO select unit 304 of FIG. 29 differs from that of the fourth embodiment.

Figure 41:
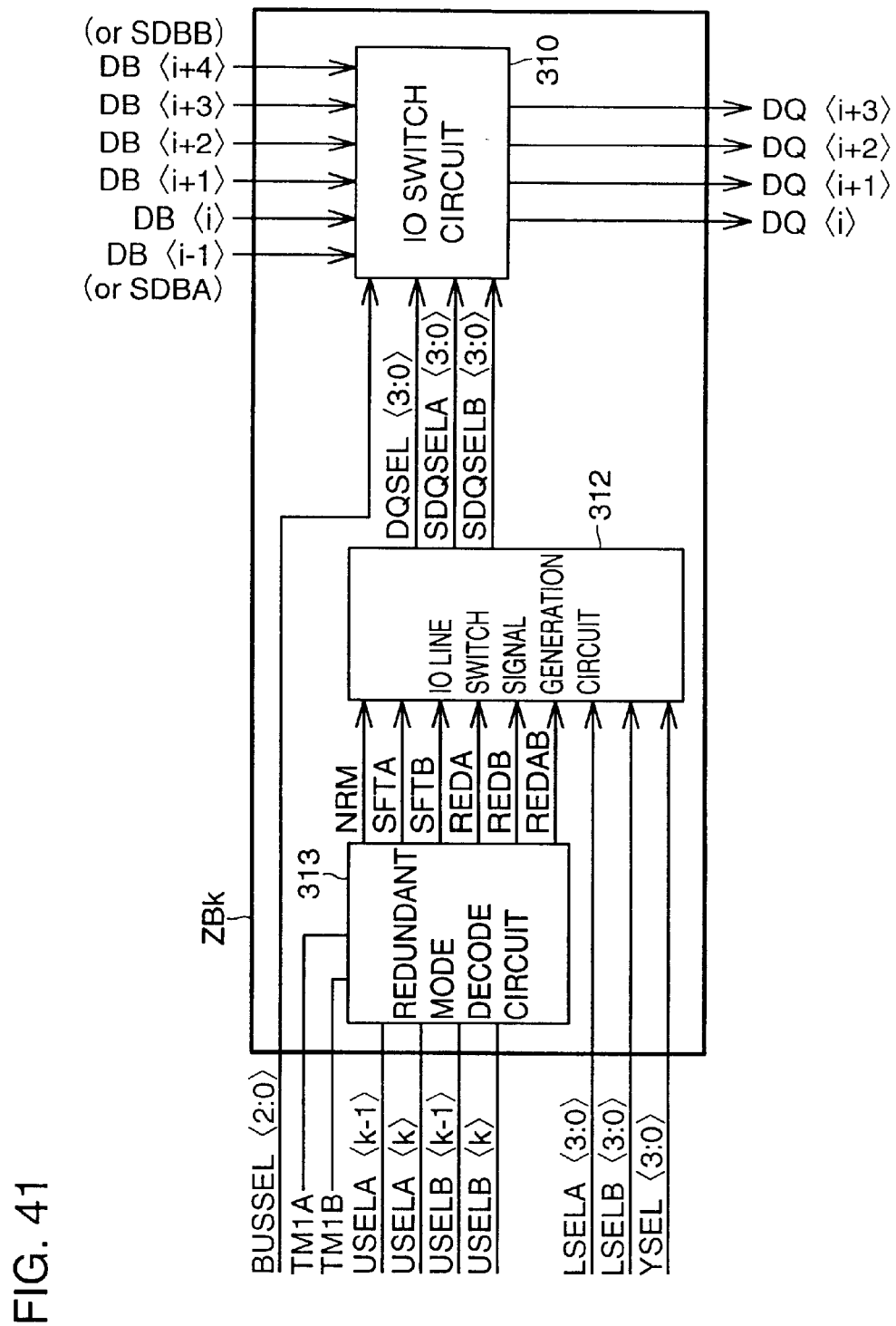
FIG. 41 is a block diagram showing an example of structure of an IO select circuit ZBk according to a first modification of the fourth embodiment.

An example of the structure of an IO select circuit ZBk (k: 0–7) according to the first modification of the fourth embodiment will be described with reference to FIG. 41.

In comparison to IO select circuit ZAk of the fourth embodiment, IO select circuit ZBk differs in that a redundancy mode decode circuit 313 is included instead of redundancy mode decode circuit 311. The remaining structure of IO select circuit ZBk is similar to that of IO select circuit ZAk. Therefore, detailed description will not be repeated.

Redundancy mode decode circuit 313 differs from redundancy mode decode circuit 311 in further receiving test mode signals TM1A and TM1B.

When both of test mode signals TM1A and TM1B are set to "L", redundancy mode decode circuit 313 generates status signals (NRM, SFTA, SFTB, REDA, REDB, REDAB) of a corresponding block, similar to redundancy mode decode circuit 311.

Referring to FIG. 42, when an operation test is to be executed with test mode signal TM1A or TM1B set to "H" in a test mode, LSELA(0)=LSELB(0)="1" are set. Simultaneously, LSELA(1)–LSELA(3)=LSELB(L)–LSELB(3)="0" are set. It is assumed that both of test mode signals TM1A and TM1B will not be set to "H".

Referring to FIG. 43A, redundancy mode decode circuit 313 has status signal SFTA set to "1" in each block when test mode signal TM1A is set to "H". Therefore, each IO select circuit carries out a shift operation using an internal data line of an adjacent (lower) block.

Referring to FIG. 43B, redundancy mode decode circuit 313 has status signal SFTB set to "1" in each mode when test mode signal TM1B is set to "H". Therefore, each IO select circuit carries out a shift operation using an internal line of an adjacent (upper) block.

The structure and operation of the components other than those of the IO select circuit are similar to those of the fourth embodiment. Therefore, detailed description will not be repeated.

Redundancy mode decode circuit 313 can be configured in a hardware manner or in a software manner using a combination of logical operations so that a decode result as shown in FIGS. 34, 35 and 43 is obtained.

According to the structure of the first modification of the fourth embodiment, a shift operation is executed in all blocks when test mode signal TM1A or TM1B is set to "H". Confirmation is made as to whether the output of the external data line is switched appropriately in response. Thus, a test mode confirming the data line switch function in each IO select circuit can be set.

[Modification 2 of the Fourth Embodiment]

In the second modification of the fourth embodiment, the structure of each IO select circuit included in IO select unit 314 of FIG. 29 differs from that of the fourth embodiment.

Figure 44:
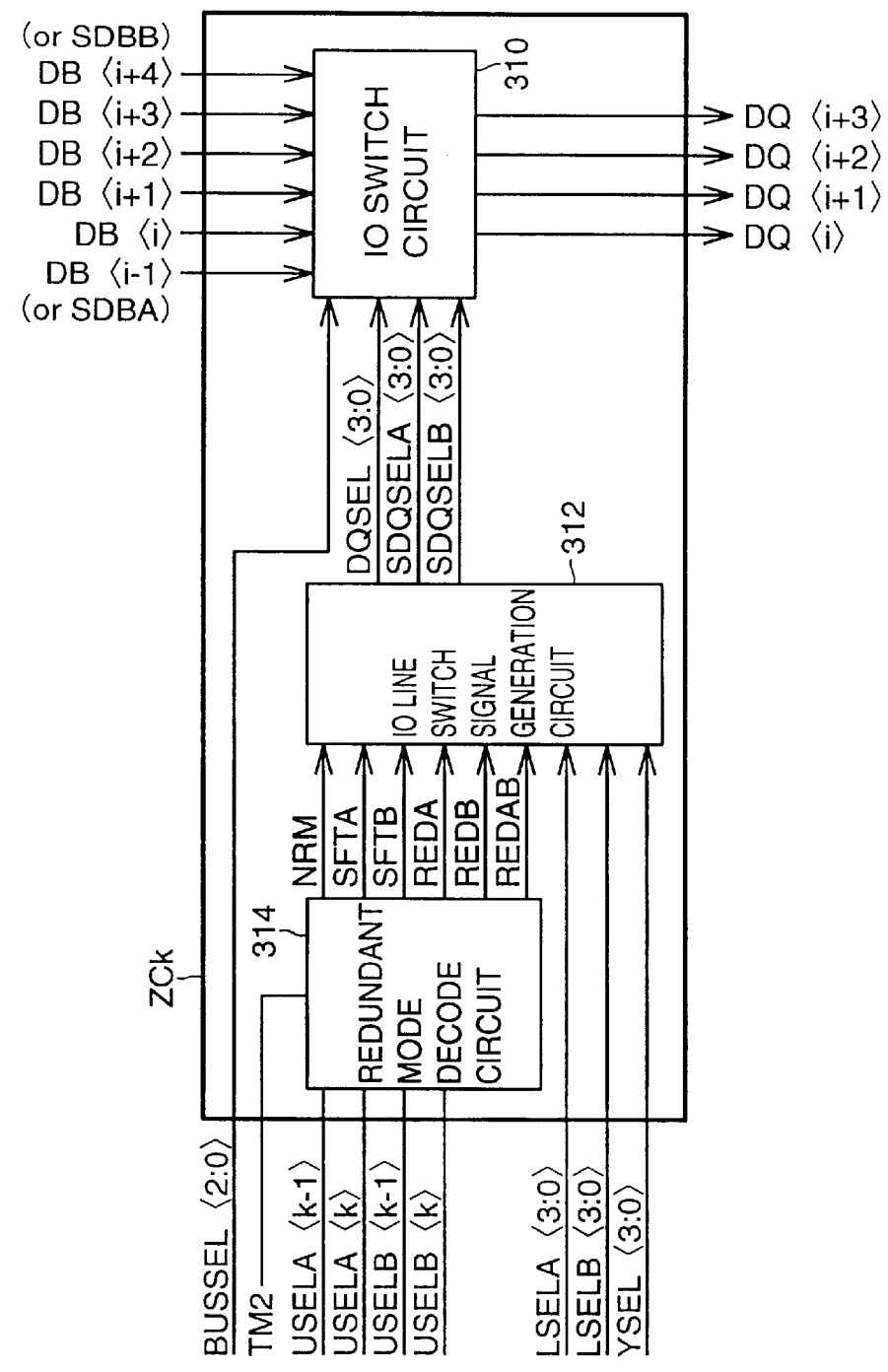
FIG. 44 is a block diagram showing an example of a structure of an IO select circuit ZCk according to a second modification of the fourth embodiment.

An example of a structure of an IO select circuit ZCk (k: 0–7) according to the second modification of the fourth embodiment will be described with reference to FIG. 44.

IO select circuit ZCk differs from IO select circuit ZAk of the fourth embodiment in that a redundancy mode decode circuit 314 is included instead of redundancy mode decode circuit 311. The structure of the remaining components other than IO select circuit ZCk is similar to that of IO select circuit ZAk. Therefore, detailed description will not be repeated.

Redundancy mode decode circuit 314 differs from redundancy mode decode circuit 311 in that a test mode signal TM2 is further received.

When test mode signal TM2 is set to "L", redundancy mode decode circuit 313 generates status signals (NRM, SFTA, SFTB, REDA, REDB, REDAB) of the corresponding block, similar to redundancy mode decode circuit 311.

Referring to FIG. 45, when test mode signal TM2 is set to "H" to execute an operation test in a test mode, LSELA(0)=LSELB(0)="1" and LSELA(L)–LSELA(3)=LSELB(1)–LSELB(3)="O" are set simultaneously.

Referring to FIG. 46, when test mode signal TM2 is set to "H", redundancy mode decode circuit 314 has status signal REDA set to "1" in block 0, and status signal REDB set to "1" in block 7. In the remaining blocks 1–6, status signal NRM is set to "1".

As a result, internal data line DB(0) in block 0 corresponding to redundant internal data line SDBA is replaced with redundant internal data line SDBA. Therefore, external data line DQ(0) is connected to redundant internal data line SDBA. Similarly, in block 7 corresponding to redundant internal data line SDBB, internal data line DB(28) is replaced with redundant internal data line SDBB. Therefore, external data line DQ(28) is connected to redundant internal data line SDBB.

By entering column address CAD<1:0> ="00", both redundant internal data lines SDBA and SDBB can be accessed.

The structure and operation of all components but the IO select circuit are similar to those of the fourth embodiment. Therefore, detailed description will not be repeated.

Redundancy mode decode circuit 314 can be configured in a hardware manner or in a software manner using a combination of logical operations so as to obtain a decode result shown in FIGS. 34, 35 and 46.

According to the structure of the second modification of the fourth embodiment, a test mode of confirming whether there is no defect corresponding to two redundant internal data lines SDBA and SDBB can be set.

[Modification 3 of Fourth Embodiment]

In order to replace a defective data line with a redundant internal data line in an IO select unit in the fourth embodiment, the connection between the internal data line and external data line is sequentially switched according to the position information, programmed in a nonvolatile manner by a fuse or the like, bus width setting and column address related to the defective data line. It is therefore extremely difficult to analyze a defect in an internal data line based on data output onto the external data line when programming related to the defective data line has been effected. The third modification of the fourth embodiment is directed to a test mode establishing connection according to a predetermined relationship between internal data lines DB0–DB31 corresponding to a normal data line pair and external data lines DQ0–DQ31 in response to an instruction.

In the third modification of the fourth embodiment, the structure of each IO select circuit in IO select unit 304 of FIG. 29 differs from that of the fourth embodiment.

Figure 47:
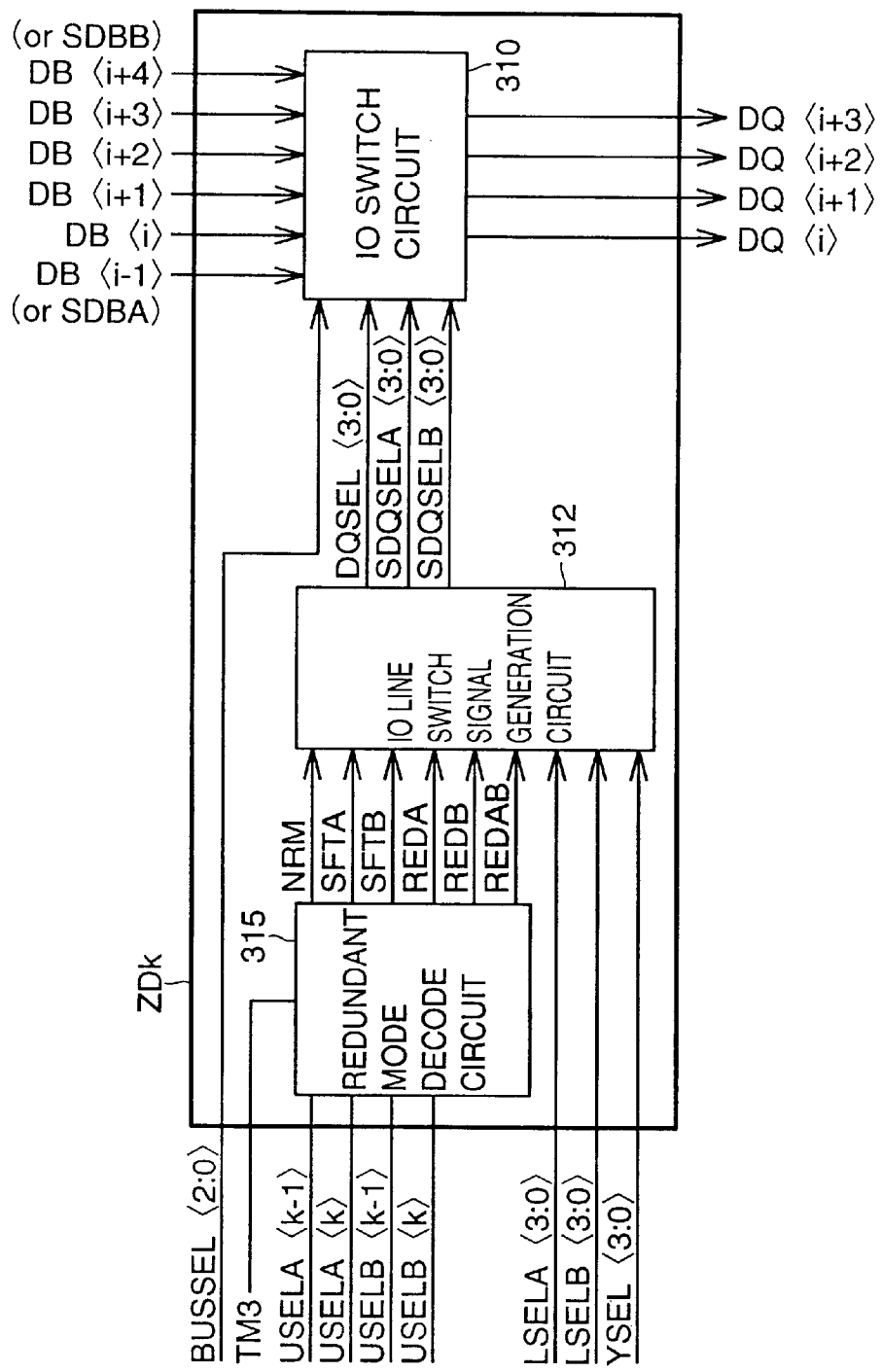
FIG. 47 is a block diagram showing an example of a structure of an IO select circuit ZDk according to a third modification of the fourth embodiment.

An example of the structure of an IO select circuit ZDk (k: 0–7) according to the third modification of the fourth embodiment will be described with reference to FIG. 47.

IO select circuit ZDk differs from IO select circuit ZAk of the fourth embodiment in that a redundancy mode decode circuit 315 is included instead of redundancy mode decode circuit 311. The structure of the remaining components other than IO select circuit ZDk is similar to that of IO select circuit ZAk. Therefore, detailed description will not be repeated.

Redundancy mode decode circuit 315 differs from redundancy mode decode circuit 311 in further receiving a test mode signal TM3.

When test mode signal TM3 is set to "L", redundancy mode decode circuit 313 generates status signals (NRM, SFTA, SFTB, REDA, REDB, REDAB) of corresponding blocks, similar to redundancy mode decode circuit 311.

When test mode signal TM3 is set to "H" to execute an operation test in a test mode, each value of LSELA<3:0> and LSELB<3:0> may be any one of "1" and "0" ("Don't care" status).

Referring to FIG. 48, redundancy mode decode circuit 315 has status signal NRM set to "1" in each of blocks 0–7 when test mode signal TM3 is set to "H".

As a result, no shift operation and replacement operation are executed in each of blocks 0–7. The corresponding internal data line is directly connected to an appropriate external data line. More specifically, external data lines DQ0–DQ31 are connected to internal data lines DB0–DB31 corresponding to the normal data line pair.

The structure and operation of all components but the IO select circuit are similar to those of the fourth embodiment. Therefore, description thereof will not be repeated.

Redundancy mode decode circuit 315 can be configured in a hardware manner or a software manner using a combination of logical operations so as to obtain the decode result of FIGS. 34, 35 and 48.

According to the structure of the third modification of the fourth embodiment, a test mode can be set for an internal data line corresponding to a normal data line pair, accessible from a predetermined external data line. As a result, defect analysis can be executed efficiently even after information related to defective data line is programmed.

Fifth Embodiment

A semiconductor memory device according to a fifth embodiment will be described. The number of redundant data line pairs is set to 2 (SLIOA, /SLIOA and SLIOB, /SLIOB) in the fifth embodiment. Two defective data lines can be replaced at the same time. Similar to the fourth embodiment, the number of normal data line pairs corresponds to 32 (LIO(i), /LIO(i); i=0–31). The data line structure is switchable to ×32, ×16, ×8. In the ×16, ×8 structure, a data line is selected using the column address.

Figure 49:
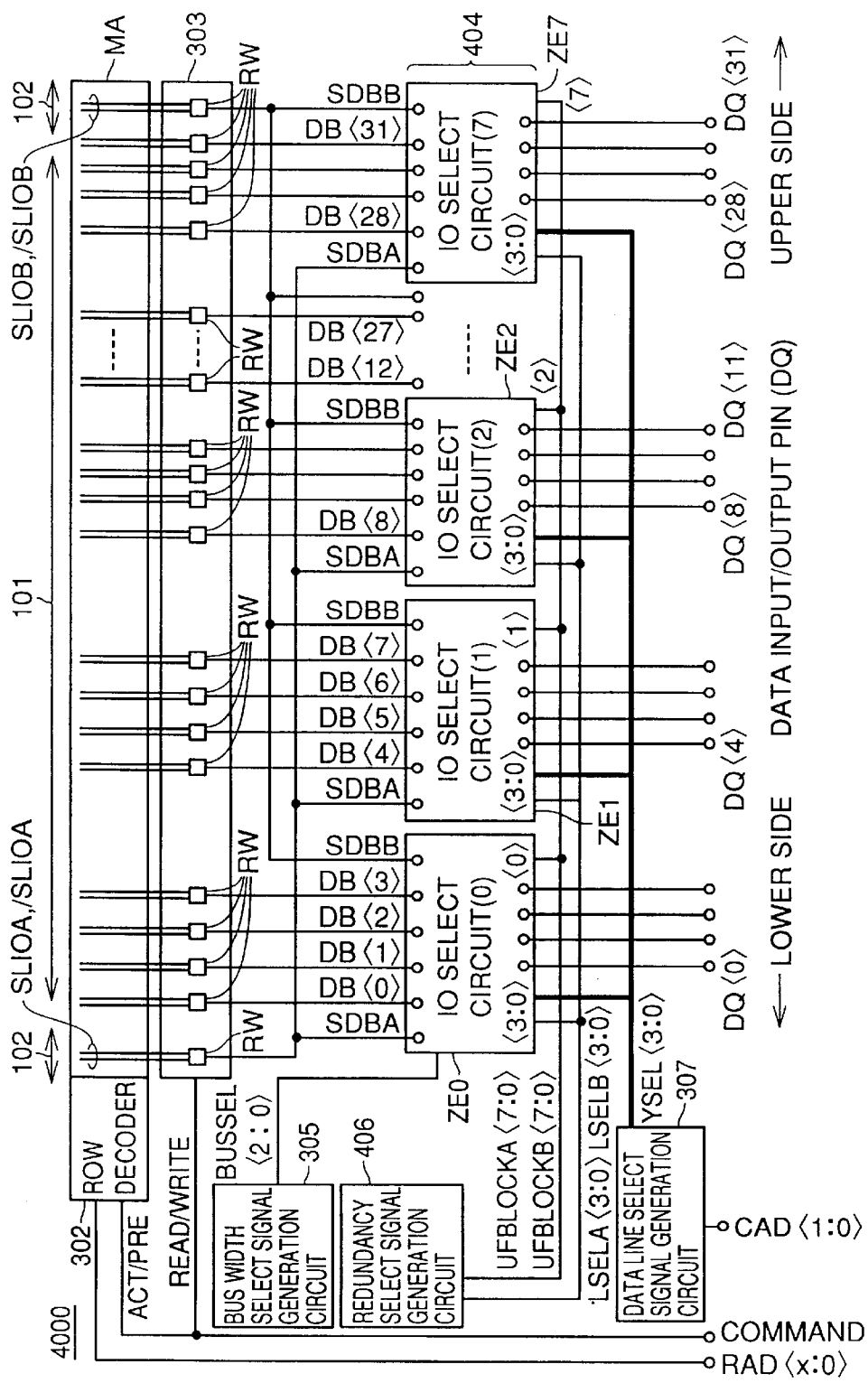
FIG. 49 is a block diagram schematically showing a structure of a semiconductor memory device 4000 according to a fifth embodiment.

A semiconductor memory device 4000 according to the fifth embodiment shown in FIG. 49 differs from semiconductor memory device 3000 of the fourth embodiment in that an IO select unit 404 with IO select circuits ZE0–ZE7 and a redundancy select signal generation circuit 406 are provided instead of IO select unit 304 and redundancy select signal generation circuit 306.

IO select unit 404 selects an internal data line to be used according to the bus width (column address) and presence of redundancy usage. Since a defective data line is replaced by a shift operation using redundant internal data lines SDBA and SDBB in each IO select circuit, IO select unit 404 has a structure differing from that of IO select unit 304 of the fourth embodiment.

In the fifth embodiment, internal data lines DB(0)–DB (31) are divided into eight blocks. Also, redundant internal data lines SDBA and SDBB are shared between blocks.

IO select circuit ZE0 electrically couples the external data line to be used from external data lines DQ(0)–DQ(3) to four internal data lines to be used from internal data lines DB(0)–DB(3) and redundant internal data lines SDBA and SDBB. IO select circuit ZAi (block i) electrically couples the external data line to be used from external data lines DQ(4×i)–DQ(4×i+3) to four internal data lines to be used from internal data lines DB(4×i)–DB(4×i+3) and redundant internal data lines SDBA and SDBB (i=1–7).

The relationship among the bus width, bus width select signal BUSSEL<2:0>, the external data line to be used (data input/output pin), the column address, and address decode signal YSEL<3:0> are as described before. Therefore, detailed description will not be repeated.

Redundancy select signal generation circuit 406 stores the position of the normal data line that requires redundancy replacement, and generates a corresponding decode signal. This decode signal is referred to as a replacement data line position signal. The upper order bit signals are represented as UFBLOCKA<7:0> (=UFBLOCKA(0)–UFBLOCKA(7)), UFBLOCKB<7:0> (=UFBLOCKB(0)–UFBLOCKB(7)). Each of signals UFBLOCKA<7:0> and UFBLOCKB<7:0> indicates the presence of a defective data line in the IO select circuit unit (block-by-block basis).

Each of the lower order bit signals of the replacement data line position signals LSELA<3:0> and LSELB<3:0> indicates which of the corresponding four data lines is defective in the IO select circuit unit.

As a result, one defective data line can be indicated by upper order bit signal UFBLOCKA<7:0> and lower order bit signal LSELA<3:0>. The other one defective data line can be indicated by upper order bit signal UFBLOCKB<7:0> and lower order bit signal LSELB<3:0>.

As to the two defective data lines in the fifth embodiment, it is assumed that the one with a smaller index number (i) (that is, the lower side) is represented by UFBLOCKA<7:0> and LSELA<3:0> whereas the other one with a larger index number (i) (that is, the upper side) is represented by signals UFBLOCKB<7:0> and LSELB<3:0>.

Signals UFBLOCKA<7:0> and UFBLOCKB<7:0> are also simply referred to as signals UFBLOCKA and UFBLOCKB when referred generically.

FIGS. 50 and 51 show the setting of the replacement data line position signal corresponding to the position of a defective data line.

Referring to FIG. 50, when a defective data line is present in block k (the defective data line is any one of the four data lines corresponding to IO select circuit ZAk), signal UFBLOCKA(K) or UFBLOCKB(K) becomes "1" and other signals become "0". When there is no defect, all the bits of signals UFBLOCKA<7:0> and UFBLOCKB<7:0> are "0".

Referring to FIG. 51, when internal data line (i+k) is defective out of internal data lines DB(i)–DB(i+3) belonging to one block, signals LSELA(0)–LSELA(k) among signals LSELA(0)–LSELA(3) become "1". The remaining signals become "0". When internal data line (i+k) is defective, signals LSELB(k)–LSELB(3) out of signals LSELB(0)–LSELB(3) become "1". The remaining signals become "0".

Redundancy select signal generation circuit 406 uses a phase to store the position of the data line that requires replacement, similar to redundancy select signal generation circuit 306 of FIG. 29. The position information is stored by blowing out (or not blowing out) a fuse corresponding to the appropriate position. The structure of redundancy select signal generation circuit 406 is not limited to a phase.

The structure of the remaining components of semiconductor memory device 4000 is similar to that of semiconductor memory device 3000 of the third embodiment. Therefore detailed description thereof will not be repeated.

Figure 52:
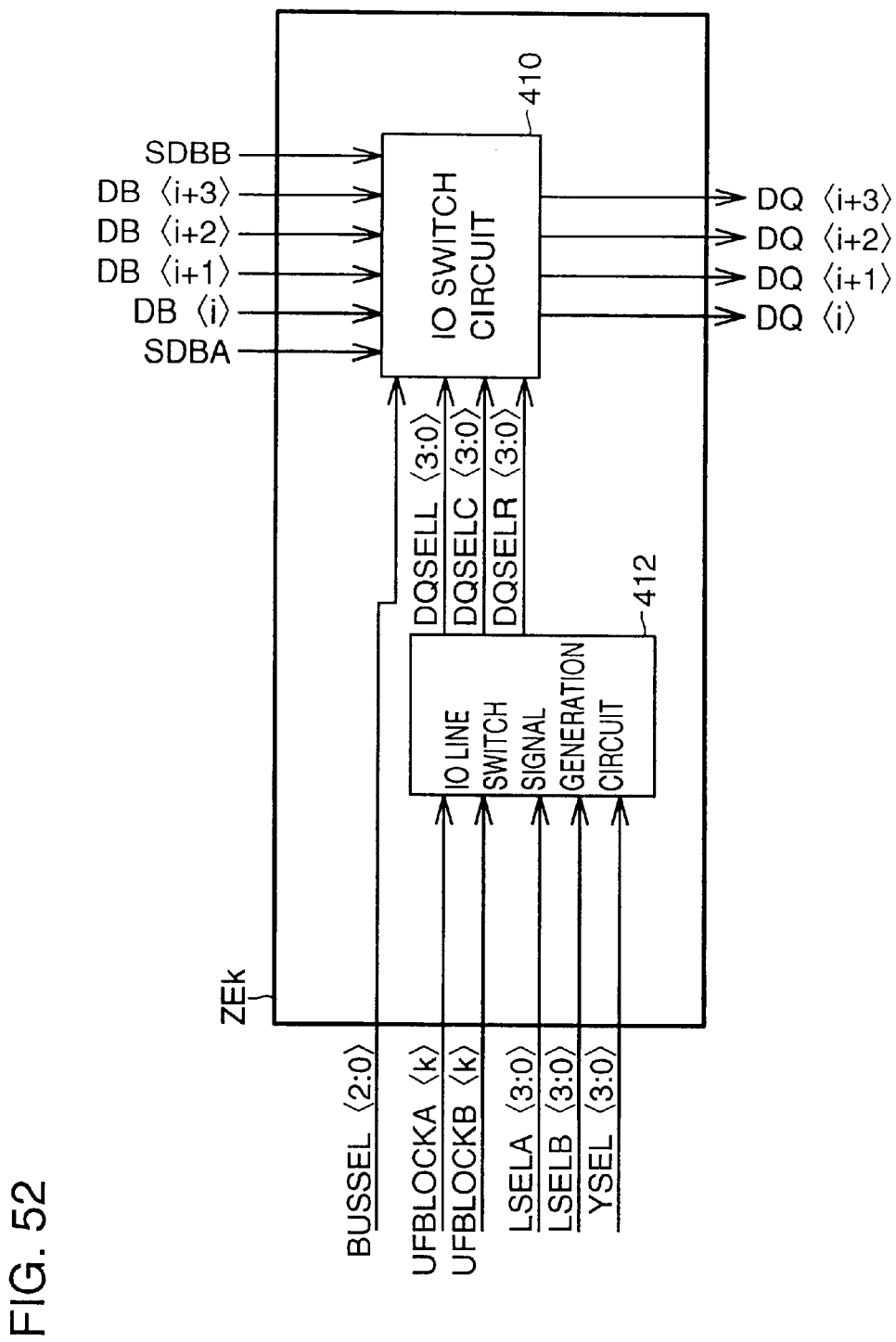
FIG. 52 is a block diagram showing an example of a structure of an IO select circuit ZEk included in an IO select unit 404.

An example of a structure of an IO select circuit ZEk in IO select unit 404 will be described with reference to FIG. 52. IO select circuit ZEk includes an IO switch circuit 410 and an IO line switch signal generation circuit 412.

IO switch circuit 410 switches the connection between internal data lines DB(i)–DB(i+3), SDBA and SDBB and external data lines DQ(i), DQ(i+1), DQ(i+2) and DQ(i+3).

The switching by IO switch circuit 410 is under control of select signals DQSELL<3:0> (=DQSELL(0)–DQSELL(3)), DQSELC<3:0> (=DQSELC(0)–DQSELC(3)) and DQSELR<3:0> (=DQSELR(0)–DQSELR(3)) output from IO line switch signal generation circuit 412.

In the following, select signals DQSELC<3:0>, DQSELL<3:0> and DQSELR<3:0> are also simply called select signals DQSELC, DQSELL and DQSELR when generically referred to.

Figure 53:
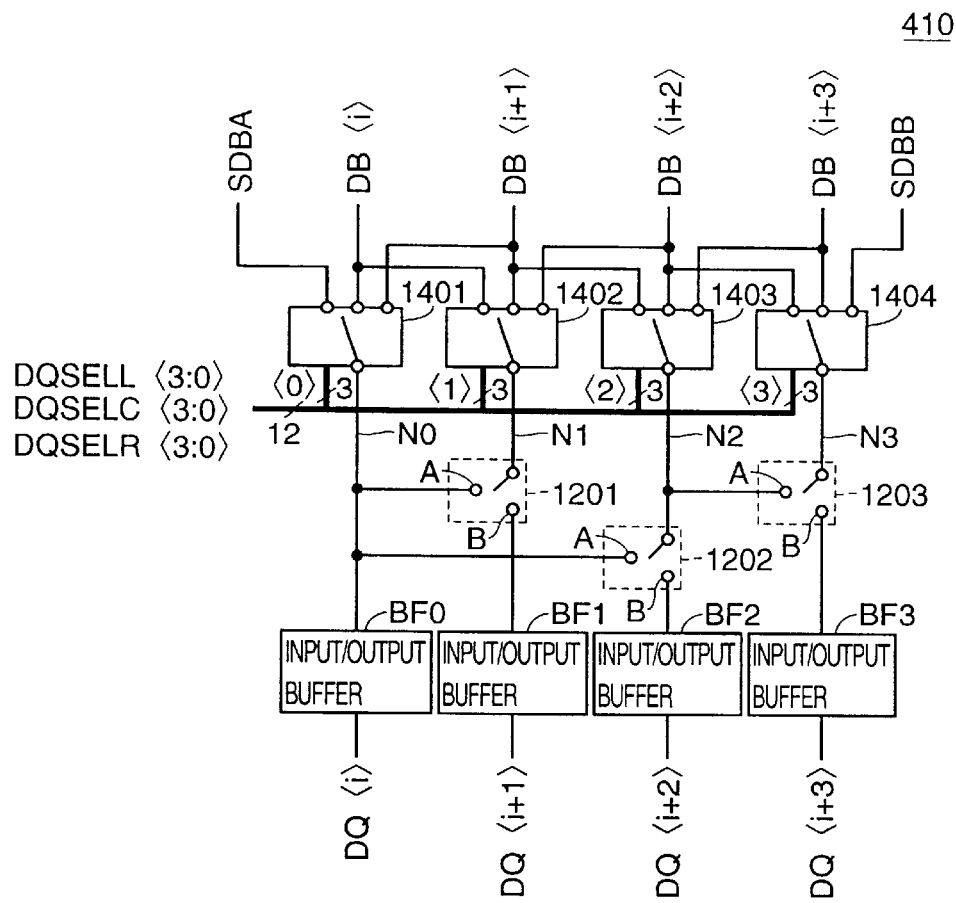
FIG. 53 shows a structure of an example of an IO select circuit 410.

An example of IO switch circuit 410 is shown in FIG. 53. IO switch circuit 410 includes select circuits 1401–1404, switches 1201–1203, and input/output buffers BF0–BF3 arranged corresponding to external data lines DQ(i) to DQ(i+3), respectively.

Select circuits 1401–1404 have the shifting operation of an internal data line to replace a defective data line under control of select signals DQSELC<3:0>, DQSELL<3:0> and DQSELR<3:0>.

Select circuit 1401 operates based on select signals DQSELC(0), DQSELL(0) and DQSELR(0). Select circuit 1402 operates based on select signals DQSELC(1), DQSELL(L) and DQSELR(1). Similarly, select circuit 1403 operates based on DQSELC(2), DQSELL(2) and DQSELR (2). Select circuit 1404 operates based on select signals DQSELC(3), DQSELL(3) and DQSELR(3).

In each select circuit, any one of select signals DQSELC, DQSELL and DQSELR is set to "1" while the remaining two signals are set to "0". Select signal DQSELC set to "1" implies that a corresponding internal data line in the same block is to be used. When redundant internal data line SDBA or SDBB is to be used for the replacement operation, select signal DQSELR or DQSELL is set to "1".

Figure 54:
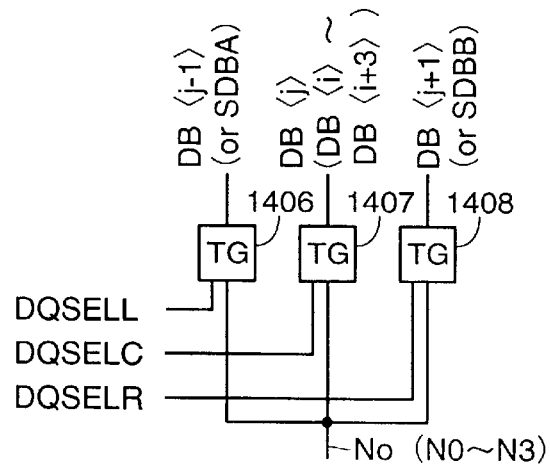
FIG. 54 shows a structure of an example of each of select circuits 1401–1404 in IO switch circuit 410.

Referring to FIG. 54, each of select circuits 1401–1404 includes a transfer gate 1407 connected between an output node No and a corresponding internal data line DB(j) (j=i~i+3) out of internal data lines DB(i)–DB(i+3), a transfer gate 1406 provided between output node No and internal data line DB(j−1) (or redundant internal data line SDBA), and a transfer gate 1408 provided between output node No and internal data line DB(j+1) (or redundant internal data line SDBB). Output node No corresponds to respective nodes N0–N3 in select circuits 1301–1304, respectively.

The structure of transfer gates 1406–1408 is similar to that shown in FIG. 18. Therefore, when corresponding select signal DQSELL is set to an H level ("1"), transfer gate 1406 electrically couples internal data line DB(j−1) (or redundant internal data line SDBA) to output node No. Similarly, when corresponding select signal DQSELC is set to an H level ("1"), transfer gate 1407 electrically couples internal data line DB(j) to output node No. When corresponding select signal DQSELR is set to an H level ("1"), transfer gate 1408 electrically couples internal data line DB(j+1) (or redundant internal data line SDBB) to output node No.

Referring to FIG. 53 again, switches 1201–1203 and input/output buffers BF0–BF3 are similar to those described in the third embodiment. Therefore, detailed description thereof will not be repeated.

Referring to FIG. 52 again, IO line switch signal generation circuit 412 in IO select circuit ZEk decodes 1 bit UFBLOCKA(k), UFBLOCKB(k) corresponding to the relevant block of the upper bits of the replacement data line position signal, lower bits LSELA<3:0>, LSELB<3:0> of the replacement data line position signal and address decode signal YSEL<3:0> to generate select signals DQSELL<3:0>, DQSELC<3:0> and DQSELR<3:0>.

The control state of each block (IO select circuit) indicates the relevance to any of the four states set forth below according to corresponding signals UFBLOCKA and UFBLOCKB.

(1) No defective data line is included (UFBLOCKA= UFBLOCKB="0": control state (A)).

(2) One defective data line is included. A shift operation towards the lower side is executed using redundant internal data line SDBA (UFBLOCKA="1", UFBLOCKB="0": control state (B)).

(3) One defective data line is included. A shift operation towards the upper side is executed using redundant internal data line SDBB (UFBLOCKA="0", UFBLOCKB="1": control state (C)).

(4) Two defective data lines are included. A shift operation is executed using redundant internal data lines SDBA and SDBB. (UFBLOCKA=UFBLOCKB="1": control state (D)).

Figure 55:
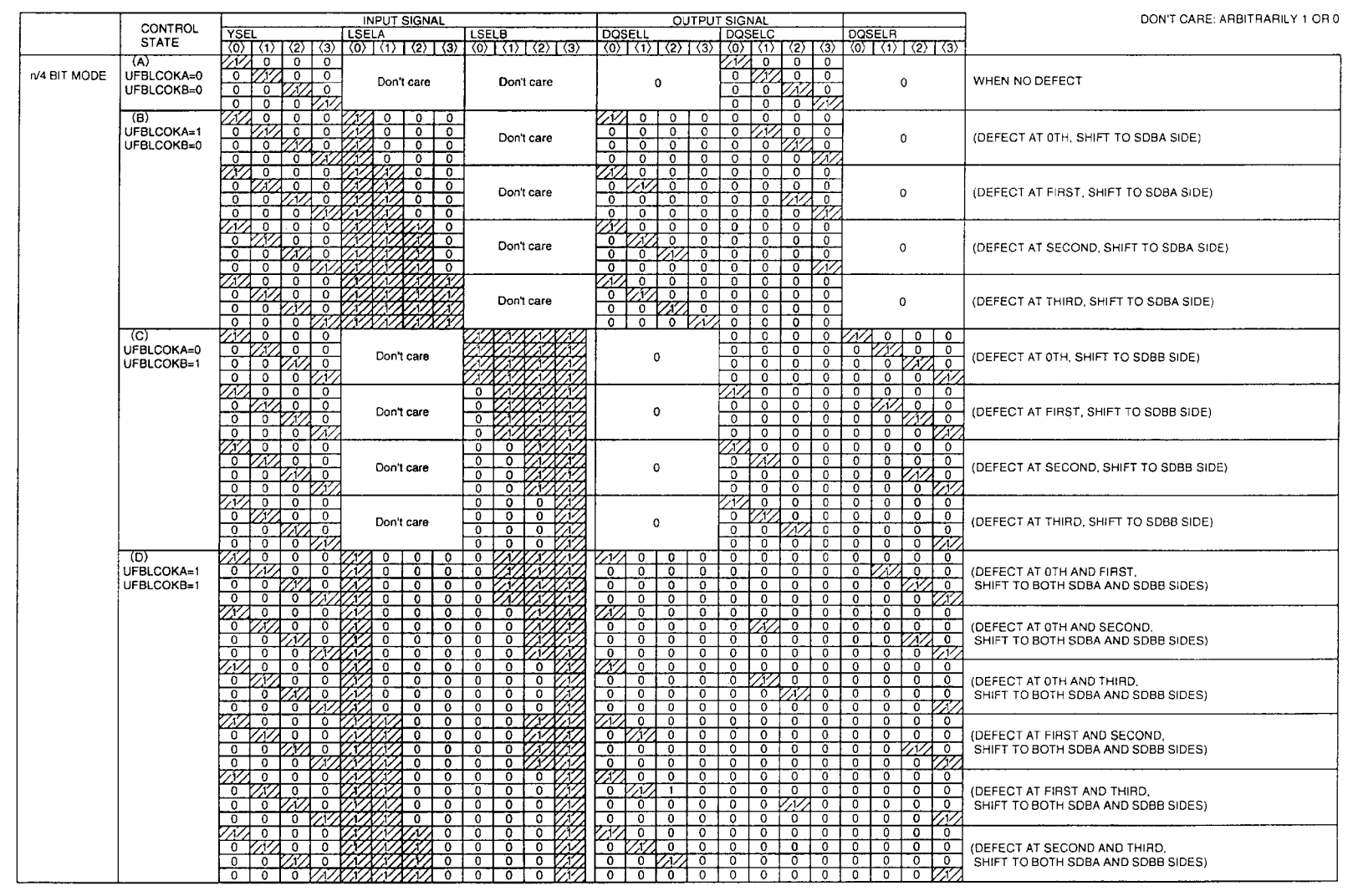
Figure 56:
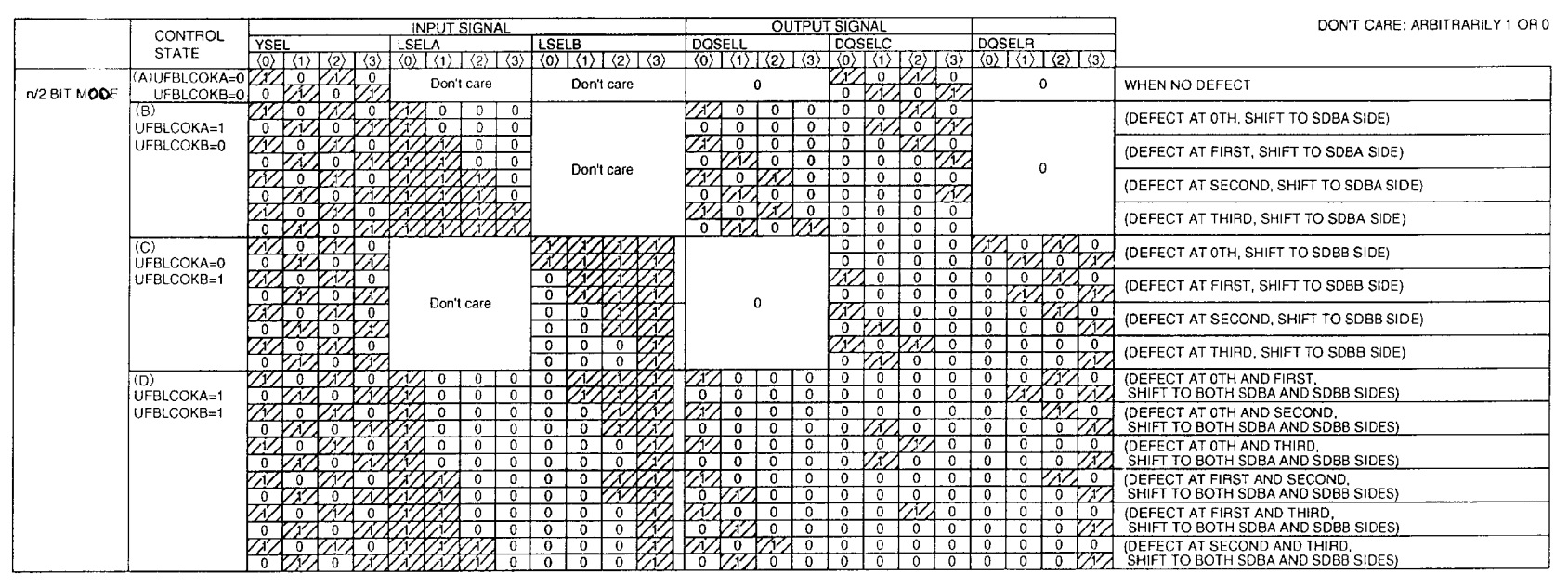
Figure 57:
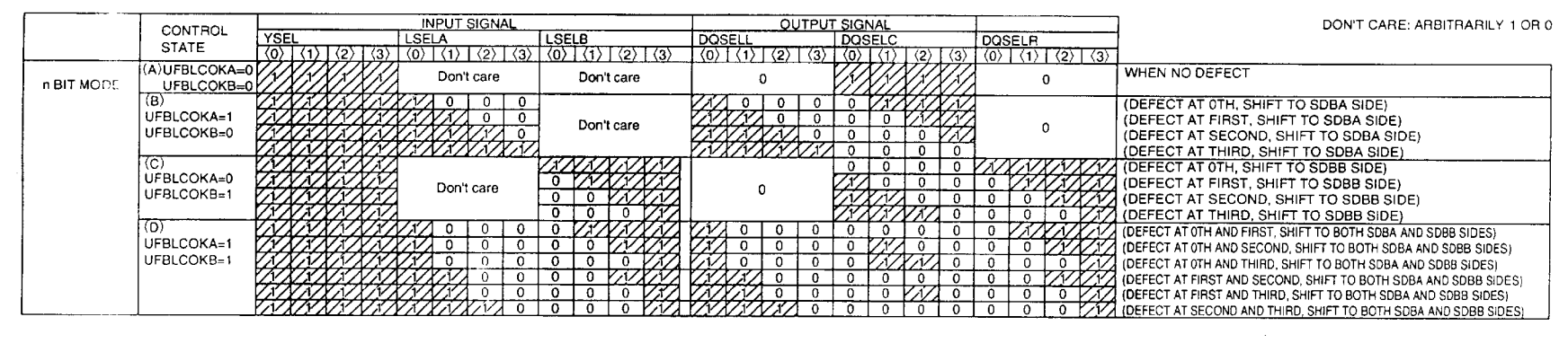

The operation of IO line switch signal generation circuit 412 will be described with reference to FIGS. 55–58. FIGS. 55–57 represent the relationship between the input signal to IO line select signal generation circuit 412 and output signals DQSELC<3:0>, DQSELL<3:0> and DQSELR<3:0>.

FIGS. 55, 56 and 57 correspond to the n/4 bit mode, the n/2 bit mode and the n bit mode, respectively.

Referring to FIGS. 55–57, in control state (A), signals DQSELC(0)–DQSELC(3) take values identical to those of signals YSEL(0)–YSEL(3). Signals DQSELL(0)–DQSELL(3), DQSELR(0)–DQSELR(3)=0 are established.

In control state (B), the data line set by corresponding LSELA(j)=1 (j: 0–3) and the data lines located at the lower side than the relevant data line are respectively connected to internal data lines according to a shift operation towards the lower side (SDBA side). Therefore, when LSELA(j)=−1 corresponding to the data line selected by YSEL(j)=1, the relation of DQSELL(j)=1, DQSELC(j)=0 are set.

The data lines located at the upper side of the relevant data line are connected to an internal data lines without shifting. Therefore, when LSELA(j)=0 corresponding to the data line selected by YSEL(j)=1, DQSELL(j)=0, DQSELC(j)=1 are set. In control state (B), signals DQSELR(0)–DQSELR(3)=0 are fixed.

In control state (C), the data line set to corresponding LSELB(j)=1 (j: 0–3) and the data line located upper to the relevant data line are connected to respective internal data lines according to a shift operation towards the upper side (SDBB side). Therefore, when LSELB(j)=1 corresponding to the data line selected by YSEL(j)=1, DQSELR(j)=1, DQSELC(j)=0 are set.

The data lines located lower than the relevant data are connected to the internal data lines without shifting. Therefore, when LSELBO)=0 corresponding to the data line selected by YSEL(j)=1, DQSELR(j)=0, DQSELC(j)=1 are set. In control state (C), DQSELL(0)–DQSELL(3)=0 are fixed.

In control state (D), the data line set to corresponding LSELAO)=1 (j: 0–3) and the data lines lower than the relevant data line are connected to respective internal data lines according to a shift operation towards the lower side (SDBA side). Therefore, when LSELAO)=1 corresponding to the data line selected by YSELO)=1, DQSELLO)=1, DQSELC(j)=0 and DQSELR(j)=0 are set.

Similarly, the data line set to corresponding LSELBO)=1 (j: 0–3) and the data line upper than the relevant data line are connected to respective internal data lines according to a shift operation towards the upper side (SDBB side). Therefore, when LSELB(j)=1 corresponding to the data line selected by YSEL(j)=1, DQSELR(j)=1, DQSELCO)=0 and DQSELL(j)=0 are set.

When LSELA(j) and LSELBO) corresponding to the data line selected by YSEL(j)=1 are both "0", the data line is connected to an internal data line without shifting. More specifically, DQSELR(j)=0, DQSELC(j)=1 and DQSELL(j)=0 are set.

The remaining bits of select signals DQSELR, DQSELC and DQSELL, i.e. the bits set to address decode signal YSEL<3:0> ="0" in the corresponding bit, are set to "0".

Since signals YLSELA and LSELB are set corresponding to the lower side and the upper side of two defective data lines, the combination of the position of the defective data lines in each block is limited to that shown in FIGS. 55–57.

IO line select signal generation circuit 412 can be configured in a hardware manner or a software manner using a combination of logical operations so as to obtain the decode result of FIGS. 56–58.

An operation of semiconductor memory device 4000 will be described corresponding to the case of "×8" as the data line configuration, i.e., in the n/4 bit mode. It is assumed that memory cells corresponding to normal data lines LIO(9) and LIO(27) have defects, and normal data lines LIO(9) and LIO(27) are subject to replacement.

The status of the control signal in each IO select circuit is shown in FIG. 58. Since the defective data line, i.e., the normal data line that is the subject of replacement, is present in blocks 2 and 6, UFBLOCKA(2)=UFBLOCKB(6)="1" is set, and the remaining UFBLOCKA(1), UFBLOCKA(3)–UFBLOCKA(7), UFBLOCKB(0)–UFBLOCKB(5), UFBLOCK(7)="0" is set.

In blocks 0, 1, 3, 4, 5 and 7 with the upper bits (UFBLOCKA, UFBLOCKB) of the corresponding replacement data line position signal set to "0", i.e. absent of a defective data line, the internal data line does not have to be shifted. Therefore, the number assigned to internal data line DB and external data line DQ is identical. In these blocks, signals SDQSELL and DQSELR are all fixed to "0" regardless of CAD<1:0>. One of signal DQSELC becomes "1" according to CAD<1:0>.

Figure 59B:
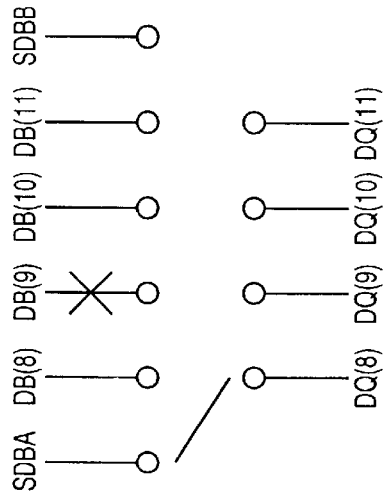
FIGS. 59A–59D show a shift operation in a block with a defective data line.
Figure 59D:
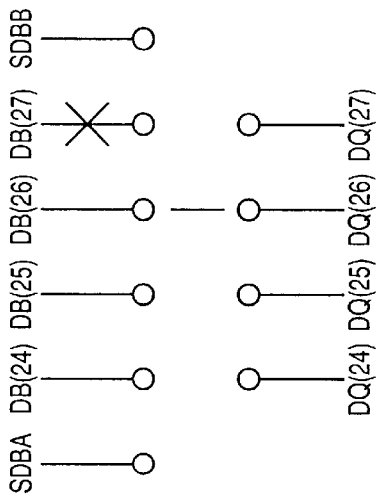
Figure 59A:
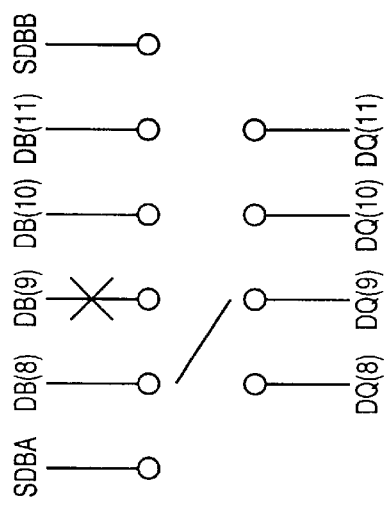

In block 2 corresponding to upper bit UFBLOCKA="1" of the corresponding replacement data line position signal, i.e. having a defective data line at the lower side, selection of external data line DQ(9) corresponding to the defective data line by CA<1:0> causes shifting once towards the lower side, whereby external data line DQ(9) is connected to internal data line DB(8), as shown in FIG. 59A.

As shown in FIG. 59B, a similar shift operation is executed when external data line DQ(8) at the lower side of external data line (DQ9) corresponding to the defective data line. External data line DQ(8) is connected to redundant internal data line SDBA is selected by CA<1:0>. In other words, internal data line DB(9) that is the defective data line is replaced by a shift operation, not directly by a redundant internal data line SDBA.

Thus, when an external data line DQ(9) corresponding to a defective data line or an external data line DQ(8) located at the lower side becomes the subject of access, i.e. when column address CAD<1:0> ="00" or "01", select signal DQSELC(0)–DQSELC(3) are set to 0. Select signal DQSELL(0) or DQSELL(1) is set to "1" to effect a shift operation towards the lower side.

When another external data line DQ(10) or DQ(11) in block 2 is the subject of access, i.e. when column address CAD<1:0> ="10" or "11", select signals DQSELL, DQSELC, and DQSELR are set similar to those of the block absent of a defective data line. Specifically, signals SDQSELL and DQSELR are all set to "0". One of signal DQSELCis set to "1" according to CAD<1:0>.

Figure 59C:
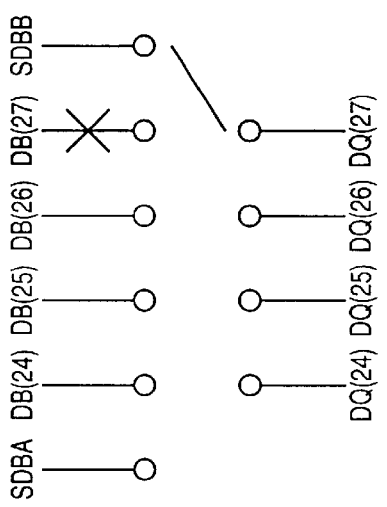

In block 6 where upper bit UFBLOCKB="1" of the corresponding replacement data line position signal, i.e. having a defective data line at the upper side, selection of external data line DQ(27) corresponding to the defective data line by CA<1:0> causes a shift operation once towards the upper side, whereby external data line DQ(27) is connected to redundant internal data line SDBB, as shown in FIG. 59C. When there are other external data lines located upper than the external data line corresponding to defective data line in the same block, a similar shift operation towards the upper side is effected for all these external data lines.

As shown in FIG. 59D, when external data line DQ(26) located at the lower side of external data line (DQ(27)) corresponding to the defective data line is selected by CA<1:0>, no shift operation is executed. External data line DQ26 is connected to internal data line DB(26).

When external data line DQ(27) corresponding to the defective data line becomes the subject of access, i.e. when column address CAD<1:0> ="11", select signals DQSELC (0)–DQSELC(3) are set to 0. Select signal DQSELR(3)is set to "1" for a shift operation towards the lower side. When there is another external data line located upper than the external data line corresponding to the defective line and is subject to access, select signals DQSELL, DQSELC, DQSELR are set similarly.

When other external data lines DQ(24)–DQ(26) in block 6 are subject to access, i.e., when column address CAD<1:0> ="00", "01" or "10", select signals DQSELL, DQSELC and DQSELR are set similar to those of the block absent of a defective data line. Specifically, signals SDQSELL and DQSELR are all fixed to "0", and one of signal DQSELC becomes "1" according to CAD<1:0>.

As a result, internal data line DB(9) that is the defective data line is set unused in block 2 (IO select circuit ZA2). A shift operation using redundant internal data line SDBA is executed. Similarly, internal data line DB(27) that is a defective data line is set unused in block 6 (IO select circuit ZA6). A shift operation using redundant internal data line SDBB is executed. A shift operation is not executed in blocks absent of a defective data line.

The operation of semiconductor memory device 4000 in a read mode and a write mode is similar to that of semiconductor memory device 2000 of the third embodiment except for the connection between internal data lines DB, SDBA and SDBB and external data line DQ in IO select circuits ZE0 ZE7. Therefore, detailed description thereof will not be repeated.

In a semiconductor memory device of a multidata line structure and that can have the bus width switched by combining a shift redundancy scheme on a block-by-block basis, sharing the data line select circuit and redundancy replacement circuit according to the structure of the fifth embodiment, data can be transferred at high speed. Also, the redundancy efficiency can be improved since two defective data lines can be replaced simultaneously. Select signals (DQSELL, DQSELC and DQSELR) of each IO select circuit can be generated more easily than in the third embodiment.

Furthermore, the number of external data lines connected to the redundant internal data line can be suppressed in comparison to the structure of directly replacing each internal data line with a redundant internal data line. As a result, the parasitic capacitance of the redundant internal data line can be reduced to allow high speed data transfer.

[Modification 1 of Fifth Embodiment]

In a first modification of the fifth embodiment, the arrangement of redundant data line pair 102 (SLIOA, /SLIOA and SLIOB, /SLIOB) differs from that of the fourth embodiment.

Figure 60:
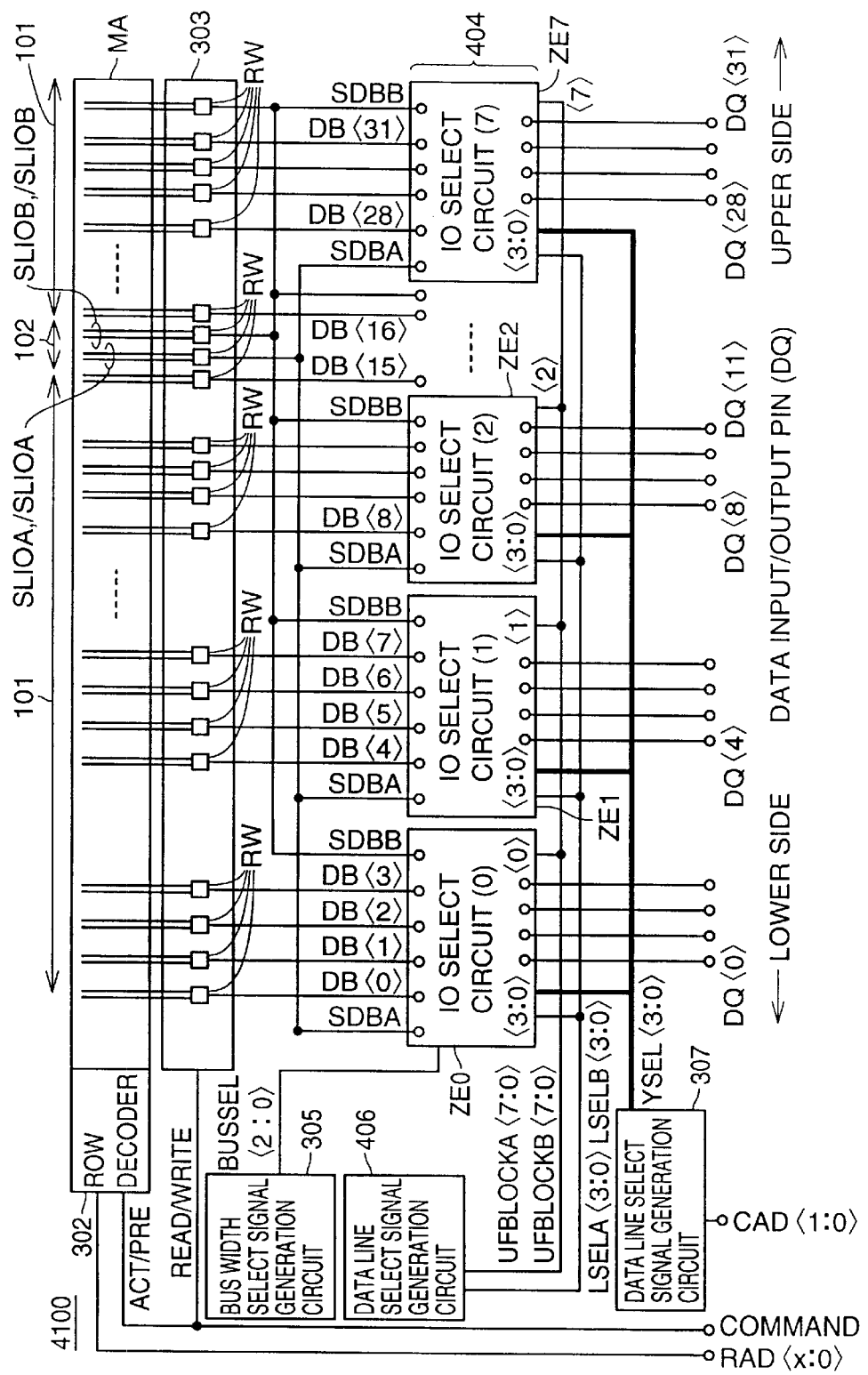
FIG. 60 is a block diagram schematically showing a structure of a semiconductor memory device 4100 according to a first modification of the fifth embodiment.

Referring to FIG. 60, a semiconductor memory device 4100 according to the first modification of the fifth embodiment differs in that redundant data line pair 102 is arranged at the center of memory array MA. In the example of the structure of FIG. 60, two redundant data line pairs SLIOA, /SLIOA and SLIOB, /SLIOB are arranged between normal data line pairs LIO 15, /LIO 15 and LIO 16, /LIO 16.

The structure of the remaining components of semiconductor memory device 4100 is similar to that of IO select circuit ZAk. Therefore, detailed description will not be repeated.

Advantageous effects similar to those of the fifth embodiment can be provided according to the structure of the first modification of the fifth embodiment.

[Modification 2 of the Fifth Embodiment]

The second modification of the fifth embodiment is directed to setting a test mode to perform an operation test for semiconductor memory devices 4000 and 4100 according to the fifth embodiment and the first modification thereof.

In the second modification of the fifth embodiment, the structure of each IO select circuit included in IO select unit 404 shown in FIG. 49 differs from that of the fifth embodiment.

Figure 61:
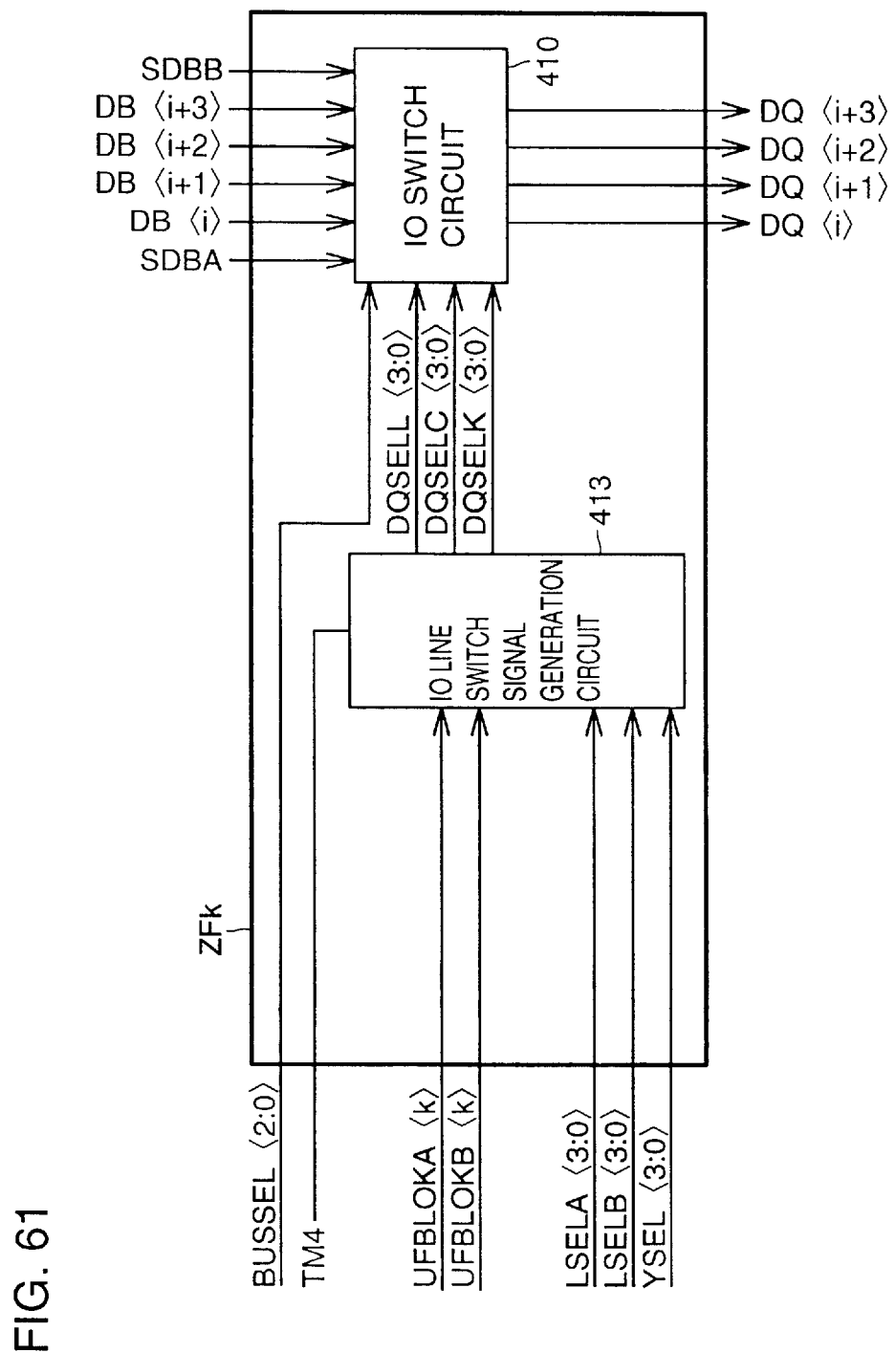
FIG. 61 is a block diagram showing an example of a structure of an IO select circuit ZFk according to a second modification of the fifth embodiment.
Figure 64:
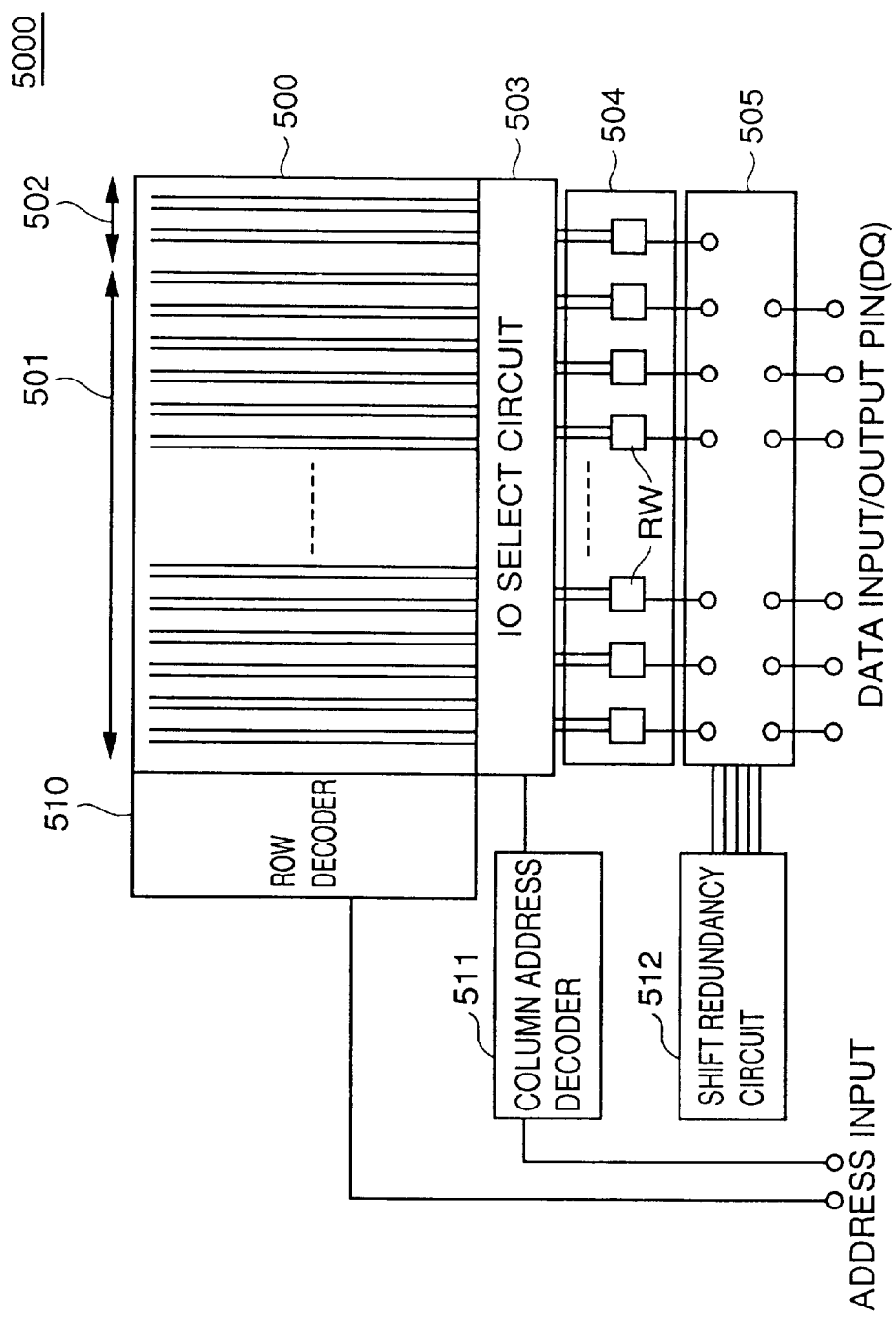
FIG. 64 is a block diagram schematically showing a structure of a conventional semiconductor memory device 5000.
Figure 65:
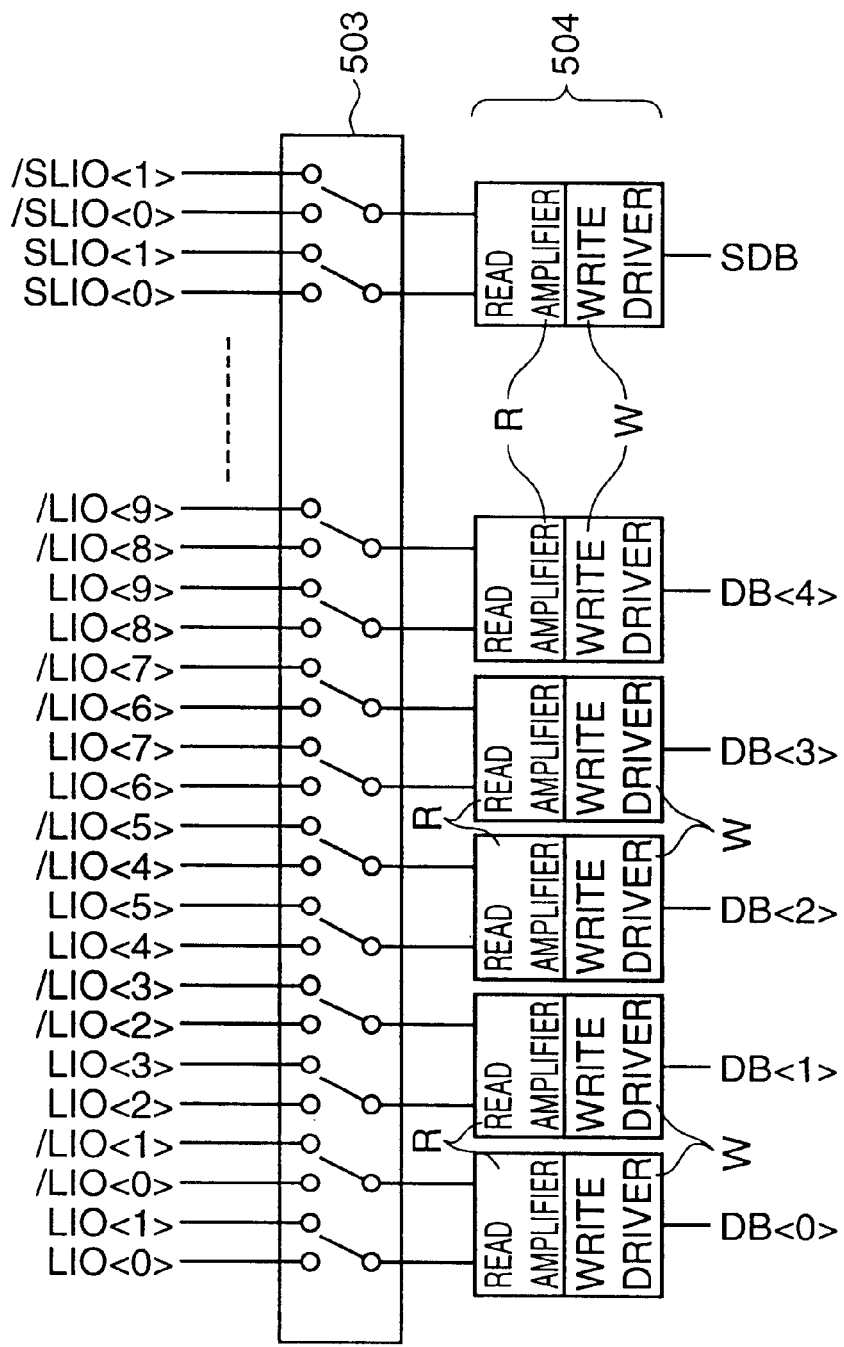
FIG. 65 is a diagram to describe schematically the structure of a conventional IO select circuit 503.
Figure 66:
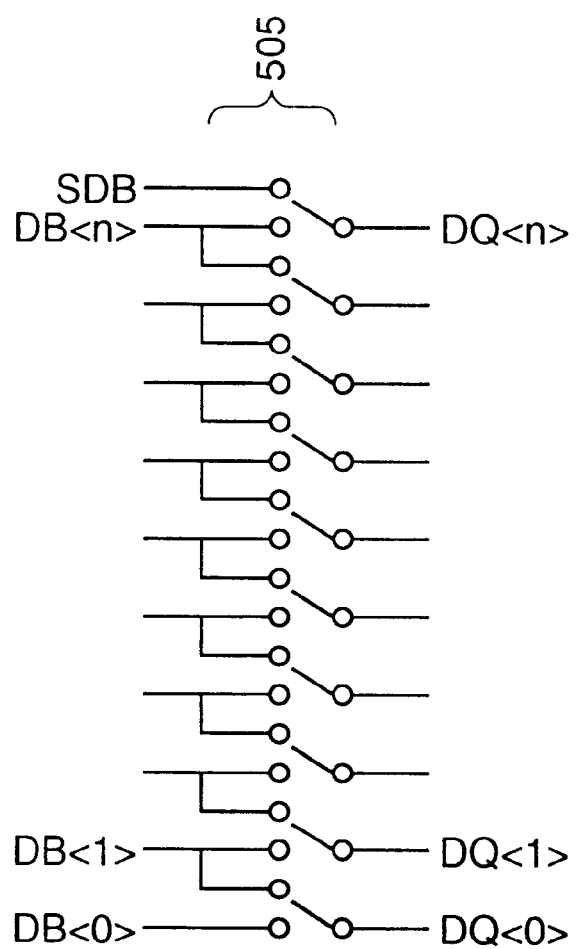
FIG. 66 schematically shows a structure of a conventional IO shift circuit 505.

An example of the structure of an IO select circuit ZFk (k: 0–7) according to the second modification of the fifth embodiment will be described with reference to FIG. 61.

IO select circuit ZFk differs from IO select circuit ZEk of the fifth embodiment in that an IO line switch signal generation circuit 413 is provided instead of IO line switch signal generation circuit 412. The structure of the remaining components of IO select circuit ZFk is similar to that of IO select circuit ZEk. Therefore, detailed description will not be repeated.

IO line switch signal generation circuit 413 differs from IO line select signal generation circuit 412 in that a test mode TM4 is further received.

When test mode signal TM4 is set to "L", IO line switch signal generation circuit 413 generates select signals DQSELL<3:0>, DQSELC<3:0> and DQSELR<3:0> of the corresponding block, similar to IO line switch signal generation circuit 412.

Referring to FIG. 62, when test mode signal TM4 is set to "H" to execute an operation test in a test mode, LSELA(0)=LSELB(0)="1" and LSELA(1)–LSELA(3)=LSELB(1)–LSELB(3)="0" are set at the same time.

Referring to FIG. 63 corresponding to test mode signal TM4 of an H level, IO line switch signal generation circuit 413 has UFBLOCKA(7)=UFBLOCKB(0)="1" set for the upper bits of the replacement data line position signal, and UFBLOCKA(0)–UFBLOCKA(6), UFBLOCKB(1)–UFBLOCKB(7)="0" set for the remaining bits.

As a result, a shift operation is executed in block 0. Internal data line DB(0) is replaced with a redundant internal data line SDBA. Therefore, external data line DQ(0) is connected to redundant internal data line SDBA. Similarly, a shift operation is executed in block 7. Internal data line DB(28) is replaced with redundant internal data line SDBB. Therefore, external data line DQ(28) is connected to redundant internal data line SDBB.

IO line switch signal generation circuit 413 can be configured in a hardware manner or a software manner using a combination of logical operation so as to obtain the decode result shown in FIGS. 56–58 and 63.

By executing a shift operation using a redundant internal data line SDBA and a shift operation using a redundant internal data line SDBB in two of a plurality of blocks, a test mode can be set that allows direct access to redundant internal data lines SDBA and SDBB.

According to the structure of the second modification of the fifth embodiment, a test mode can be set confirming whether there is no defect corresponding to two redundant internal data lines SDBA and SDBB, or whether the data input/output speed is altered by using a redundant internal data line.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device comprising:
   a memory cell array including a plurality of memory cells arranged in a matrix;
   a plurality of data lines including a redundant data line and a normal data line to read out data from said memory cell array or write data into said memory cell array;
   a plurality of external data lines to transfer data with an external source; and
   a data line switch circuit executing simultaneously a select operation of selecting a data line to be coupled with said plurality of external data lines and a shift operation of shifting connection between said plurality of external data lines and said data line to be coupled according to an external address and data line information related to a defective data line in said normal data line.

2. The semiconductor memory device according to claim 1, wherein said plurality of data lines are divided into a plurality of blocks,
   said data line switch circuit including
      a decoder decoding said external address and said data line information, and
      a plurality of select circuits respectively disposed between said plurality of blocks and said plurality of external data lines,
   wherein said plurality of select circuits respectively share some data lines with adjacent select circuits, and carry out simultaneously said select operation and said shift operation according to an output of said decoder.

3. The semiconductor memory device according to claim 2, wherein each of said plurality of select circuits comprises a plurality of transfer gates provided between a corresponding data line and a corresponding external data line, open and closed according to an output of said decoder.

4. A semiconductor memory device comprising:
   a memory cell array including a plurality of memory cells arranged in a matrix;
   a plurality of data lines including a redundant data line and a normal data line to read out data from said memory cell array or write data into said memory cell array;
   a plurality of external data lines to transfer data with an external source; and
   a data line switch circuit executing simultaneously a select operation of selecting a data line to be coupled with said plurality of external data lines according to an external address and a replacement operation of replacing a defective data line in said data line to be coupled with said redundant data line according to data line information related to the defective data line included in said normal data line.

5. The semiconductor memory device according to claim 4, wherein said plurality of normal data lines are divided into a plurality of blocks,
   said data line switch circuit including
      a decoder decoding said external address and said data line information, and
      a plurality of select circuits respectively disposed corresponding to said plurality of blocks,
         wherein said plurality of select circuits respectively carry out simultaneously said select operation and said replacement operation.

6. The semiconductor memory device according to claim 5, wherein each of said plurality of select circuits comprises a plurality of transfer gates provided between said redundant data line and said corresponding normal data line and a corresponding external data line, open and closed according to an output of said decoder.

7. A semiconductor memory device comprising:
   a memory cell array including a plurality of memory cells arranged in a matrix;
   a plurality of data lines including a redundant data line and a normal data line to read out data from said memory cell array or writing data into said memory cell array;
   a plurality of external data lines to transfer data with an external source; and
   a data line switch circuit executing simultaneously a select operation of selecting a data line to be coupled with an external data line to be used according to a bus width and a shift operation of shifting connection between said external data line to be used and said data line to be coupled according to data line information related to a defective data line in said normal data line.

8. The semiconductor memory device according to claim 7, wherein each of said plurality of data lines and said plurality of external data lines is divided into a plurality of blocks,
   said plurality of blocks sharing some data lines with an adjacent block,
   said data line switch circuit including a plurality of switch circuits arranged corresponding to each of said plurality of blocks,
   wherein each of said plurality of switch circuits belong to any status of a first mode switching connection between a corresponding data line and a corresponding external data line according to said bus width, a second mode of replacing said defective data line with said shared data line, and shifting connection between said corresponding external data line and said corresponding data line according to said bus width, and a third mode of shifting connection between a corresponding external data line and a corresponding data line according to said bus width.

9. The semiconductor memory device according to claim 8, wherein each of said plurality of switch circuits comprises m nodes,
   a first gate selectively switching connection between said m nodes and m external data lines according to said bus width,
   a second gate rendering said defective data line and said m nodes nonconnected according to said bus width and said data line information, and
   a third gate selectively connecting said shared data line with one of said m nodes according to said bus width and said data line information.

10. A semiconductor memory device comprising:
    a memory cell array including a plurality of memory cells arranged in a matrix;
    a plurality of data lines including first and second redundant data lines and a plurality of normal data lines to read out data from said memory cell array or write data into said memory cell array;
    a plurality of external data lines to transfer data with an external source, provided corresponding to said plurality of normal data lines, respectively, and
    a data line switch circuit executing simultaneously a select operation of selecting a data line to be coupled with an external data line that is to be used and a shift operation of shifting connection between said external data line to be used and said data line to be coupled according to data line information related to a defective data line in said plurality of data lines.

11. The semiconductor memory device according to claim 10, wherein said first and second redundant data lines are respectively arranged at an outer side of said plurality of normal data lines, said plurality of data lines being arranged in an order of the first redundant data line, the plurality of normal data lines, and the second redundant data line, wherein said plurality of external data lines are divided into a plurality of blocks, each block of n external data lines, wherein said plurality of data lines are divided into every (n+2) lines corresponding to said plurality of blocks, according to said order so that two normal data lines are shared between adjacent blocks, wherein said data line switch circuit comprises a plurality of switch circuits arranged corresponding to said plurality of blocks, respectively, each of said plurality of switch circuits belonging to any one of a first mode without a defective data line in a corresponding block, switching connection between a corresponding normal data line and a corresponding external data line according to said bus width; a second mode without a defective data line in said corresponding block, shifting said connection between a corresponding external data line and a corresponding data line according to the bus width towards said first redundant data line side; a third mode without a defective data line in said corresponding block, shifting said connection between a corresponding external data line and a corresponding data line according to the bus width towards said second redundant data line side; a fourth mode with one defective data line in said corresponding block, replacing said one defective data line using one of said shared data line with an adjacent block at said first redundant data line side and said first redundant data line, out of corresponding (n+2) data lines, and shifting connection between said corresponding external data line and said corresponding data line according to said bus width; a fifth mode with one defective data line in said corresponding block, replacing said one defective data line using one of said shared data line with an adjacent block at said second redundant data line side and said second redundant data line, out of said corresponding (n+2) data lines, and shifting connection between said corresponding external data line and said corresponding data line according to said bus width; and a sixth mode with two defective data lines in said corresponding block, replacing said two defective lines using one of said shared data line with an adjacent block at said first redundant data line side and said first redundant data line and using one of said shared data line with an adjacent block at said second redundant data line side and said second redundant data line, out of said corresponding (n+2) data lines, and shifting connection between a corresponding external data line and a corresponding data line according to said bus width.

12. The semiconductor memory device according to claim 11, wherein each of said plurality of switch circuits comprises n nodes, a switch unit selectively switching connection between said n nodes and n external data lines according to said bus width, and a select unit rendering said defective data line and said n nodes nonconnected and connecting n of said corresponding (n+2) data lines to said n nodes, respectively, based on said bus width, said data line information, and the mode to which said corresponding block belongs.

13. The semiconductor memory device according to claim 11, wherein each of said plurality of switch circuits is forced to a setting of one of said second and third modes, that can be switched by an external source in a test mode.

14. The semiconductor memory device according to claim 11, wherein one of said plurality of switch circuits corresponding to said first redundant data line and one of said plurality of switch circuits corresponding to said second redundant data line are forced to a setting of said fourth mode and said fifth mode, respectively, in a test mode.

15. The semiconductor memory device according to claim 11, wherein each of said plurality of switch circuits is forced to a setting of said first mode in a test mode.

16. The semiconductor memory device according to claim 10, wherein said plurality of external data lines and said plurality of normal data lines are respectively divided into a plurality of blocks, said data line switch circuit including a plurality of switch circuits arranged corresponding to said plurality of blocks, respectively, wherein each of said plurality of switch circuits belongs to any one of a first mode without a defective data line in a corresponding block, switching connection between a corresponding normal data line and a corresponding external data line according to said bus width; a second mode with one defective data line in said corresponding block, replacing said one defective data line by a shift operation using said first redundant data line; a third mode with one defective data line in said corresponding block, replacing said one defective data line by a shift operation using said second redundant data line; and a fourth mode with two defective data lines in said corresponding block, replacing said two defective data lines by a shift operation using said first and second redundant data lines.

17. The semiconductor memory device according to claim 16, wherein each of said plurality of switch circuits comprises n nodes, a switch unit selectively switching connection between said n nodes and n external data lines according to said bus width, and a select unit rendering said defective data line nonconnected with said n nodes, and connecting n data lines out of corresponding n normal data lines and first and second redundant data lines to said n nodes.

18. The semiconductor memory device according to claim 16, wherein two of said plurality of switch circuits are forced to a setting of said second and third modes in a test mode.

* * * * *